United States Patent
Katakura et al.

(10) Patent No.: US 8,852,757 B2
(45) Date of Patent: Oct. 7, 2014

(54) ORGANIC ELECTROLUMINESCENCE ELEMENT, LIGHTING DEVICE AND DISPLAY DEVICE

(75) Inventors: Rie Katakura, Tokyo (JP); Hiroshi Kita, Tokyo (JP); Tatsuo Tanaka, Kanagawa (JP); Hideo Taka, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 601 days.

(21) Appl. No.: 12/439,717

(22) PCT Filed: Aug. 27, 2007

(86) PCT No.: PCT/JP2007/066541
§ 371 (c)(1),
(2), (4) Date: Mar. 3, 2009

(87) PCT Pub. No.: WO2008/029652
PCT Pub. Date: Mar. 13, 2008

(65) Prior Publication Data
US 2010/0045171 A1 Feb. 25, 2010

(30) Foreign Application Priority Data

Sep. 8, 2006 (JP) ................................. 2006-244026
Jan. 30, 2007 (JP) ................................. 2007-019224

(51) Int. Cl.
| | | |
|---|---|---|
| H01L 51/54 | (2006.01) | |
| C09K 11/06 | (2006.01) | |
| H05B 33/14 | (2006.01) | |
| H01L 51/00 | (2006.01) | |
| H01L 51/50 | (2006.01) | |

(52) U.S. Cl.
CPC ........... *C09K 11/06* (2013.01); *C09K 2211/185* (2013.01); *H01L 51/0037* (2013.01); *C09K 2211/14* (2013.01); *H01L 51/0072* (2013.01); *C09K 2211/1092* (2013.01); *H01L 51/0059* (2013.01); *C09K 2211/1088* (2013.01); *H01L 51/5016* (2013.01); *C09K 2211/1059* (2013.01); *C09K 2211/1029* (2013.01); *H05B 33/14* (2013.01); *H01L 51/004* (2013.01); *H01L 51/0081* (2013.01); *H01L 51/5036* (2013.01); *H01L 51/0043* (2013.01); *C09K 2211/1044* (2013.01); *C09K 2211/1466* (2013.01); *C09K 2211/1033* (2013.01); *Y10S 428/917* (2013.01)
USPC ........ 428/690; 428/917; 252/301.16; 257/40; 257/89; 257/102; 257/103; 257/E51.05; 548/440

(58) Field of Classification Search
CPC C07D 209/86; H01L 51/004; H01L 51/0043; H01L 51/5016; H01L 51/5036; H01L 51/0072; H01L 51/0073; C09K 11/06; C09K 2211/145; C09K 2211/1475
See application file for complete search history.

(56) References Cited

U.S. PATENT DOCUMENTS

| | | | |
|---|---|---|---|
| 2002/0045062 A1* | 4/2002 | Senoo et al. ................... | 428/690 |
| 2003/0091862 A1* | 5/2003 | Tokito et al. ................... | 428/690 |
| 2003/0218418 A9* | 11/2003 | Sato et al. ...................... | 313/504 |
| 2005/0118521 A1* | 6/2005 | Suzuki et al. ................... | 430/79 |
| 2006/0051613 A1* | 3/2006 | Tomita et al. .................. | 428/690 |
| 2006/0251923 A1* | 11/2006 | Lin et al. ........................ | 428/690 |
| 2007/0224446 A1* | 9/2007 | Nakano et al. ................. | 428/690 |

FOREIGN PATENT DOCUMENTS

| | | | |
|---|---|---|---|
| JP | 2001297882 | 10/2001 | |
| JP | 2002-302516 | 10/2002 | |
| JP | 2003073666 | 3/2003 | |
| JP | 2003086371 | 3/2003 | |
| JP | 2003-100462 | 4/2003 | |
| JP | 2003100462 | 4/2003 | |
| JP | 2005163036 | 6/2005 | |
| JP | 2005-183344 | 7/2005 | |
| JP | 2005183344 | 7/2005 | |
| JP | 2006-076969 | 3/2006 | |
| WO | WO 2005/021678 A2 * | 3/2005 | ............. C09K 11/06 |

OTHER PUBLICATIONS

English language machine translation of JP 2005/183344 A, 2005.*
Japanese Office Action, Patent Application No. 2008-533102 date of drafting: Jun. 28, 2012.
English translation of Japanese Office Action, Patent Application No. 2008-533102 date of drafting: Jun. 28, 2012.
Japanese Office Action, Patent Application JP 2008-533102, drafting date Apr. 5, 2013.
English language translation of Japanese Office Action, Patent Application JP 2008-533102, drafting date Apr. 5, 2013.

* cited by examiner

*Primary Examiner* — Michael H Wilson
(74) *Attorney, Agent, or Firm* — Lucas & Mercanti, LLP

(57) ABSTRACT

Disclosed is an organic electroluminescent device having high external quantum efficiency and long emission life. Also disclosed are an illuminating device and a display, each comprising such an organic electroluminescent device. The organic electroluminescent device is characterized by comprising at least an anode and a cathode on a supporting substrate, while having at least one light-emitting layer between the anode and the cathode. The organic electroluminescent device is also characterized by containing a polymer which at least partially contains a compound A having a partial structure represented by the general formula (a) below and a reactive group, and is obtained by polymerizing the compound A through the reactive group. (In the formula, Ar1 and Ar2 respectively represent an aromatic ring.)

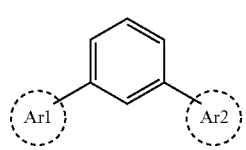

Formula (a)

15 Claims, 2 Drawing Sheets

LIGHT

ORGANIC ELECTROLUMINESCENCE ELEMENT, LIGHTING DEVICE AND DISPLAY DEVICE

This is a U.S. National Phase Application under 35 U.S.C. 371 of International application PCT/JP2007/066541, filed on Aug. 27, 2007, which claims the priority of Japanese application Nos. 2006-244026, filed Sep. 8, 2006 and 2007-019224 filed Jan. 30, 2007, the entire content of all three Applications are hereby incorporated by reference.

TECHNICAL FIELD

The present invention relates to an organic electroluminescent element, a display device and a lighting device.

BACKGROUND ART

Conventionally, an emission type electronic display device includes an electroluminescence display (hereinafter, referred to as an ELD). A constituent element of ELD includes such as an inorganic electroluminescent element and an organic electroluminescent element (hereinafter, referred to as an organic EL element). An inorganic electroluminescent element has been utilized as a flat light source, however, requires a high voltage of alternating current to operate an emission element.

On the other hand, an organic electroluminescent element is an element provided with a constitution comprising an emission layer containing a emitting substance being sandwiched with a cathode and an anode, and an exciton is generated by an electron and a positive hole being injected into the emission layer to be recombined, resulting emission utilizing light release (fluorescence•phosphorescence) at the time of deactivation of said exciton; the emission is possible at a voltage of approximately a few to a few tens volts, and an organic electroluminescent element is attracting attention with respect to such as superior viewing angle and high visual recognition due to a self-emission type as well as space saving and portability due to a completely solid element of a thin layer type.

In an organic electroluminescence in view of the future practical application, desired has been development of an organic EL element which efficiently emits at a high luminance with a low electric consumption. Examples of such technologies are disclosed in JP 309379 in which a slight amount of a fluorescent substance doped in a stilbene derivative, distyrylarylene derivative or a tristyrylarylene derivative, to achieve improved emission luminance and a prolonged lifetime of an element. Further, in JP-A 63-264692, there are disclosed such as an element having an organic emission layer comprising a 8-hydroxyquinoline aluminum complex as a host compound which is doped with a slight amount of a fluorescent substance. In JP-A 3-255190, an element having an organic emission layer comprising a 8-hydroxyquinoline aluminum complex as a host compound which is doped with quinacridone type dye is disclosed.

Regarding to the technologies disclosed in the above-described patent documents, when emission from an excited singlet is utilized, since a generation ratio of a singlet exciton to a triplet exciton is 1:3, that is, a generation probability of an emitting exciton species is 25% and a light taking out efficiency is approximately 20%, the limit of a quantum efficiency (next) of taking out is said to be 5%.

However, since an organic EL element which utilizes phosphorescence from an excited triplet has been reported from researchers of Princeton University (M. A. Baldo et al., Nature, Vol. 395, pages 151-154 (1998)), researches on materials exhibiting phosphorescence at room temperature have come to be active (refer to M. A. Baldo et al., Nature, Vol. 403, No. 17, pages 750-753 (2000) and U.S. Pat. No. 6,097,147).

Further, in the organic EL element utilizing phosphorescent emission which was discovered recently, it is possible to realize a light emission efficiency of about four times larger in principle than an element utilizing conventional fluorescent emission. Therefore, studies and developments of a layer structure and an electrode of a light emission element, as well as developments of materials for the above organic EL element, have been carried out. For example, in a paper of "S. Lamansky et al., J. Am. Chem. Soc., Vol. 123, p. 4304 (2001)", studies on synthesis of many compounds by focusing on heavy metal complexes such as iridium complexes are described.

Since the organic EL element is an all solid state element composed of a film of an organic material exhibiting about 0.1 μm in thickness in between two electrodes, and the light emission can be achieved with a relatively low voltage of 2 to 20 volts, the organic EL element is a promising technology for use as the next-generation flat display or lighting device.

However, since the mechanism of light emission of the organic EL element is based on a light emission utilizing a deactivation from the excited state to the ground state of organic materials, a large band gap is required to emit light in the region of short wavelength such as blue or green. Therefore, a high voltage is required to cause an excitation having the above large band gap.

Further, since the excited state itself exists at a high level, the damage is large when returning to the ground state, and then an emission life tends to be shortened compared to green or red emission, and in particular, the phosphorescent emission utilizing light emission from an excited triplet significantly exhibits the above tendency of the shortened life.

There have been various technologies to dissolve the above-described problems. Examples include a technology where a constituting layer of an organic electroluminescent element is formed, and then the layer is polymerized, and in which technology bifunctional triphenylamine derivatives having two vinyl groups in their molecules are disclosed, and after the film formation of the compound, a three-dimensionally cross-linked polymer is formed (for example, refer to Patent Document 1); a technology where materials having two or more vinyl groups are incorporated into a plurality of layers, where the polymerization reaction is carried out via irradiation of the ultraviolet rays or heat at a step of forming an organic layer before an cathode is laminated (for example, refer to Patent Document 2); a production technology where a polymerization reaction is allowed to proceed during a film formation by adding an AIBN (azoisobutyronitrile), a radical generating agent, into a mixture of a material having vinyl groups at terminals of a phosphorescent light-emitting dopant and a comonomer similarly having vinyl groups (for example, refer to Patent Document 3); and a production technology where a Diels-Alder reaction is allowed to occur between two molecules within the same layer to result in a linkage (for example, refer to Patent Document 4).

As described above, the phosphorescent light-emitting dopant, in particular a phosphorescent light-emitting dopant applicable to blue, exhibits a large band gap. Therefore, materials which may be usable as a host for such dopant, achieve a high light emission efficiency and a long life at the same time, and further may be applicable to a coating method (also referred to as a wet process) have not been known.

Patent Document 1: Unexamined Japanese Patent Application Publication (hereinafter referred to as JP-A) No. 5-271166
Patent Document 2: JP-A No. 2001-297882
Patent Document 3: JP-A No. 2003-73666
Patent Document 4: JP-A No. 2003-86371

DISCLOSURE OF THE INVENTION

Problems to be Solved by the Invention

An object of the present invention is to provide an organic electroluminescent element exhibiting a high quantum efficiency for taking out the light and having a prolonged emission life. Another object is to provide a lighting device and a display device having the aforesaid organic electroluminescent element.

Means to Solve the Problems

The object of the present invention was achieved employing the following embodiments 1 to 21.
1. An organic electroluminescent element comprising a substrate having thereon an anode, a cathode, and at least one emission layer between the anode and the cathode, wherein the organic electroluminescent element comprises a compound A and a polymer prepared by polymerizing the compound A via a reactive group, provided that the compound A contains a partial structure represented by Formula (a) and the reactive group in the molecule.

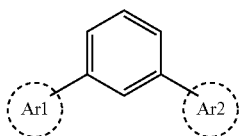

Formula (a)

(In Formula, Ar1 and Ar2 each represent an aromatic ring.)
2. An organic electroluminescent element of the above-described item 1, wherein Ar1 and Ar2 each are a condensed ring having three rings.
3. An organic electroluminescent element of the above-described item 1, wherein Ar1 and Ar2 each represent a carbazole ring, a carboline ring, a dibenzofuran ring or a benzene ring.
4. An organic electroluminescent element of any one of the above-described items 1 to 3, wherein Formula (a) is represented by Formula (b).

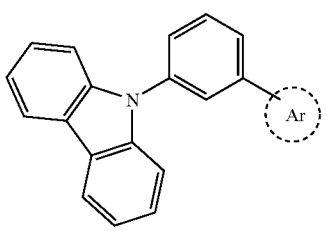

Formula (b)

(In Formula, Ar represents an aromatic ring.)
5. An organic electroluminescent element of any one of the above-described items 1 to 4, wherein Ar represents a carbazole ring, a carboline ring, a dibenzofuran ring or a benzene ring.
6. An organic electroluminescent element of any one of the above-described items 1 to 5, wherein Ar represents a carbazole ring or a benzene ring.
7. An organic electroluminescent element of any one of the above-described items 1 to 6, wherein the reactive group is represented by any one of Formulas (2) to (5).

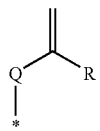

Formula (2)

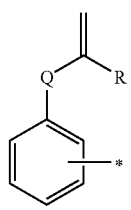

Formula (3)

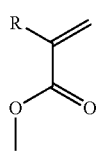

Formula (4)

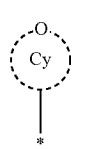

Formula (5)

(In Formulas, R represents a hydrogen atom or a methyl group; and Q represents a divalent linking group represented by any one of Formulas (c), (d), and (e) or any one of the plural combinations of Formulas (c), (d), and (e).)

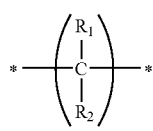

Formula (c)

Formula (d)

Formula (e)

(In Formulas, $R_1$ and $R_2$ each represent a hydrogen atom or a methyl group; and Cy represents a three membered or a four membered cyclic ether group.)
8. An organic electroluminescent element of any one of the above-described items 1 to 7, wherein the compound A or the polymer prepared from the compound A is contained in the emission layer.
9. An organic electroluminescent element of any one of the above-described items 1 to 8, wherein the emission layer contains the aforesaid polymer and a phosphorescence-emitting dopant.
10. An organic electroluminescent element of any one of the above-described items 1 to 9, wherein the aforesaid polymer is a copolymer of the compound A and the phosphorescence-emitting dopant.

11. An organic electroluminescent element of the above-described items 9 or 10, wherein the phosphorescence-emitting dopant is an Ir complex.
12. An organic electroluminescent element of the above-described items 9 or 10, wherein the phosphorescence-emitting dopant exhibits a 0-0 transition band of 485 nm or less in a phosphorescence spectrum.
13. An organic electroluminescent element of the above-described item 12, wherein the phosphorescence-emitting dopant is a metal complex represented by Formula (1):

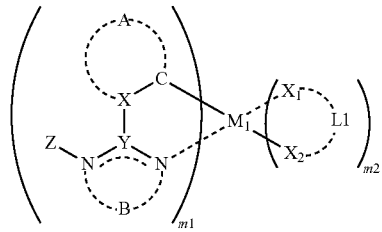

Formula (1)

(In Formula, Z is a hydrocarbon ring or a heterocylic ring provided with a substituent having a steric parameter (Es value) of −0.5 or less at least at one of the third positions from the nitrogen atom to which Z is bonded; A is a group of atoms necessary to form a five or six membered hydrocarbon or heterocyclic ring together with X—C; B is —C($R_{O1}$)=C($R_{O2}$)—, —N=C($R_{O2}$)—, —C($R_{O1}$)=N— or —N=N—, provided that $R_{O1}$ and $R_{O2}$ each are a hydrogen atom or a substituent; $X_1$-L1-$X_2$ is a bidentate ligand, provided that $X_1$ and $X_2$ each are independently a carbon atom, a nitrogen atom or an oxygen atom and L1 is a group of atoms necessary to form the bidentate ligand together with $X_1$ and $X_2$; m1 is an integer of 1, 2 or 3; m2 is an integer of 0, 1 or 2, provided that m1+m2 is 2 or 3; and a central metal M1 is a metal of groups 8 to 10 in the periodic table.)
14. An organic electroluminescent element of any one of the above-described items 1 to 13, wherein the compound A or the polymer prepared from the compound A exhibits a 0-0 transition band of 460 nm or less in a phosphorescence spectrum.
15. An organic electroluminescent element of any one of the above-described items 1 to 14, wherein a layer containing the compound A or the polymer prepared from the compound A is prepared by using a wet coating method
16. An organic electroluminescent element of any one of the above-described items 1 to 15, wherein the compound A is polymerized after being coated.
17. An organic electroluminescent element of any one of the above-described items 1 to 16, wherein a plurality of organic layers is contained as constituting members for the organic electroluminescent element.
18. An organic electroluminescent element of any one of the above-described items 1 to 17, wherein at least one anode buffer layer is provided between the anode and the cathode, or at least one cathode buffer layer is provided between the anode and the cathode, wherein one of the emission layers contains the compound or the polymer of the compound, and the emission layer is prepared by using a wet coating method.
19. An organic electroluminescent element of any one of the above-described items 1 to 18, emitting a white light.
20. A display device comprising an organic electroluminescent element of any one of the above-described items 1 to 19.
21. A lighting device comprising an organic electroluminescent element of any one of the above-described items 1 to 19.

Effects of the Invention

Based on the present invention, there have been provided an organic electroluminescent element exhibiting a high quantum efficiency for taking out the light and having a prolonged emission life as well as a display device and a lighting device provided with the organic electroluminescent element.

Figure 1:
FIG. 1 is a schematic drawing of a full color display device of an organic EL element.
Figure 1:
Figure 1:
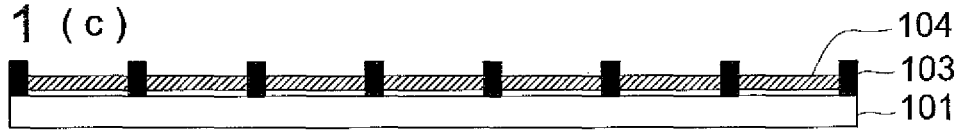
Figure 1:
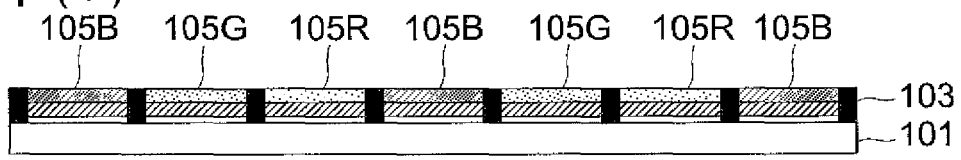
Figure 1:
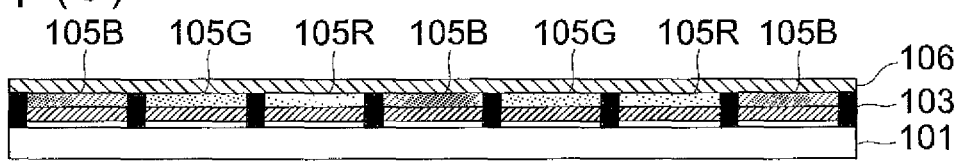

DESCRIPTION OF SYMBOLS 101 glass substrate
102 ITO transparent electrode
103 dividing wall
104 positive hole injection layer
105B, 105G, 105R emission layer
207 glass substrate having a transparent electrode
206 organic EL layer
205 cathode
202 glass cover
208 nitrogen gas
209 desiccant Preferred Embodiments to Carry Out the Invention The organic electroluminescent element (also referred to as an organic EL element) of the present invention could provides an organic electroluminescent element exhibiting a high quantum efficiency of light extraction to the outside, as well as a long emission life according to any one of constitutions described in terms 1 to 19.
At the same time, it was successful in providing a display device and a lighting device exhibiting high brightness, both of which employ the above-described organic EL element.
Details of each constituent of the present invention will be sequentially explained.
<<Compound A and Polymer of the Compound A>>
Compound A of the present invention and a polymer comprising the aforesaid compound A is explained below.
The term "polymer comprising compound A" means that a part of the polymer may incorporate compound A, or compound A may be polymerized through a reactivity group (or a polymerizable group).
Compound A of the present invention or a polymer comprising the aforesaid compound A may be prepared as a solution or a dispersion, and then is sufficiently applicable to an organic electroluminescent element since a film formed by a coating thereof is uniform.
Further, above-described compound A or a polymer comprising the aforesaid compound A exhibits a sufficiently large band gap so that it can be utilized as a host compound for a blue phosphorescent light-emitting dopant, and may provide an organic electroluminescent element exhibiting a high quantum efficiency of light extraction to the outside as well as a long emission life, and furthermore, may provide a lighting device and a display device both of which employ the aforesaid electroluminescent element.

In the organic EL element of the present invention, compound A may be incorporated in the element as a state of compound A, that is, as a state prior to polymerization (also referred to as a monomer), or may be incorporated in a constituting layer of the element as a polymer which was prepared in advance employing the aforesaid compound A.

In particular, in a case where a constituting layer of an element is formed via a wet method such as a coating, for example, when the aforesaid compound A was incorporated as a monomer during formation of a light emitting layer, it is preferable that a layer such as an electron transporting layer is provided on the light emitting layer which was produced by forming a polymer through polymerization steps such as light polymerization via radiation such as an ultraviolet light or heat polymerization via heating.

On the other hand, it is possible to incorporate compound A of the present invention in a monomer form (in a state prior to polymerization) into a constituting layer of the organic EL element of the present invention via a method such as a vapor-deposition technique.

In that case, after the formation of the organic EL element, polymerization of compound A is carried out via a polymerization reaction by active species generated by applying current.

It is also preferred that, after formation of a coated film of compound A and before polymerization thereof, a drying step may be conducted by, for example, heating at a slightly higher temperature than a boiling point of the coating solvent. It is furthermore preferable that, after the polymerization of the coated film, another step is added such that an additional upper layer is laminated by coating after removing insoluble materials by rinsing a polymerized film employing an appropriate solvent (which does not dissolve the polymerized film).

By thus utilizing the element, in a case where a polymerization reaction proceeds, an improved effect of properties of the element, that is, an elongation of emission life, can be obtained.

In compound A having a partial structure represented by the above Formula (a) and a reactivity group, the reactivity groups include examples of substitution groups described below, but are not limited to them. Of these, reactive substituents preferably include substituents containing a carbon-carbon double bond, and more preferably include a vinyl group. Further, compound A preferably contains at least two reactive substituents.

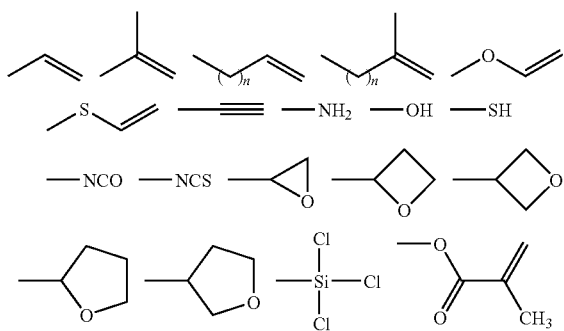

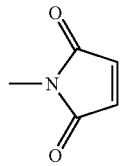

In a case where compound A contains at least two reactive substituents, the reactive substituent may be the same or different.

Compound A contains a partial structure or a reactive group represented by the aforesaid Formula (a). In Formula (a), aromatic rings represented by Ar1 and Ar2 are an aromatic hydrocarbon or an aromatic heterocyclic ring. In Formula (a), examples of an aromatic hydrocarbon ring represented by Ar1 or Ar2 are as follows:

a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring, a anthraanthrene ring. These rings may have further a substituent.

In Formula (a), examples of an aromatic heterocyclic ring represented by Ar1 or Ar2 are as follows:

a furan ring, a dibenzofuran ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzimidazole ring, a benzothiazole ring, a benzooxazole ring, a quinoxaline ring, a quinazoline ring, a cinnoline ring, a quinoline ring, an isoquinoline ring, a phthalazine ring, a naphthylidine ring, a carbazole ring, a carboline ring, a diazacarbazole ring (a diazacarbazole ring indicates a derivative having a ring structure wherein at least one of the carbon atoms of a hydrocarbon ring constituting a carboline ring is substituted with a nitrogen atom). These rings may have further a substituent.

In Formula (a), one of the preferable embodiments for each of Ar1 and Ar2 is a condensed aromatic hydrocarbon ring having at least three rings. Examples of a condensed aromatic hydrocarbon ring having at least three rings are as follows:

a naphthacene ring, an anthracene ring, a tetracene ring, a pentacene ring, a hexacene ring, a phenanthrene ring, a pyrene ring, a benzopyrene ring, a benzoazulene ring, a chrysene ring, a benzochrysene ring, an acenaphthene ring, an acenaphthylene ring, a triphenylene ring, a coronene ring, a benzocoronen ring, a hexabenzocoronen ring, a fluorene ring, a benzofluorene ring, a fluoranthene ring, a perylene ring, a naphthoperylene ring, a pentabenzoperylene ring, a benzoperylene ring, a pentaphene ring, a picene ring, the pyranthren ring, a coronen ring, a naphtocorone ring, a ovalen ring, a anthraanthrene ring.

These rings may have further a substituent.

Examples of a condensed aromatic heterocyclic ring having at least three rings are as follows:

an acridine ring, a benzoquinoline ring, a carbazole ring, the carboline ring, a phenazine ring, a phenanthridine ring, a phenanthroline ring, the carboline ring, a cycladine ring, a quindoline ring, a thebenidine ring, a quinindoline ring, a triphenodithiazine ring, a triphenodioxazine ring, a phenanthrazine ring, an anthrazine ring, a perimizine ring, a diazacarbazole ring, a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, a anthradithiophene ring, a thianthrene ring; a phenoxathiine ring, a thiophanthrene ring (a naphthothiophene ring). These rings may have further a substituent.

Among the above-described rings, preferable aromatic rings for Ar1 and Ar2 in Formula (a) are: a carbazole ring, a carboline ring, a dibenzofuran ring, and a benzene ring. Especially preferable rings are a carbazole ring, a carboline ring, and a benzene ring.

Here, examples of substituents which may be possessed by aromatic rings for Ar1 and Ar2 are as follows:

an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), a cycloalkyl group (for example, a cyclopentyl group and a cyclohexyl group), an alkenyl group (for example, a vinyl group and an allyl group), an alkynyl group (for example, an ethynyl group and a propargyl group), an aromatic hydrocarbon ring group (also called an aromatic carbon ring group or an aryl group such as a phenyl group, a p-chlorophenyl group, a mesityl group, a tolyl group, a xylyl group, a naphthyl group, an anthryl group, an azulenyl group, an acenaphthenyl group, fluorenyl group, a phenanthryl group, an indenyl group, a pyrenyl group, or a biphenyl group), an aromatic heterocyclic group (for example, a pyridyl group, a pyrimidinyl group, a furyl group, a pyrrolyl group, an imidazolyl group, a benzimidazolyl group, a pyrazolyl group, a piradinyl group, a triazolyl group (for example, a 1,2,4-triazole-1-yl group and a 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolynyl group, a diazacarbazoyl group (which shows that one of the carbon atoms which constitute a carboline ring of the above carbolinyl group is replaced with a nitrogen atom), a quinoxythalinyl group, a pyridazinyl group, a triazinyl group, a quinazolinyl group, a phthalazinyl group), a heterocyclic group (for example, a pyrrolidinyl group, an imidazolidyl group, a morpholyl group, and an oxazolidyl group), an alkoxy group (for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group), an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), an ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group), a sulfinyl group (for example, a methylsulfinyl group, an ethylsulfinyl group, a butylsulfinyl group, a cyclohexylsulfinyl group, a 2-ethylhexylsulfinyl group, a docecylsulfinyl group, a phenylsulfinyl group, a naphthylsulfinyl group, and a 2-pyridylsulfinyl group), an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group), an arylsulfonyl group or a heteroarylsulfonyl group (for example, a phenylsulfonyl group, a naphthylsulfonyl group, and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), a halogen atom (for example, a fluorine atom, a chlorine atom, and a bromine atom), a fluorinated hydrocarbon group (for example, a fluoromethyl group, a trifluoromethyl group, a pentafluoroethyl group, and a pentafluorophenyl group), a cyano group, a nitro group, a hydroxyl group, a mercapto group, and a silyl group (for example, a trimethylsilyl group, a triisopropylsilyl group, a triphenylsilyl group, and a phenyldiethylsilyl group) and a phosphono group.

These substituents may have further a substituent as described above. And further, a plurality of these substituents may be joined to form a ring.

A reactive group in Compound A of the present invention is preferably represented by any one of the aforesaid Formulas (2) to (5). Here, the mark (*) indicates a bonding site of the reactive group.

In each of Formulas (2) to (5), Q is a divalent linking group represented by one of the aforesaid Formulas (c), (d) and (e) or a combination of plural such divalent groups; R, $R_1$ and $R_2$ each are a hydrogen atom or a methyl group; and Cy represents a 3 or 4 membered cyclic ether. The 3 or 4 membered cyclic ether may have a substituent described above.

<<Molecular Weight and Molecular Weight Distribution (Mw/Mn) of Polymer of Compound A>>

The molecular weight (a weight-average molecular weight Mw) of compound A of the present invention is preferably 1,000,000 or less, and more preferably in the range of 10,000 to 200,000. Further, a ratio between the weight-average molecular weight (Mw) and the number average molecular weight (Mn) of the present invention (molecular weight distribution) is preferably 3 or less.

Determinations of the weight-average molecular weight (Mw) and the number average molecular weight (Mn) of the polymer of compound A of the present invention can be carried out by employing GPC (Gel Permeation Chromatography) using THF (tetrahydrofuran) as a column solvent.

The molecular weight of the polymer, which is provided in such a manner that compound A is incorporated in a state prior to polymerization into a layer such as an emission layer of the organic EL element and then electric current is applied to the organic EL element whereby polymerization proceeds in the emission layer, can be calculated as follows: films incorporating only compound A are prepared separately in advance, and a plurality of the specimens (for example about 10 samples) which are subjected to ultraviolet rays polymerization with irradiation duration of the ultra violet rays being varied are prepared, and then the molecular weight is calculated from irradiation duration of the ultra violet rays by employing a calibration curve of the ultra violet rays irradiation duration and molecular weights (such as a weight averaged, and a number averaged), which curve is drawn in advance.

The molecular weight of the polymer can be determined by commonly known methods.

The specific method is that 1 ml of THF (having been subjected to degassing treatment) is added to 1 mg of a measuring sample, and then the mixture is stirred employing a magnetic stirrer at room temperature to be fully dissolved. The resulting solution is introduced into GPC (Gel Permeation Chromatography) apparatus after being filtered employing a membrane filter exhibiting a pore size of 0.45 to 0.50 μm.

The GPC measurement conditions may be that the column is stabilized at 40° C., THF (tetrahydrofuran) is poured at a flow rate of 1 ml/minute, and about 100 μl of a sample at a concentration of 1 mg/ml is introduced into the column, and then the determination is carried out.

A combination of commercially available polystyrene gel column is preferably employed. Preferred examples include a combination of Shodex GPC KF-801, 802, 803, 804, 805, 806 and 807 manufactured by Showa Denko Co., Ltd. and a combination of TSK gel G1000H, G2000H, G3000H, G4000H, G5000H, G6000H, G7000H and TSK guard column manufactured by Tosoh Co.

As a detector, a refractive index detector (an RI detector) or a UV detector may be preferably employed.

In the present invention, the determination of the molecular weight was carried out with conditions below.

(Measuring Conditions)

Apparatus: HLC-8220GPC; a high-speed GPC apparatus manufactured by Tosoh Co.

Column: TOSOH TSKGEL SUPER HM-M

Detector: RI detector and/or UV detector

Flow rate of effluent: 0.6 ml/min.

Sample concentration: 0.1% by mass

Sample quantity: 100 μl

Calibration curve: The calibration curve was made employing standard polystyrene: Standard Polystyrene STK standard polystyrene (Produced by Tosoh Co.): The calibration curve was made employing 13 samples of Mw=1,000, 000–500, which was used for calculation of the molecular weight. These 13 samples are preferably made at an almost equally spaced interval of molecular weight.

<<0-0 Transition Band of Compound A or Polymer of the Compound A>>

Compound A of the present invention or a polymer comprising the aforesaid compound A is usable in any constituting layers of the organic EL element of the present invention, which will be explained later, but is preferably incorporated in a light emitting layer from a view point of effects described in the present invention (improvement of a quantum efficiency of light extraction to the outside and an elongation of emission life).

Further, preferred compounds include compounds whose phosphorescence 0-0 transition band of compound A of the present invention or a polymer of the aforesaid compound A is 460 nm or less.

The determination method of the 0-0 transition band will be detailed at the description on a light-emitting dopant.

As the light-emitting dopant described above, metal complexes represented by the above Formula (1) may be preferably used. The above metal complexes will also be described.

Examples of Compound A according to the present invention are shown below. However, the present invention is not limited by them.

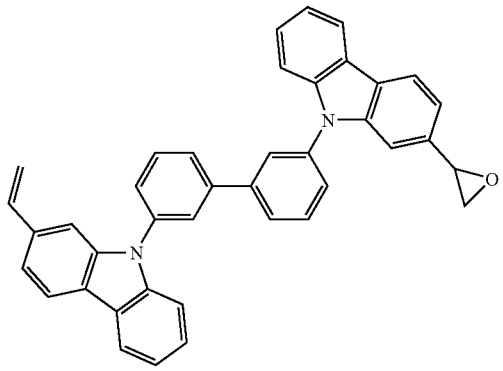

1-1

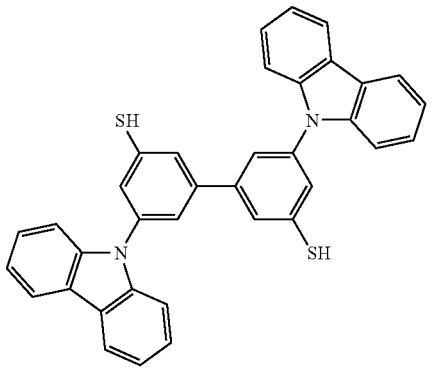

1-2

-continued
1-3
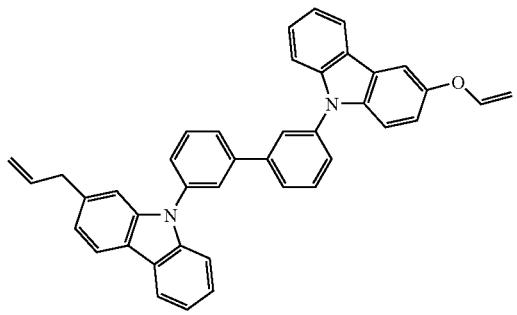
1-4
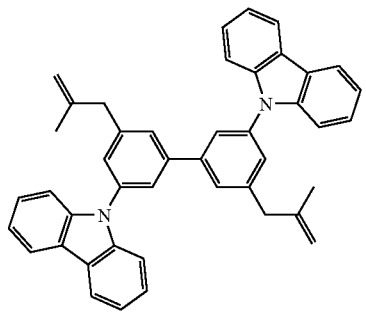
1-5
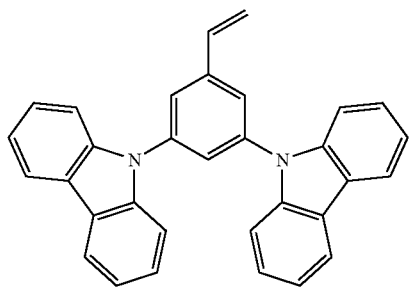
1-6
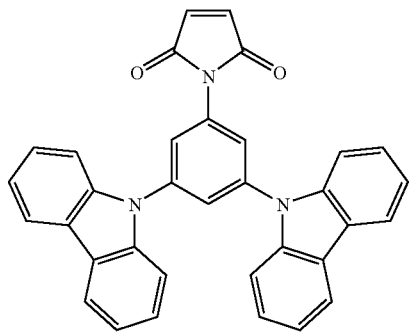
1-7
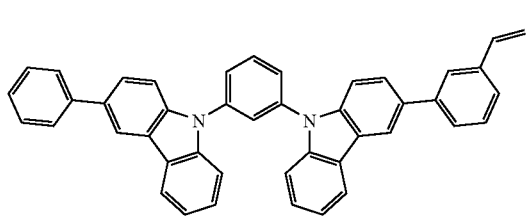
1-8
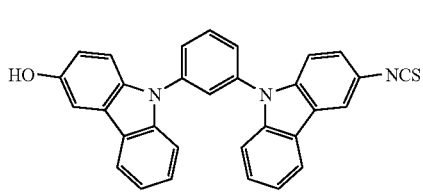
1-9
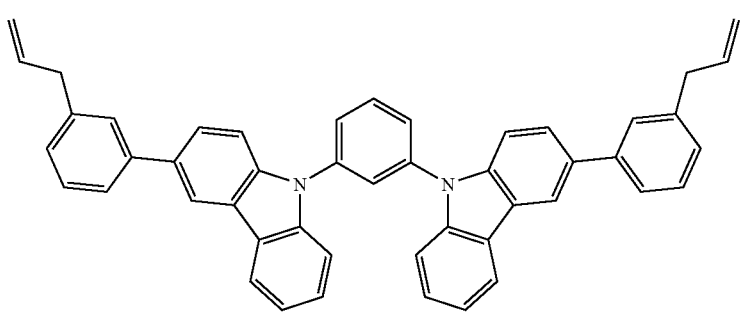
1-10
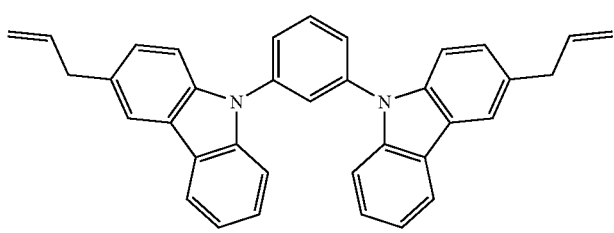

1-11
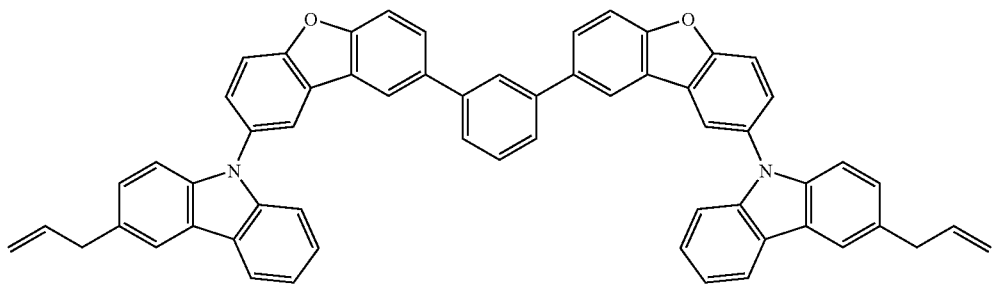
1-12
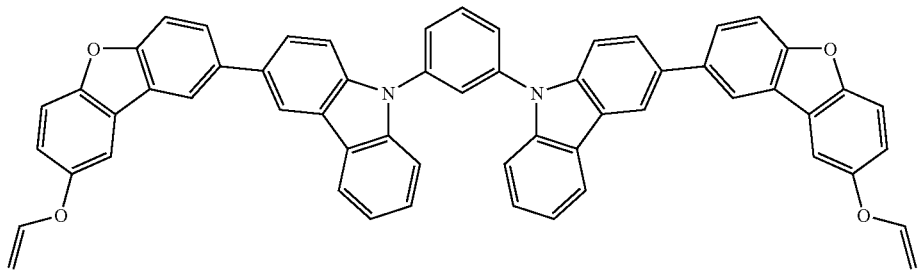
1-13
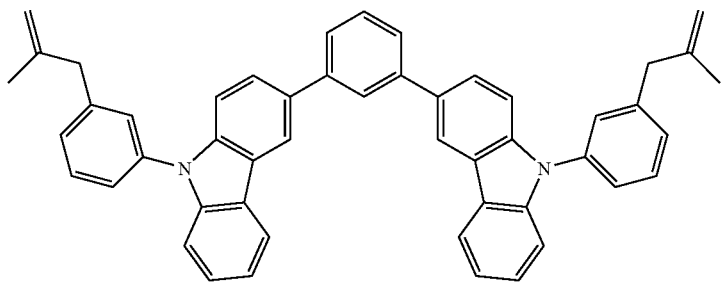
1-14
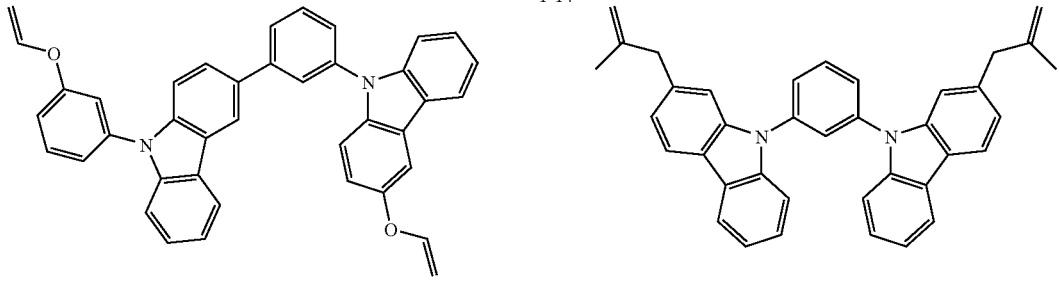
1-15
1-16
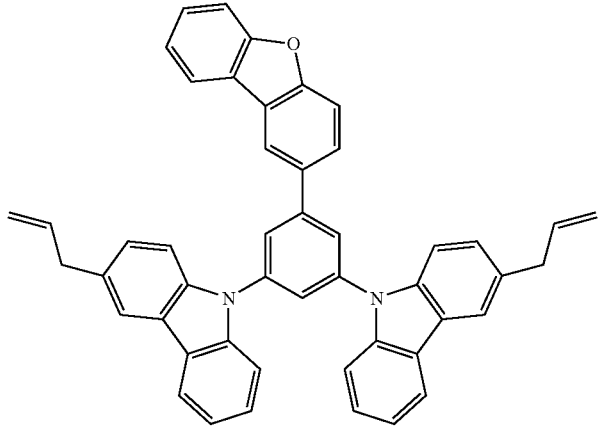

1-17
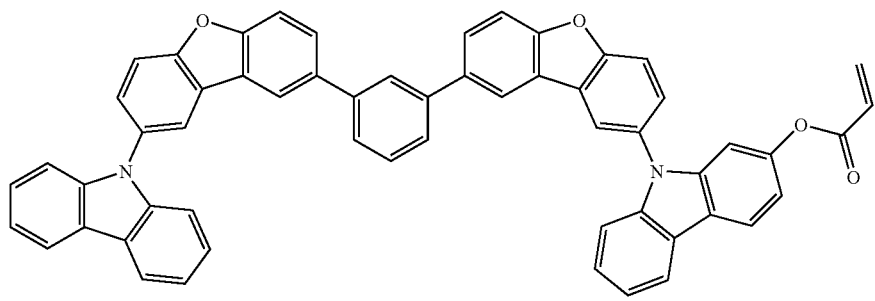
1-18
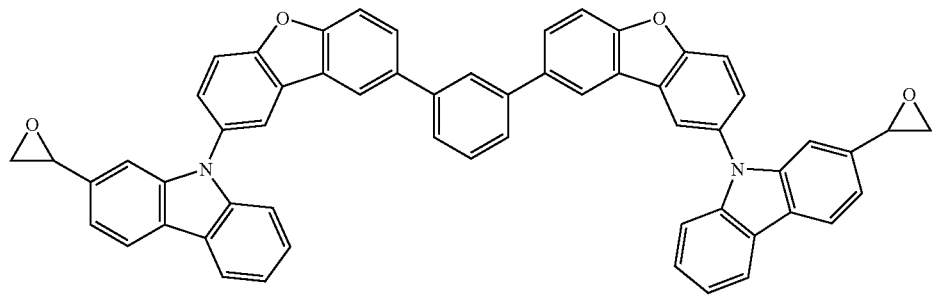
1-19
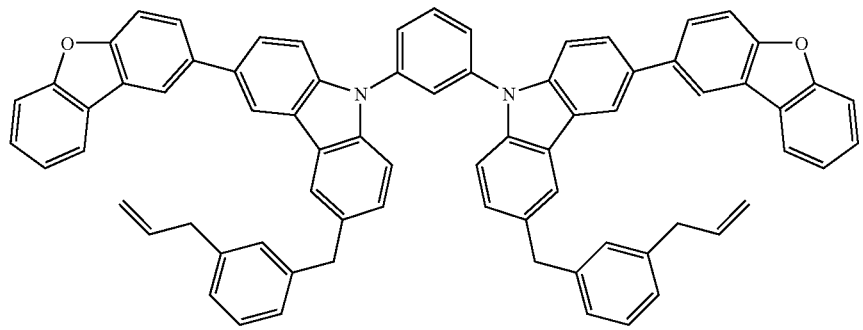
1-20
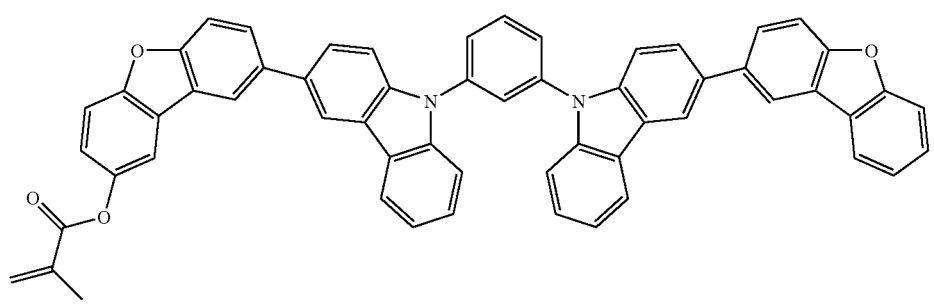
1-21
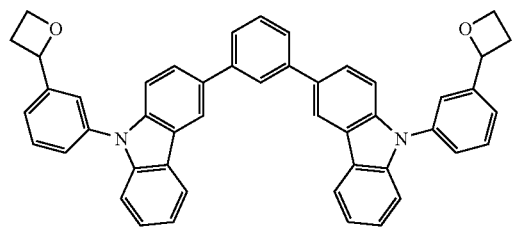
1-22
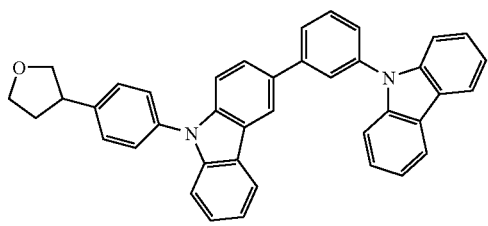

-continued
1-23
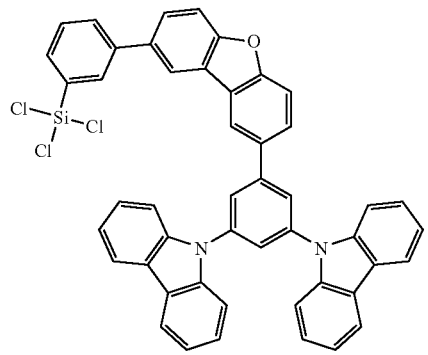
1-24
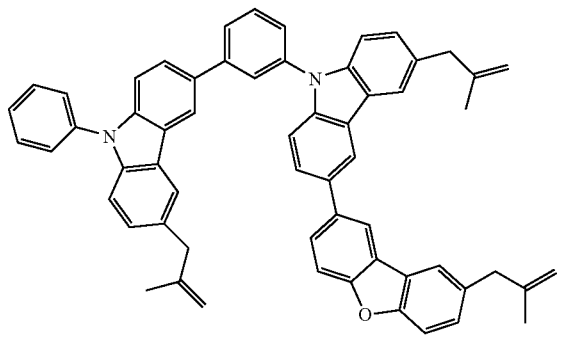
1-25
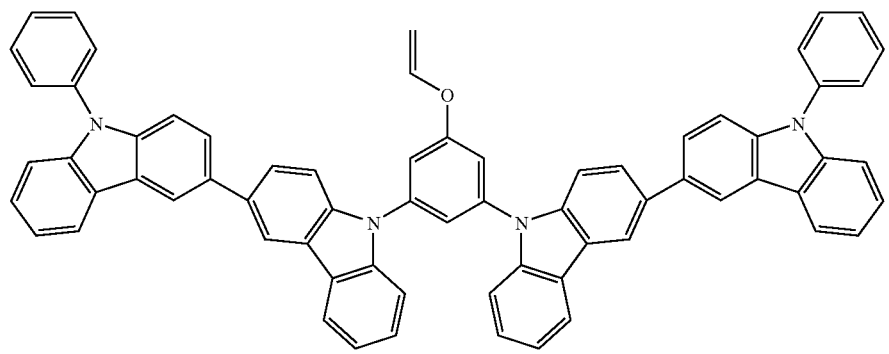
1-26
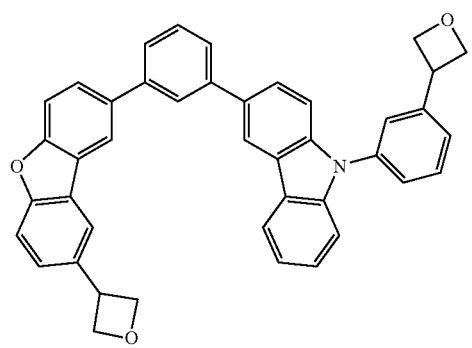
1-27
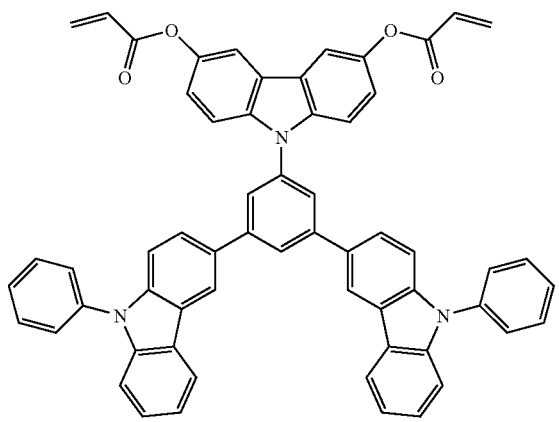
1-28
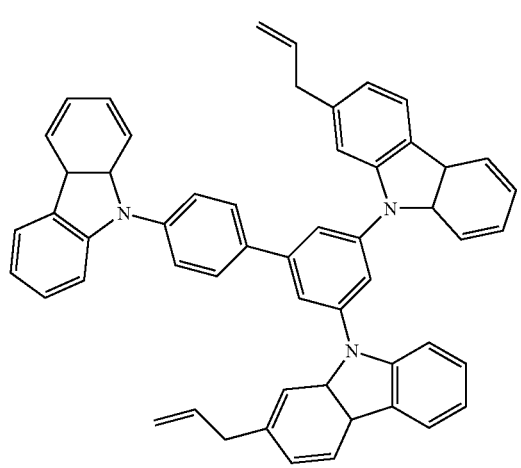
1-29
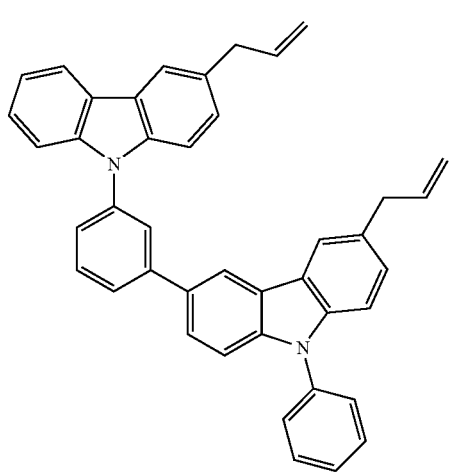

-continued
1-30
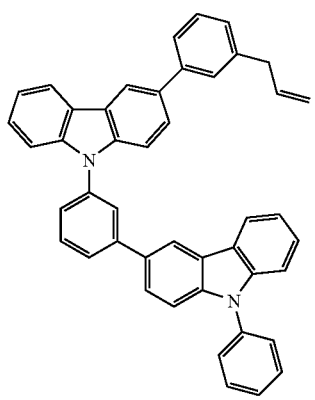
1-31
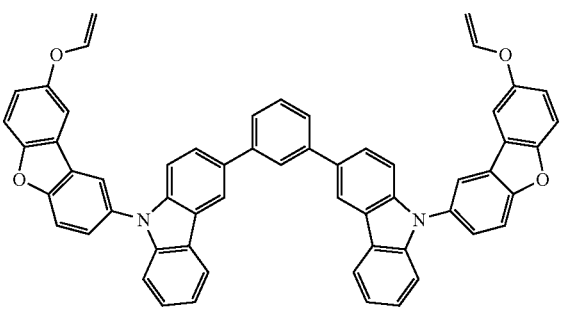
1-32
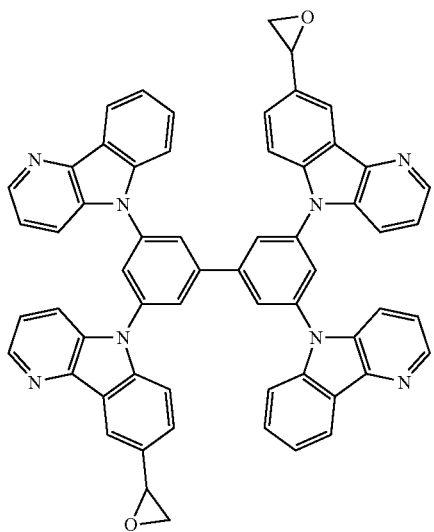
1-33
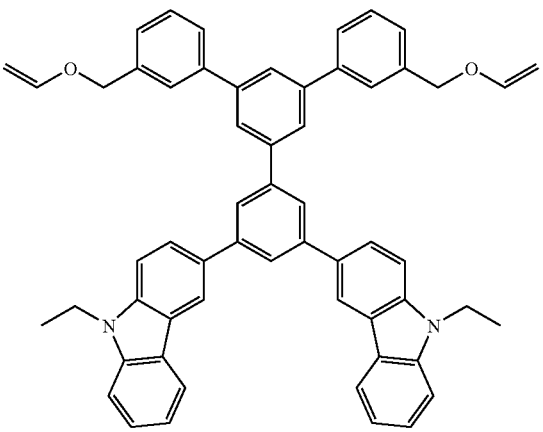
1-34
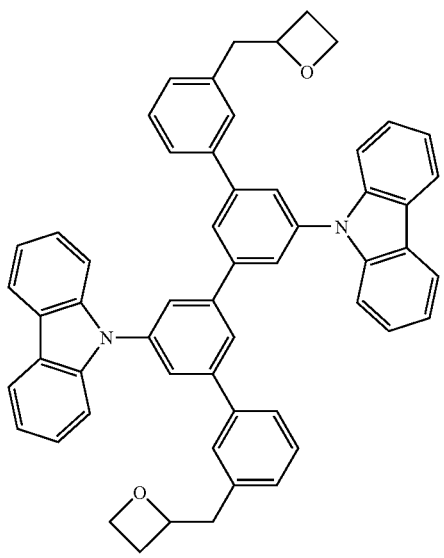
1-35
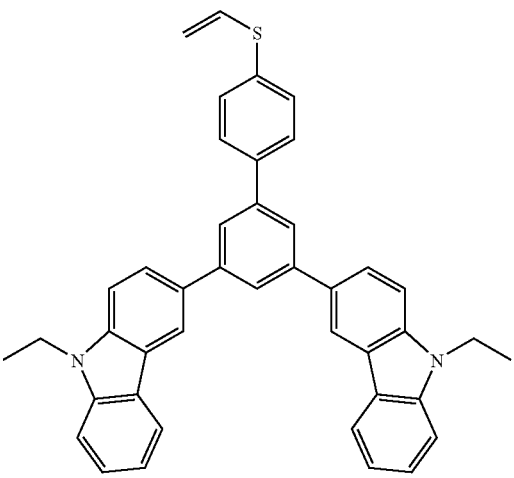

-continued
1-36
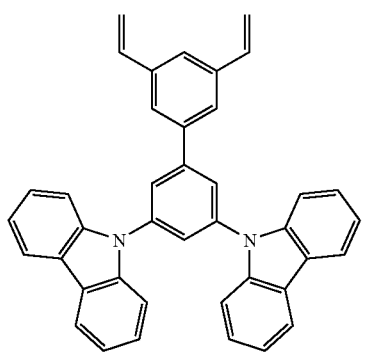
1-37
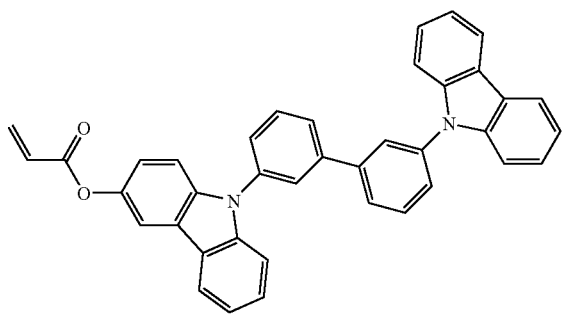
1-38
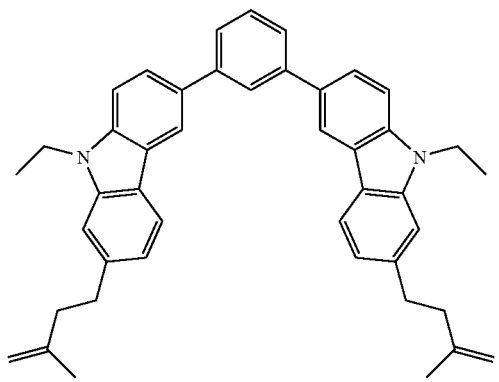
1-39
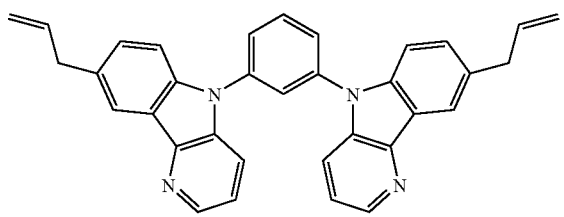
1-40
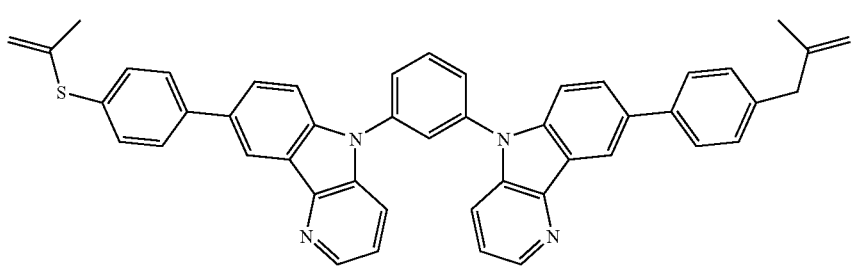
1-41
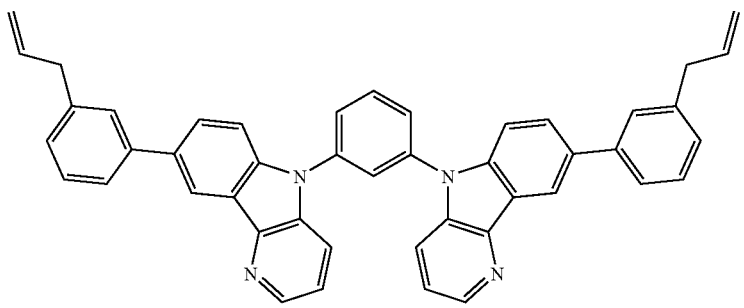

-continued
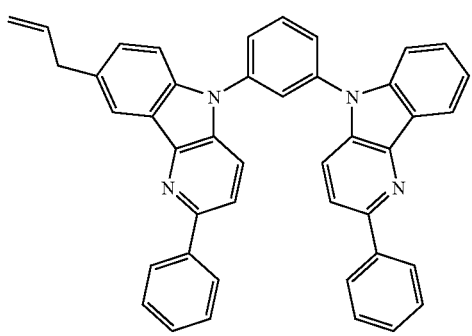
1-42
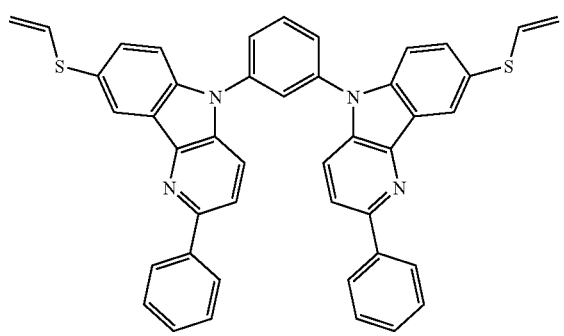
1-43
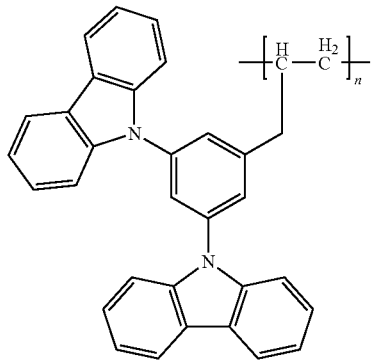
1-44
n = 70,000
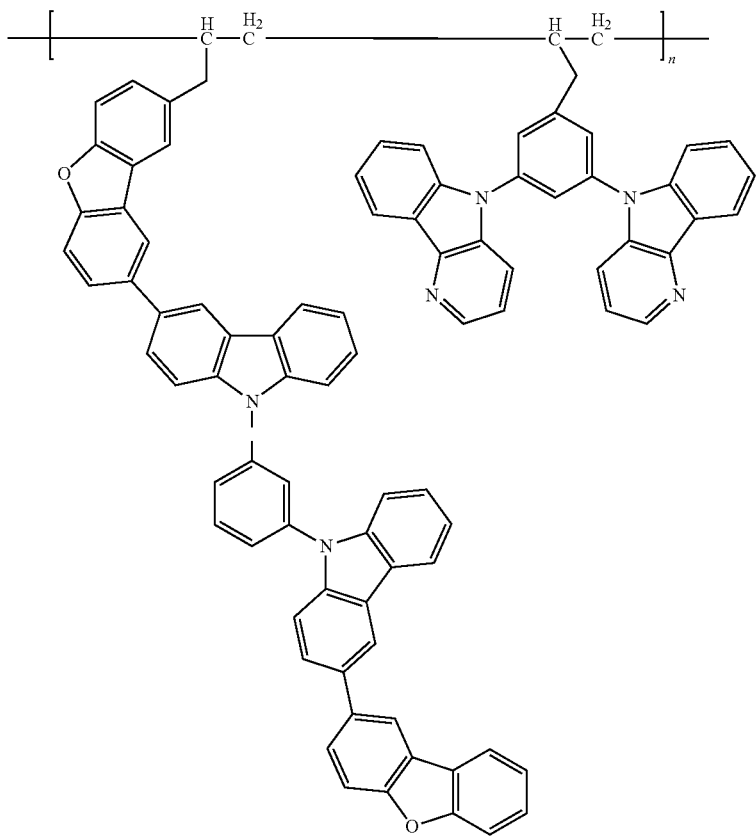
1-45
n = 22,000

1-46
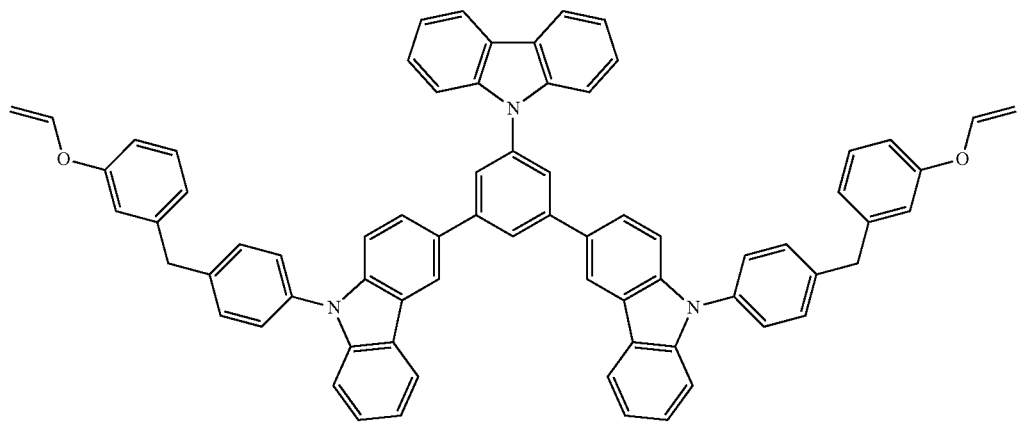
1-47
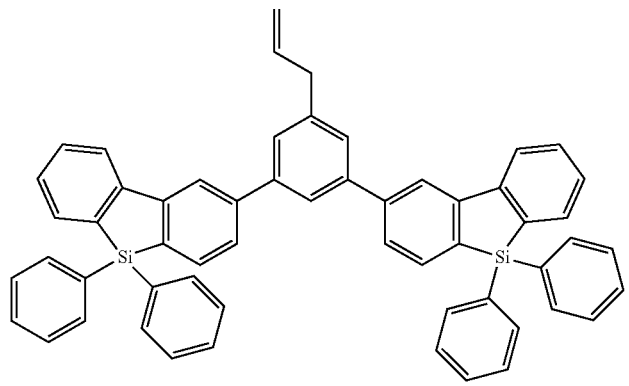
1-48
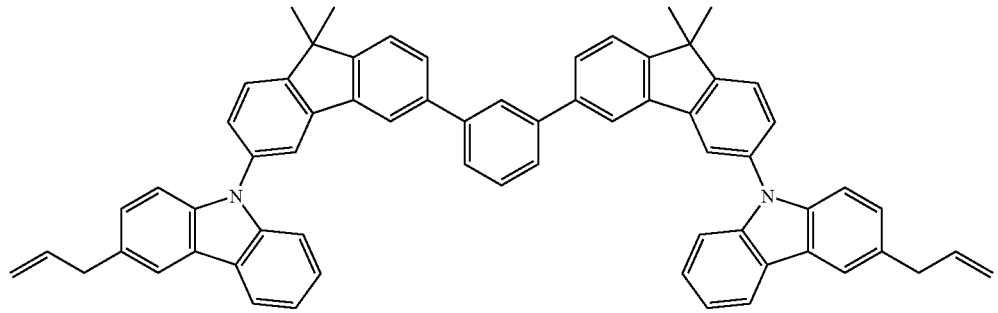
1-49
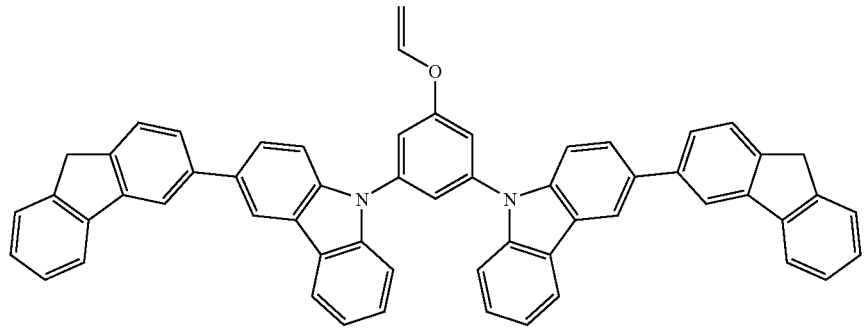

1-50
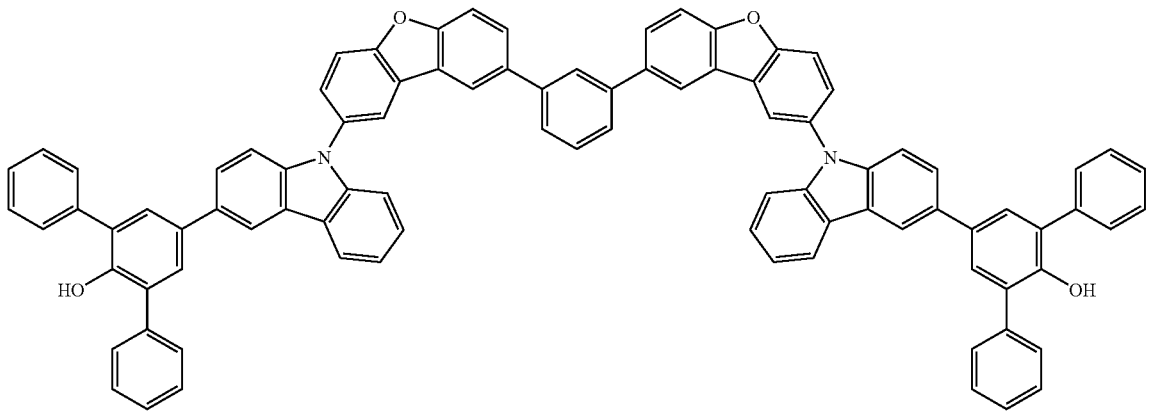
1-51
1-52
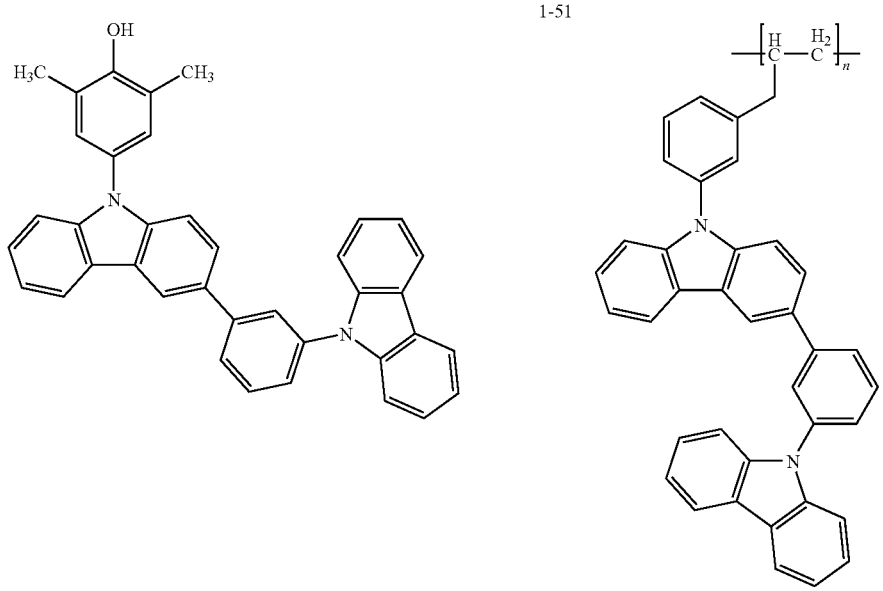
1-53
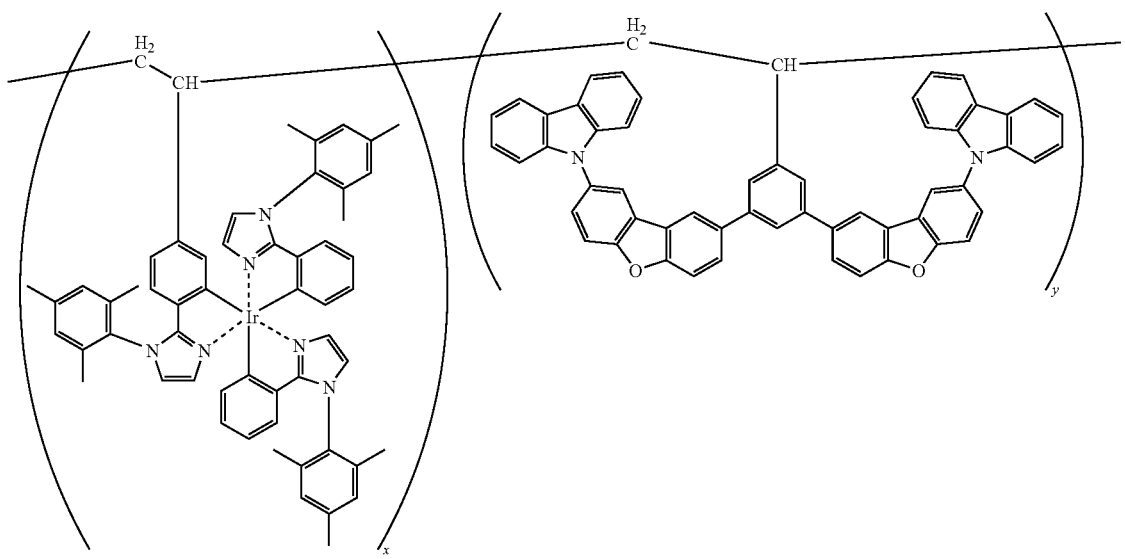
x:y = 1:10
random co-polymer 1-54
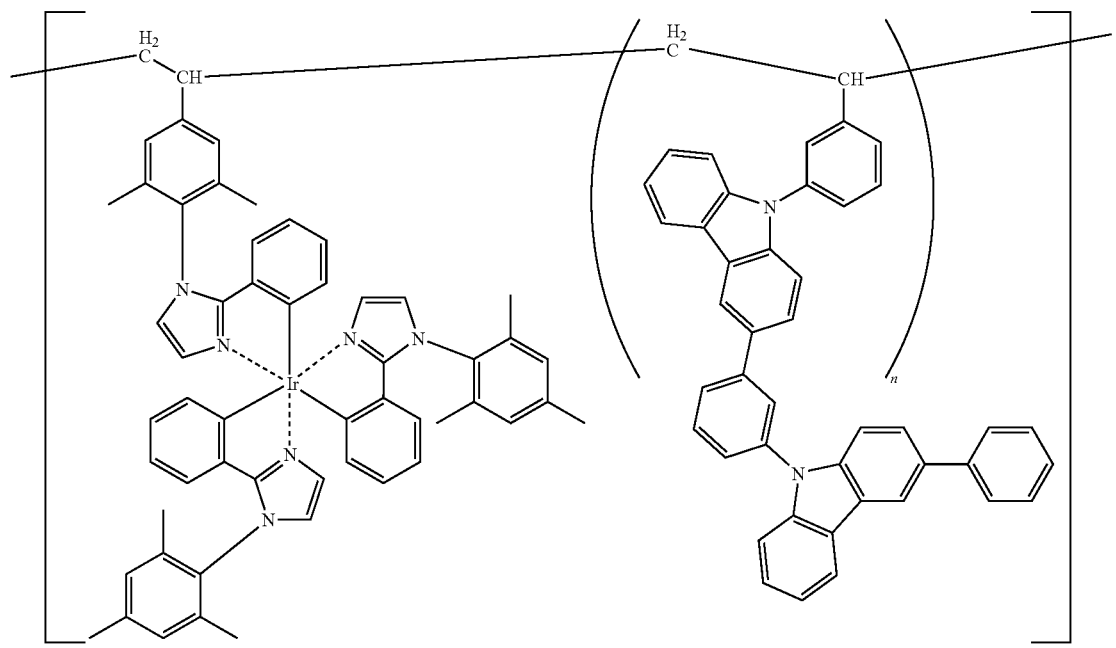
n = 1-10
1-55
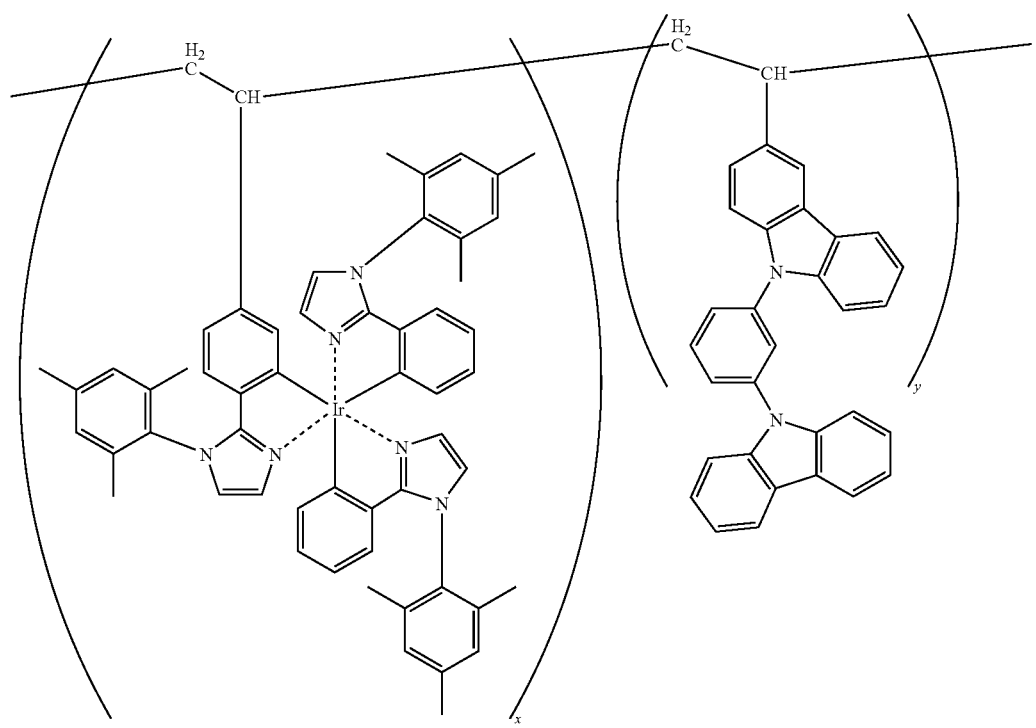
x:y = 1:10
randon co-polymer 1-56
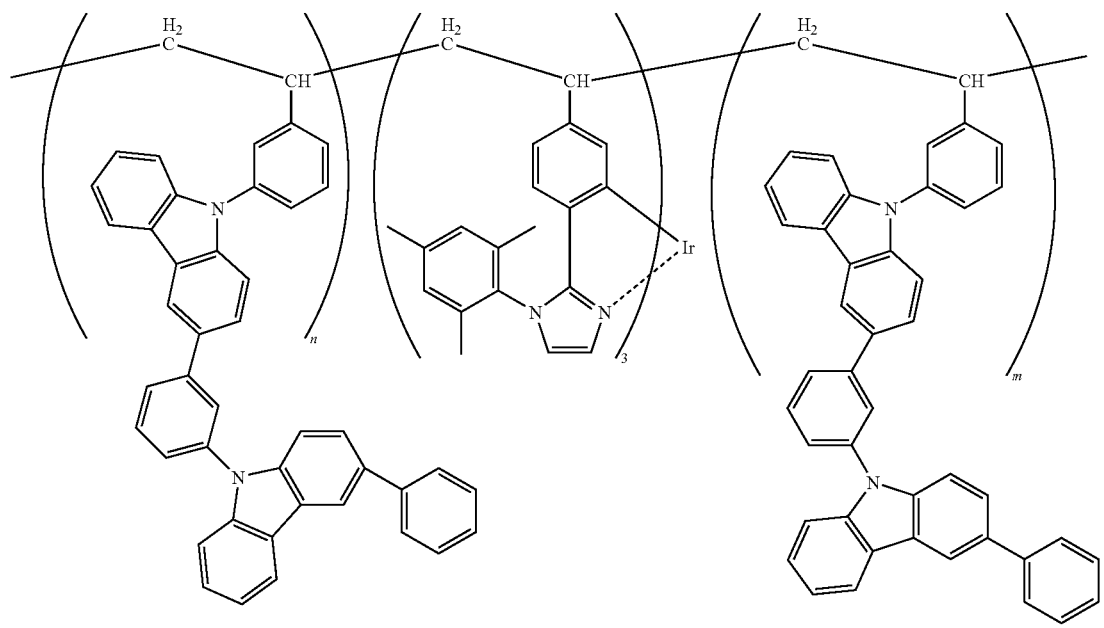
1-57
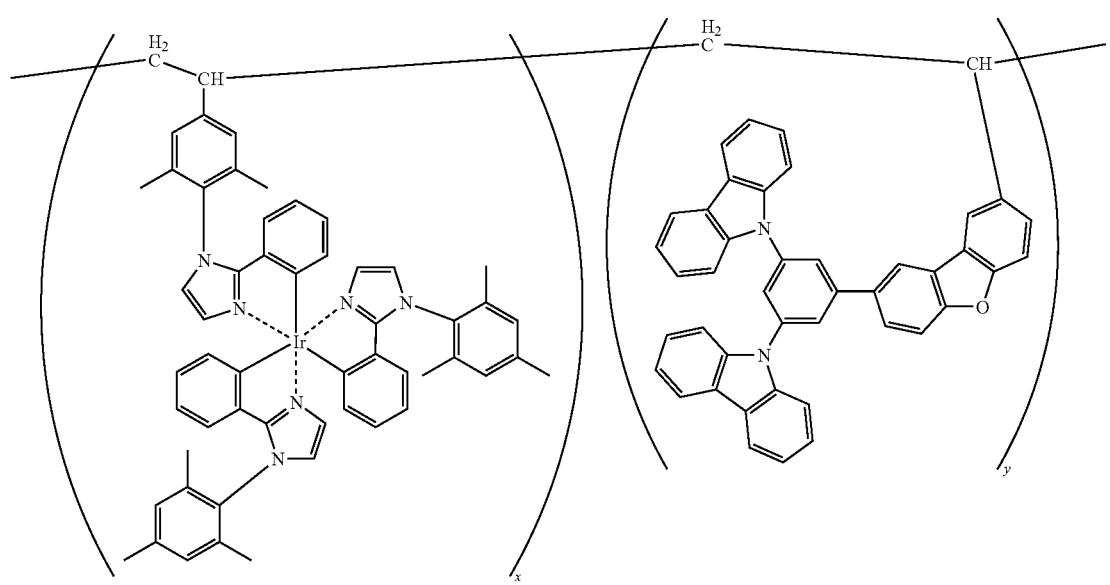
x:y = 1:8
random co-polymer -continued
1-58
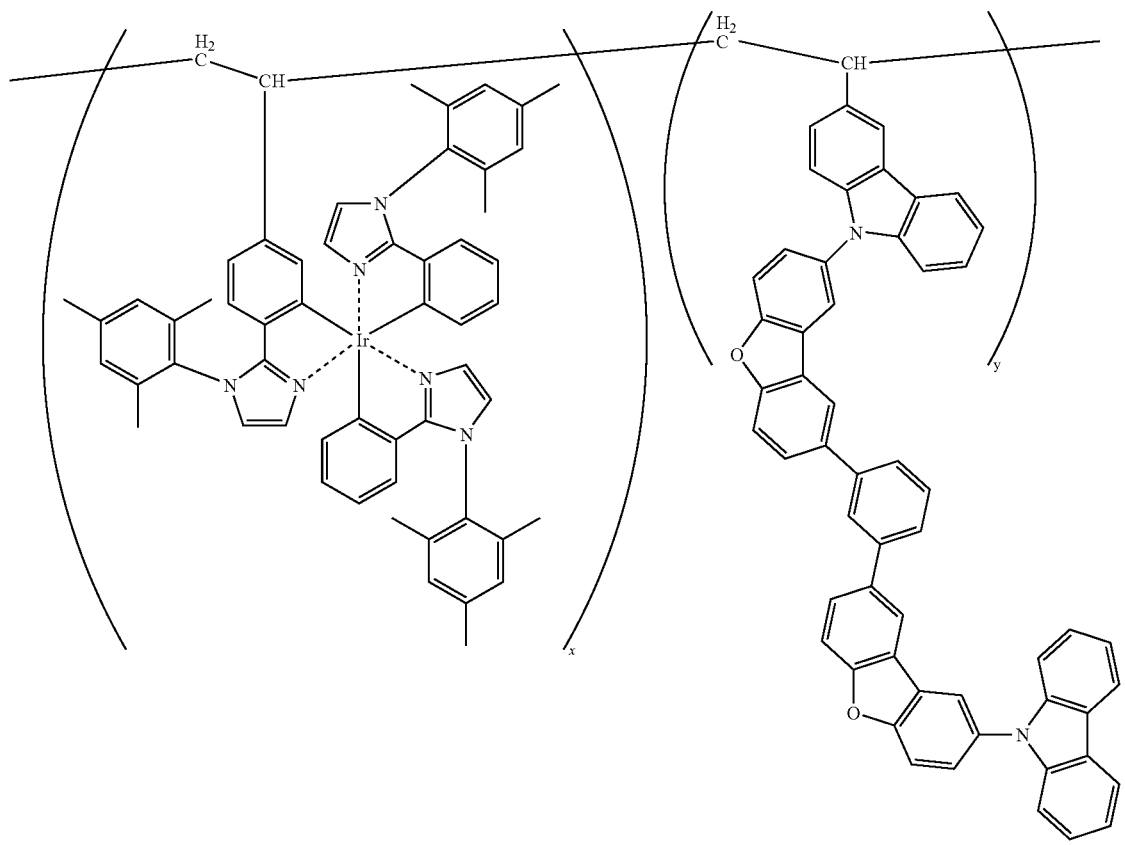
x:y = 1:20
random co-polymer
1-59
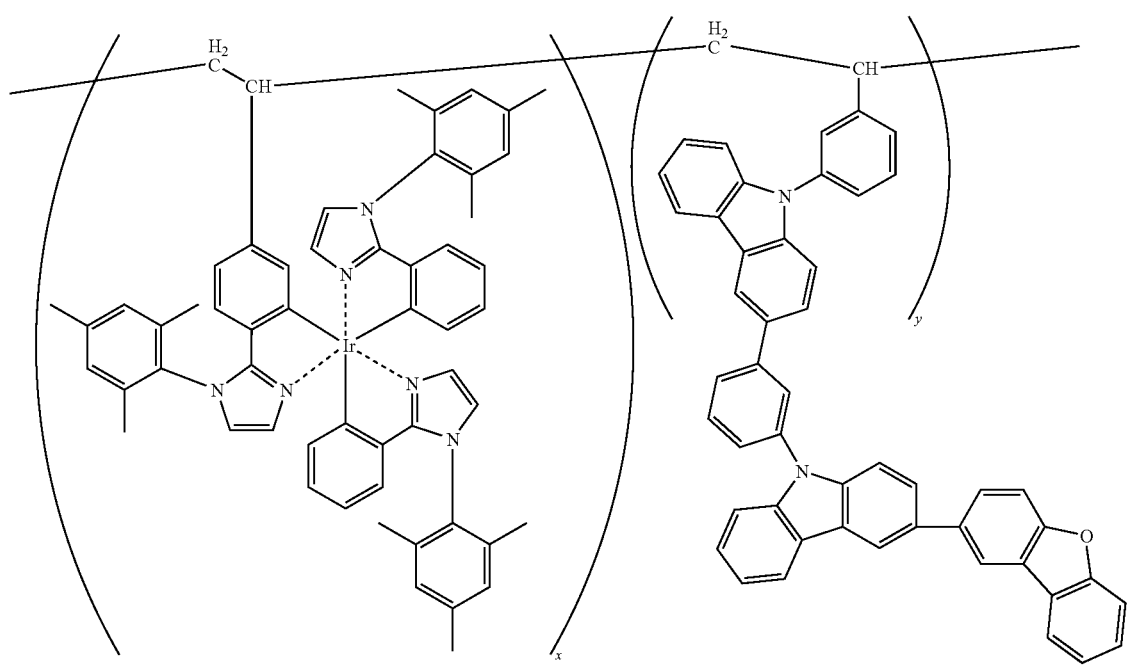
x:y = 1:10
random co-polymer 1-60
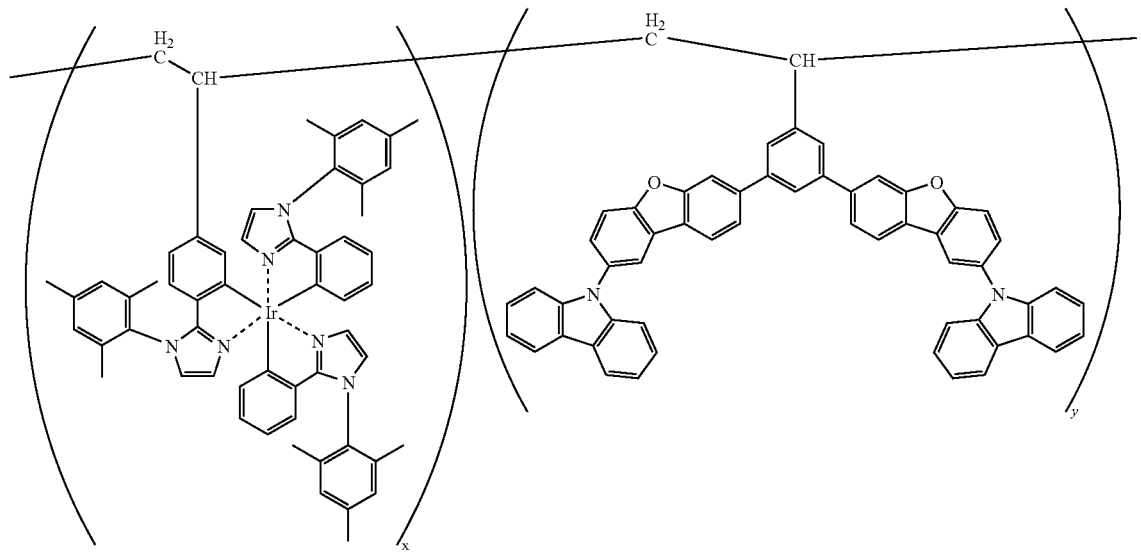
x:y = 1:10
random co-polymer
1-61
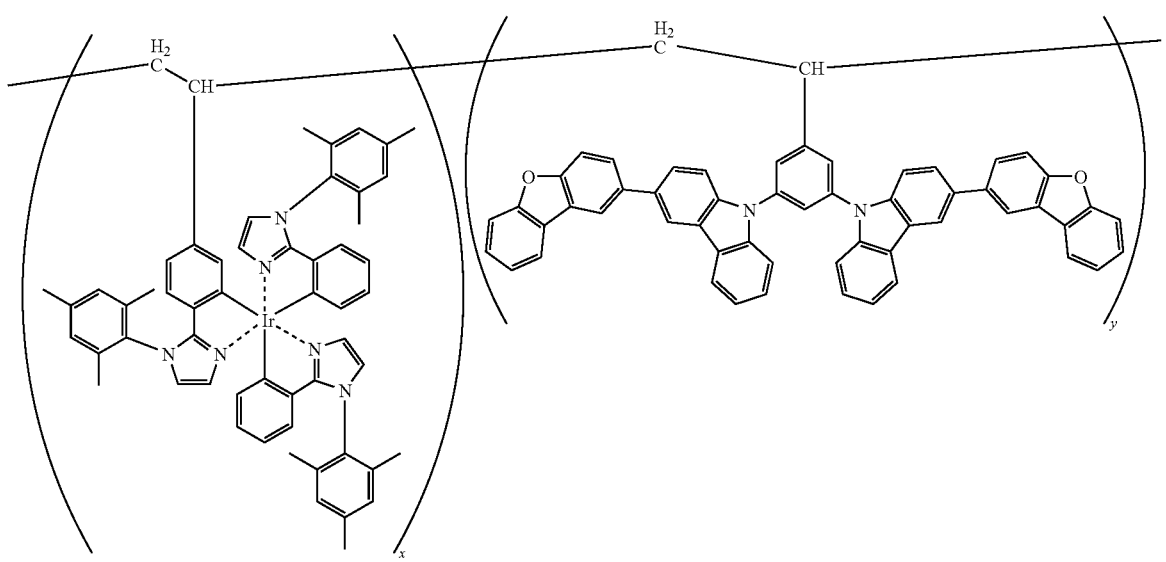
x:y = 1:10
random co-polymer 1-62
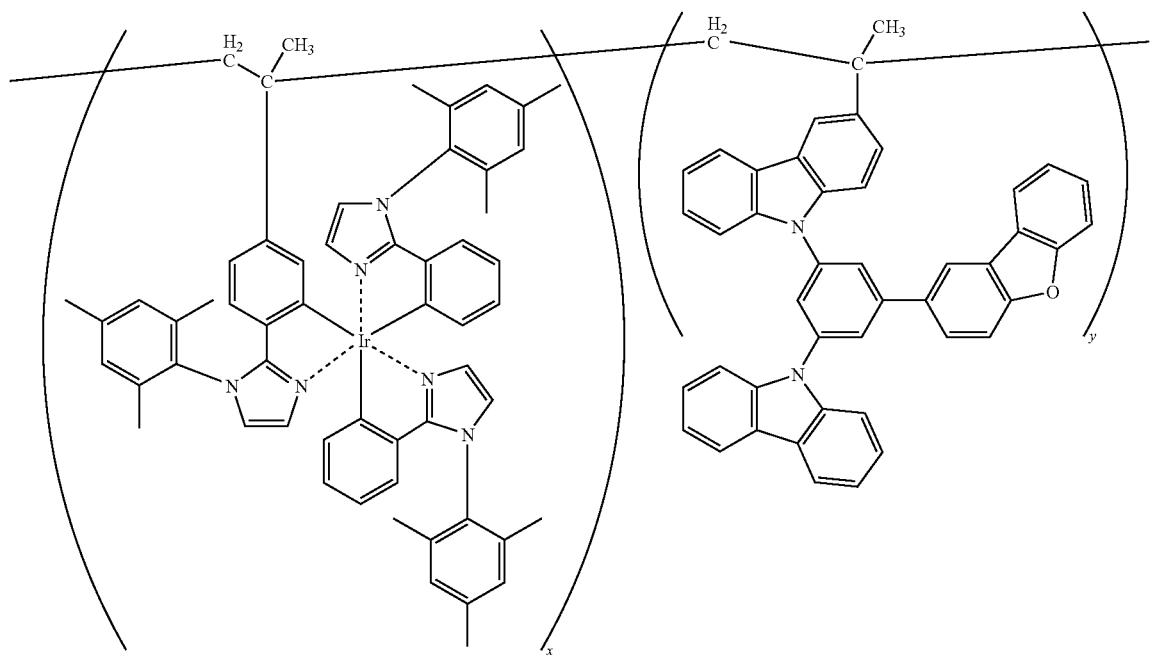
x:y = 1:10
random co-polymer
1-63
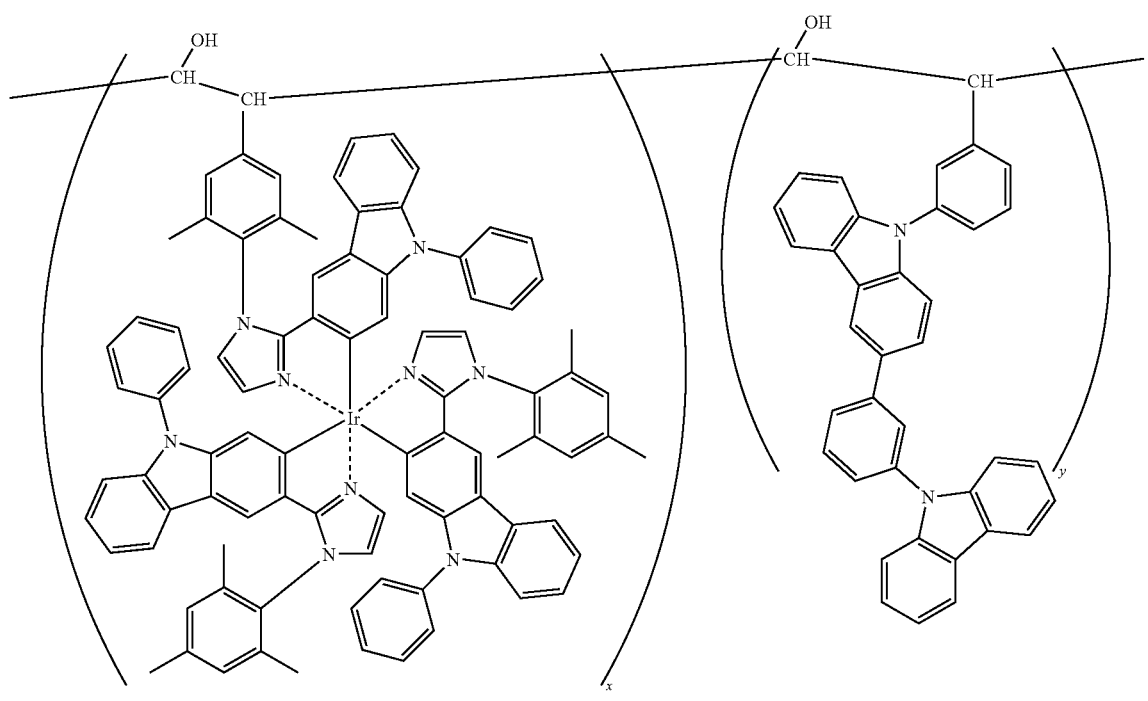
x:y = 1:9
random co-polymer -continued
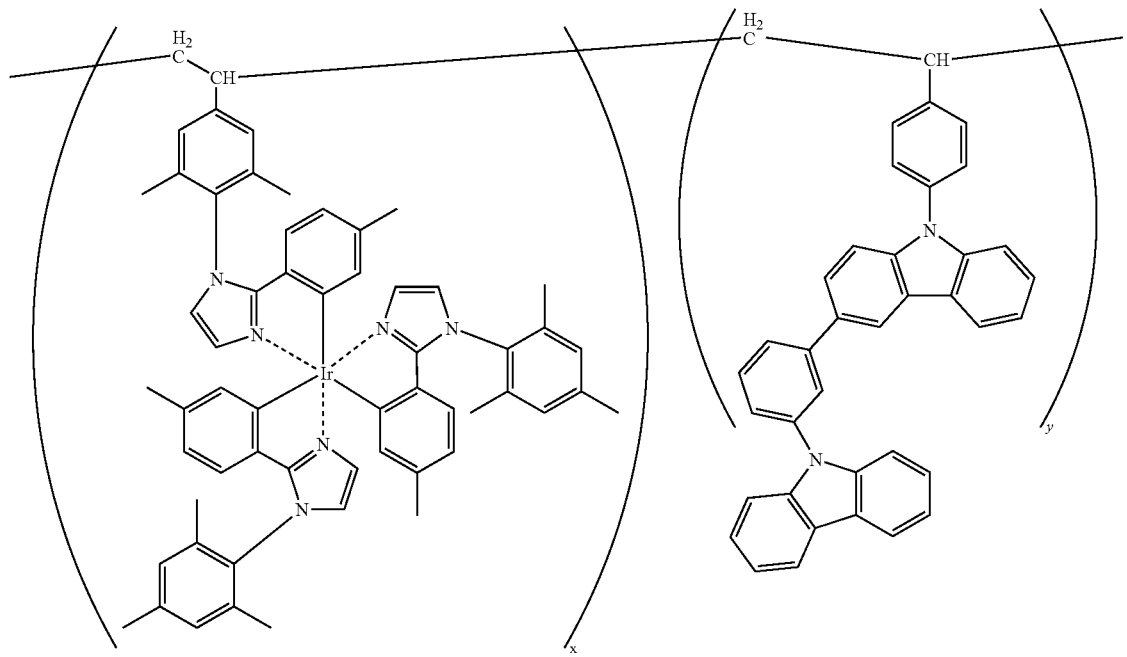
1-64
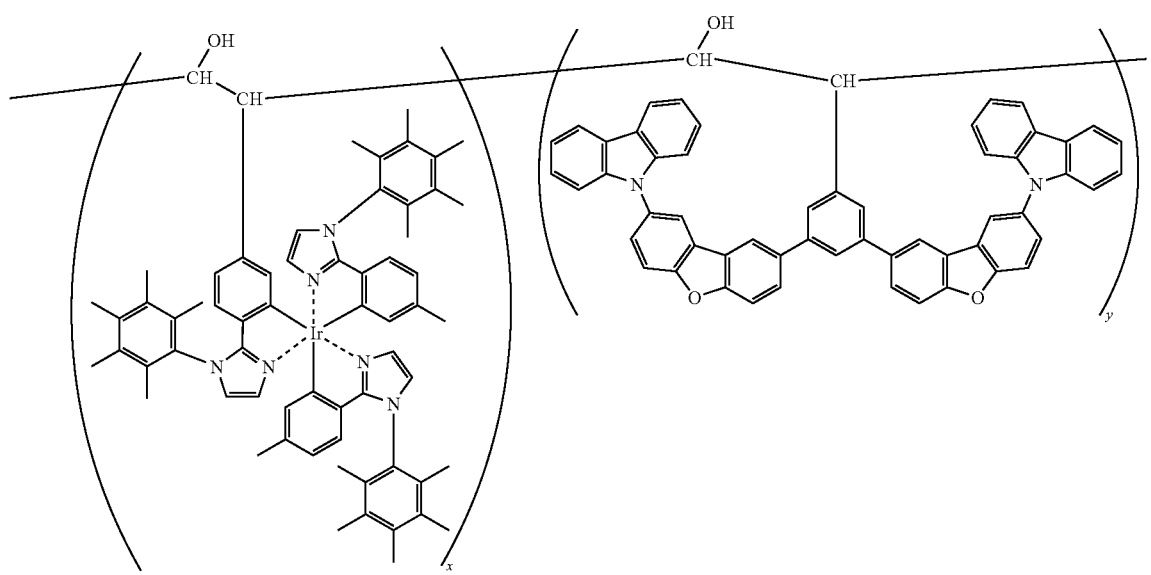
1-65

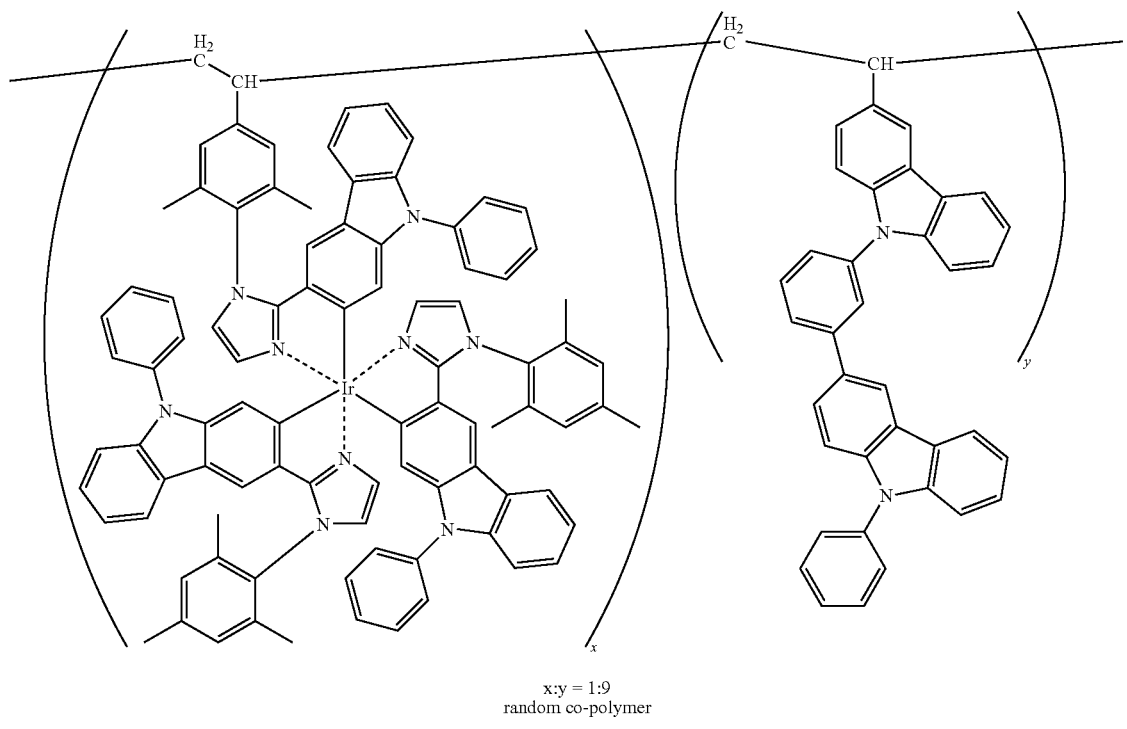
1-66
x:y = 1:9
random co-polymer
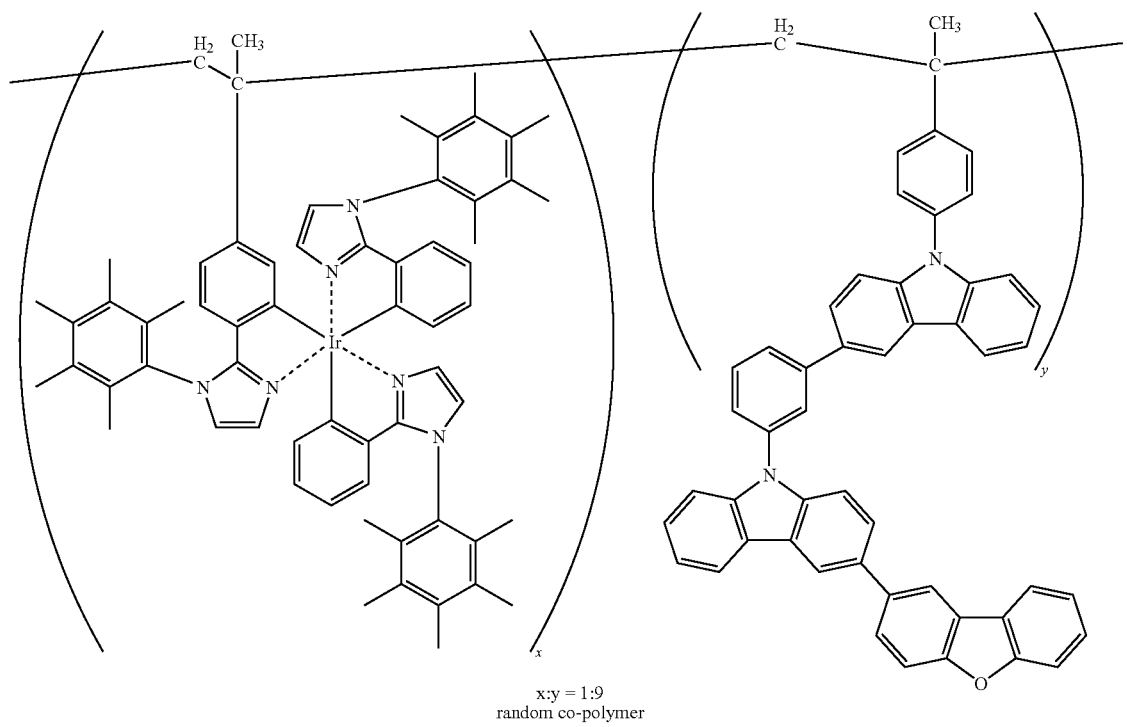
1-67
x:y = 1:9
random co-polymer

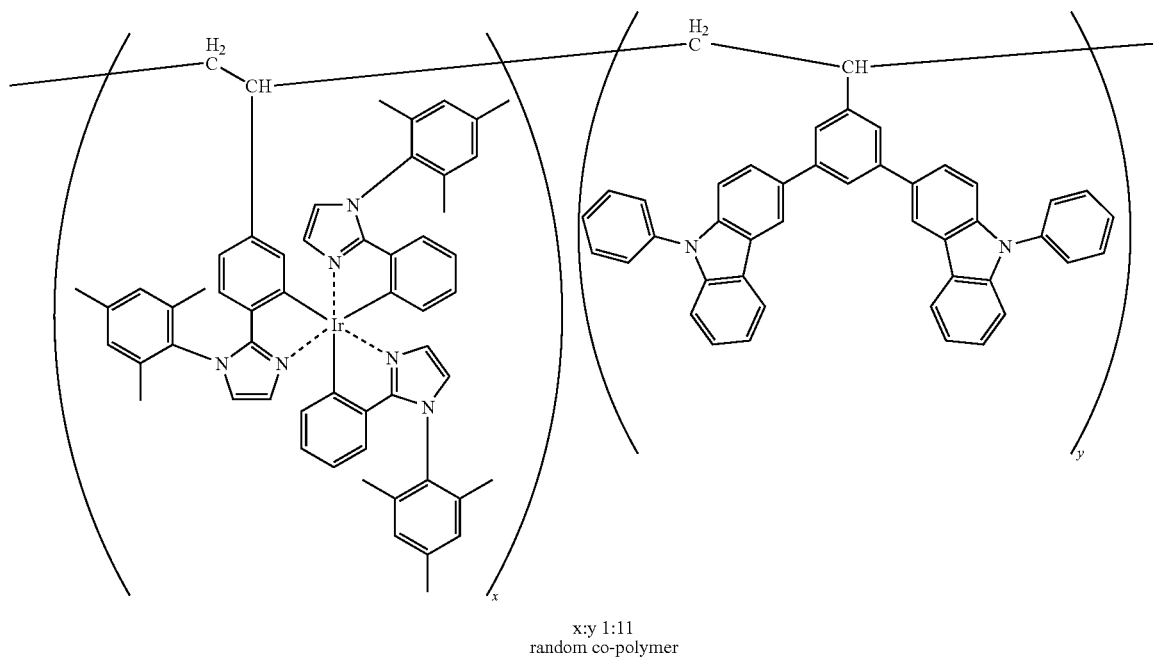
x:y 1:11
random co-polymer
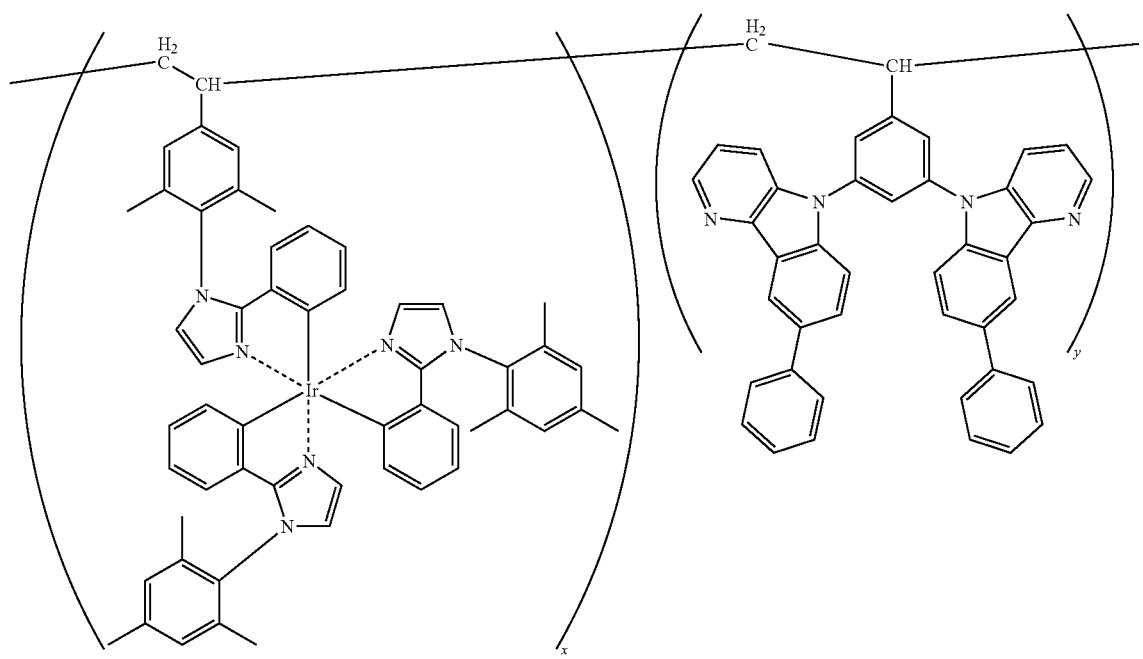
x:y = 1:8
random co-polymer

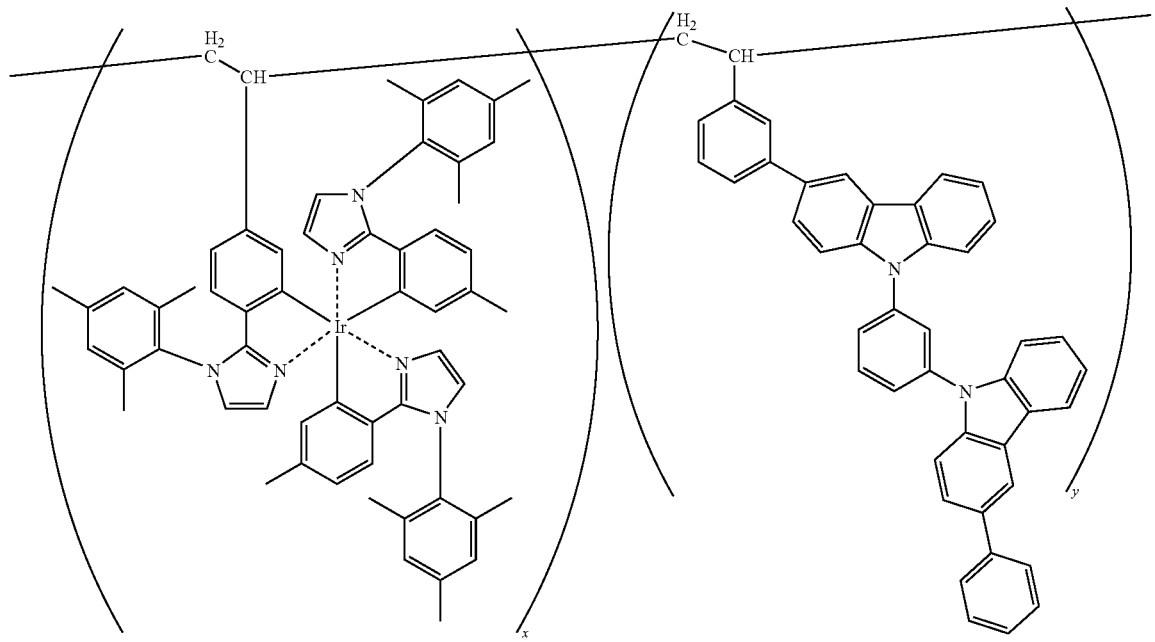
x:y = 1:6
random co-polymer
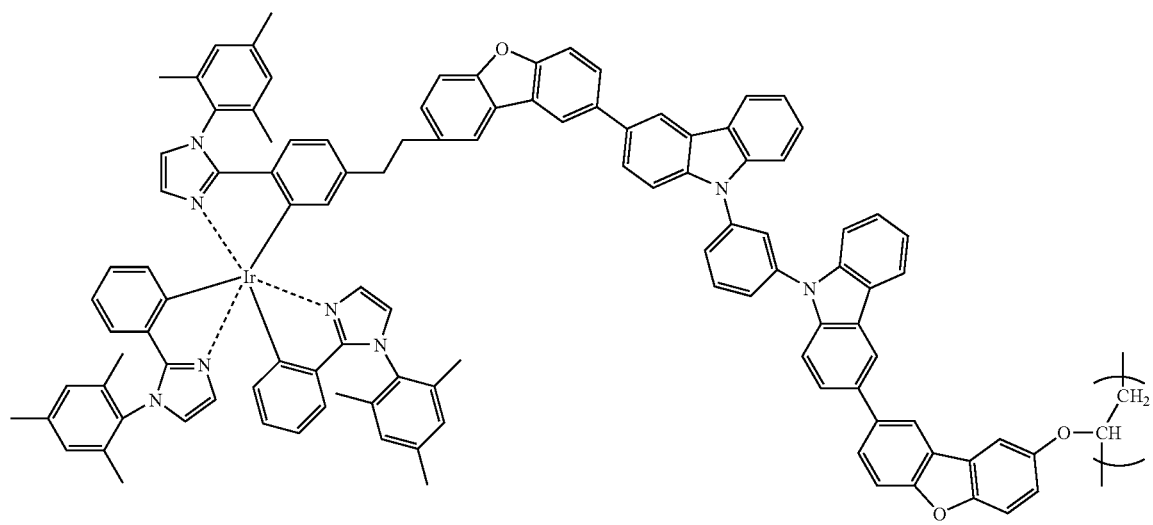

1-72
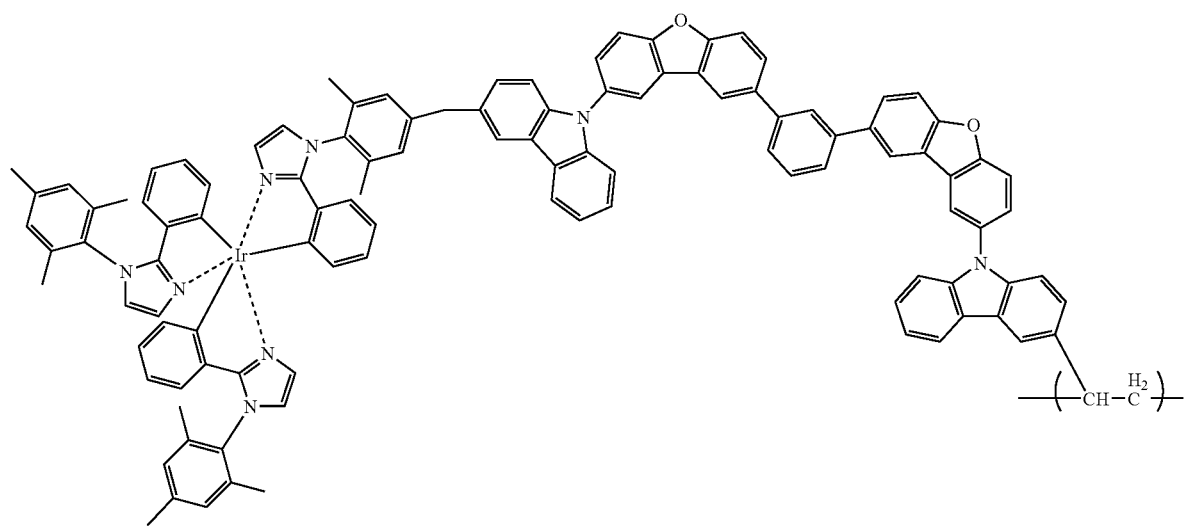
1-73
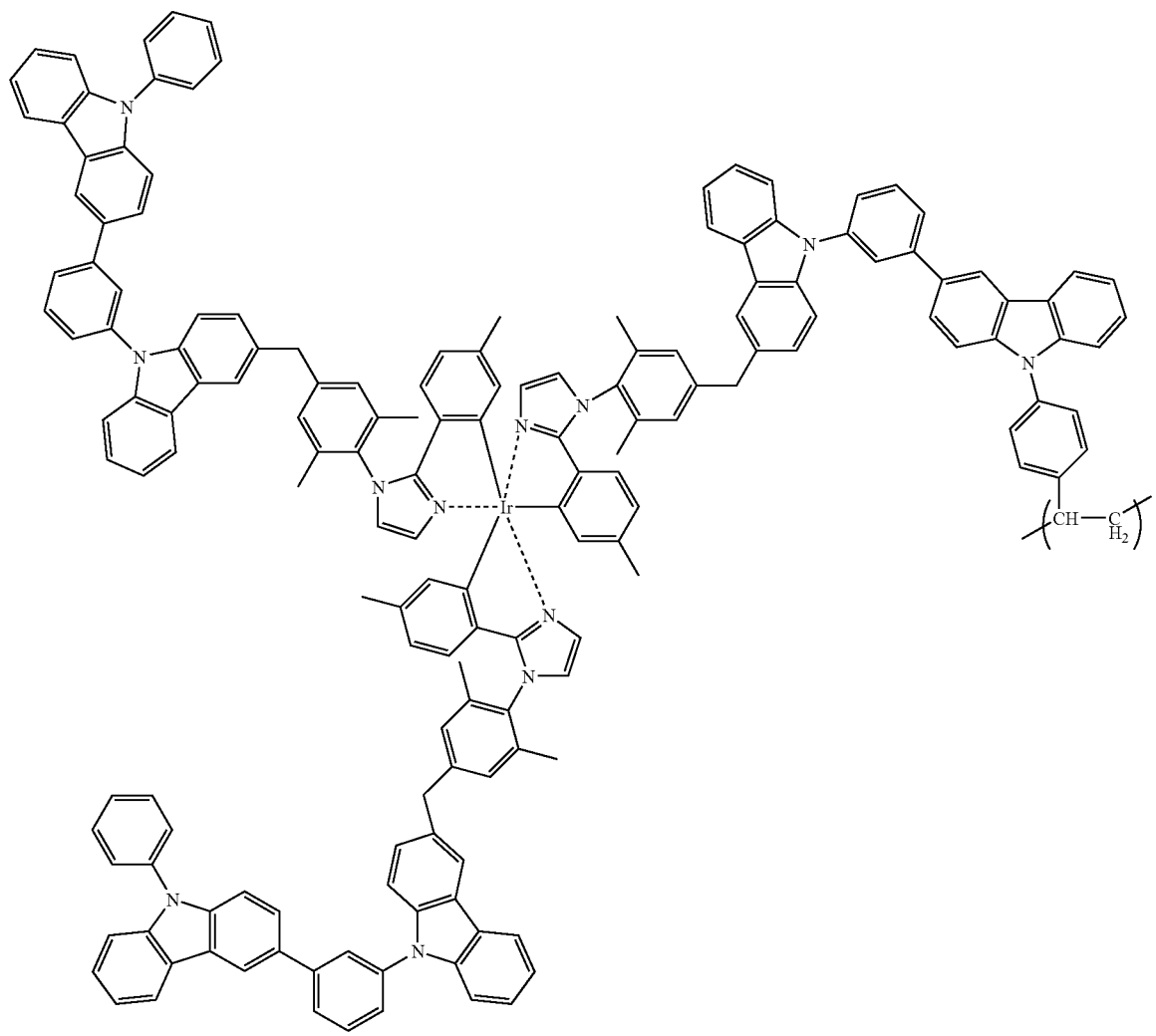

-continued
1-74
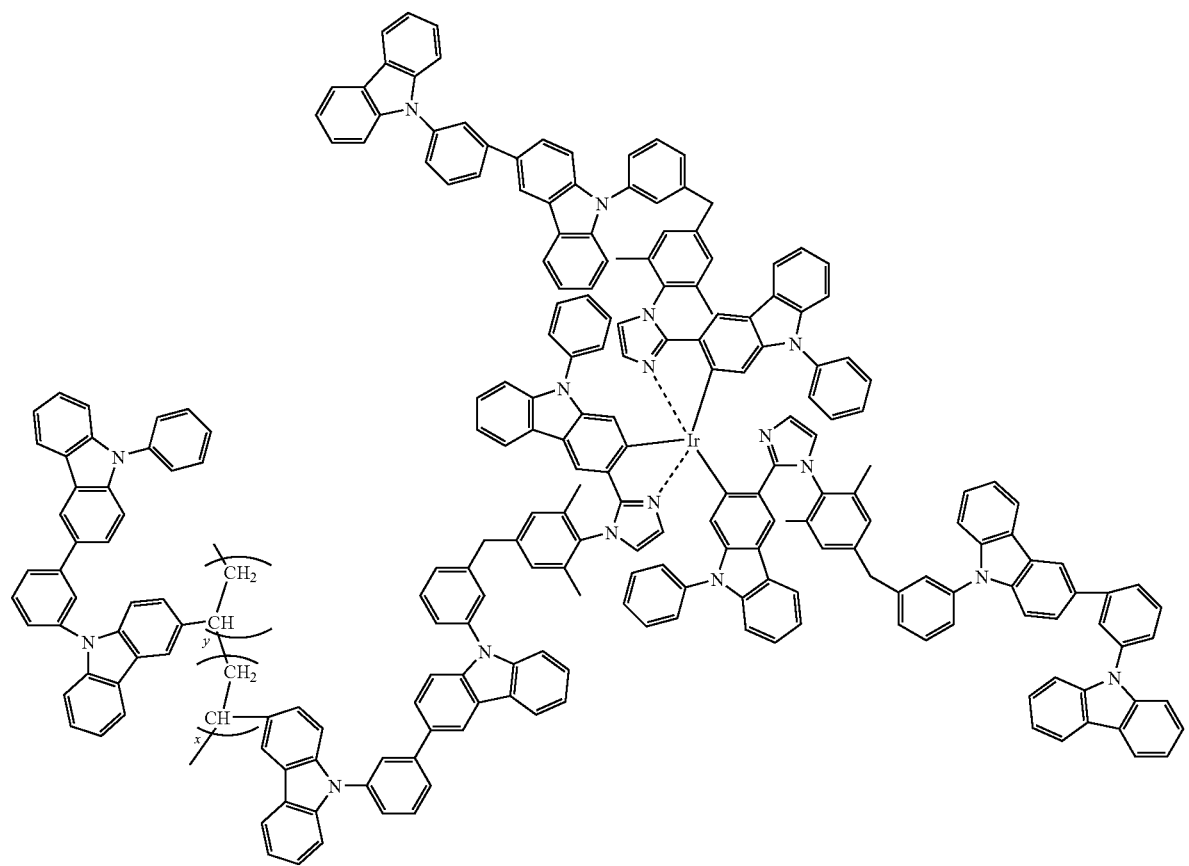
x:y = 1:9
random co-polymer

-continued
1-75
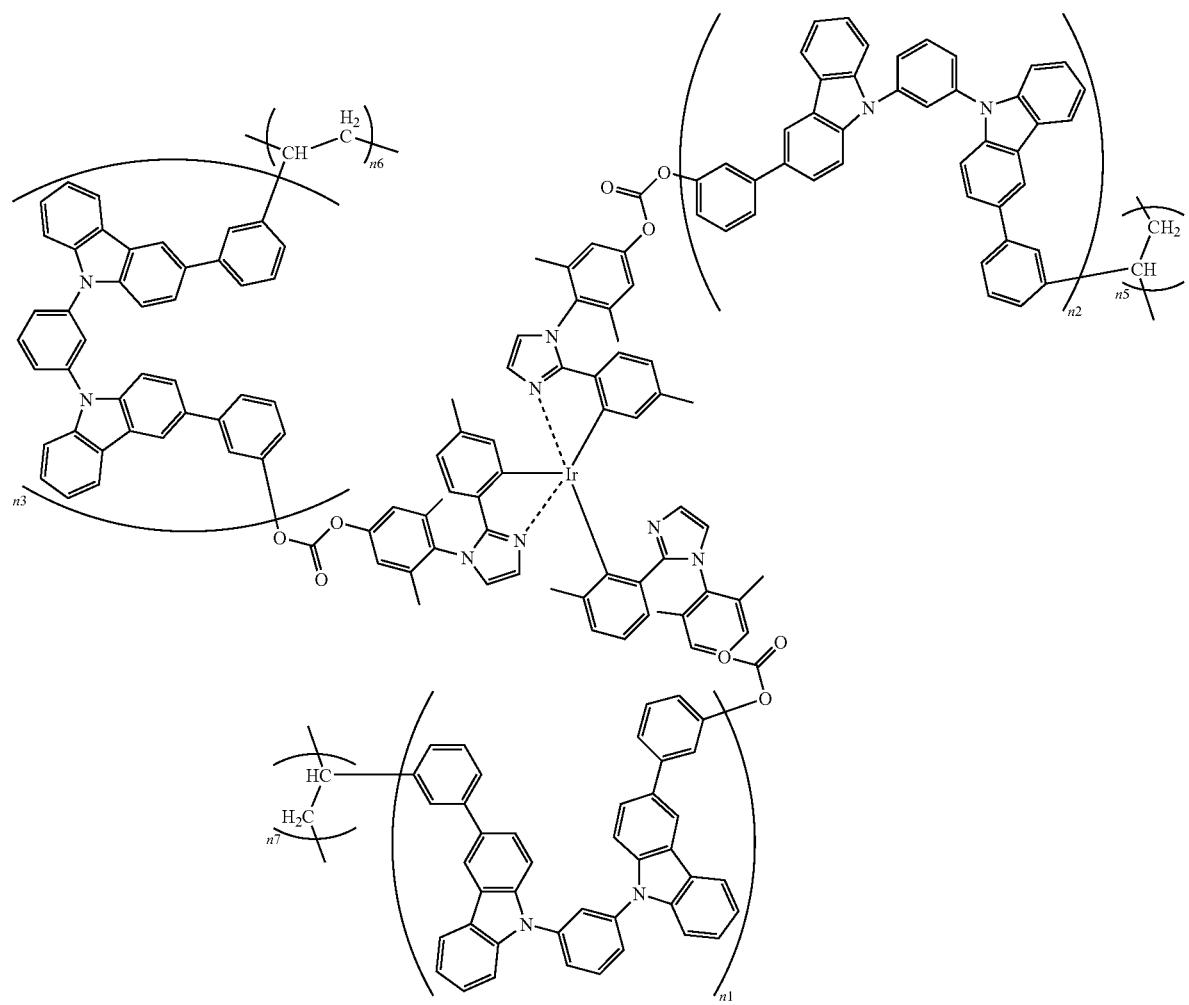
1-76
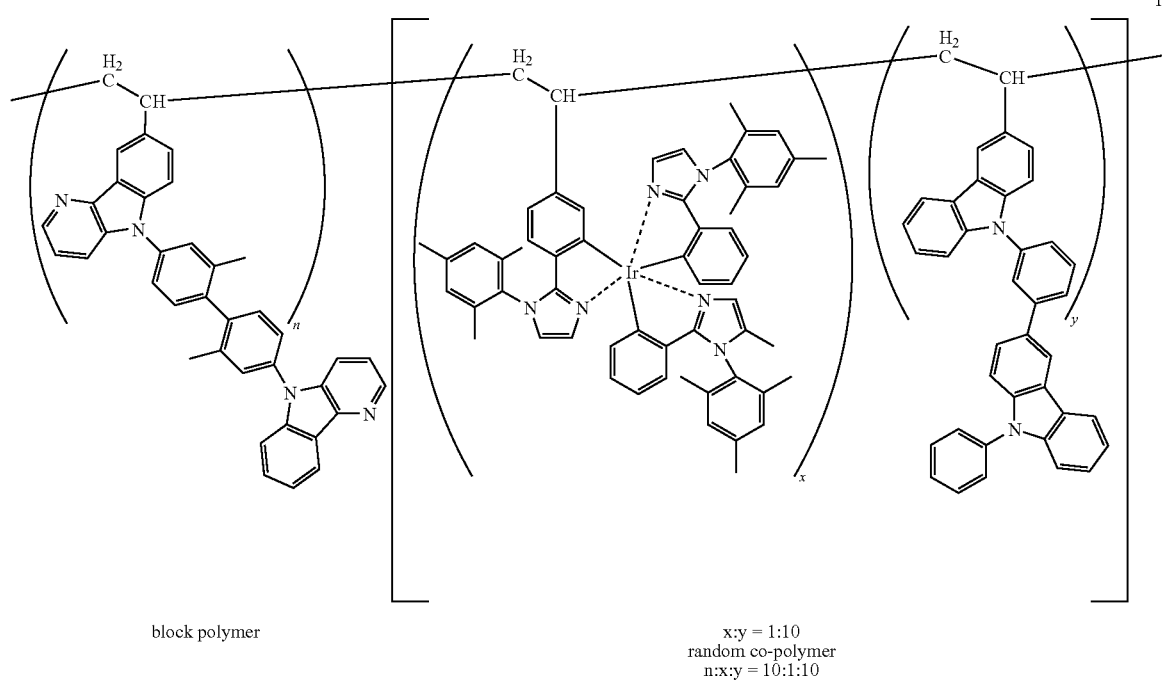
block polymer
x:y = 1:10
random co-polymer
n:x:y = 10:1:10

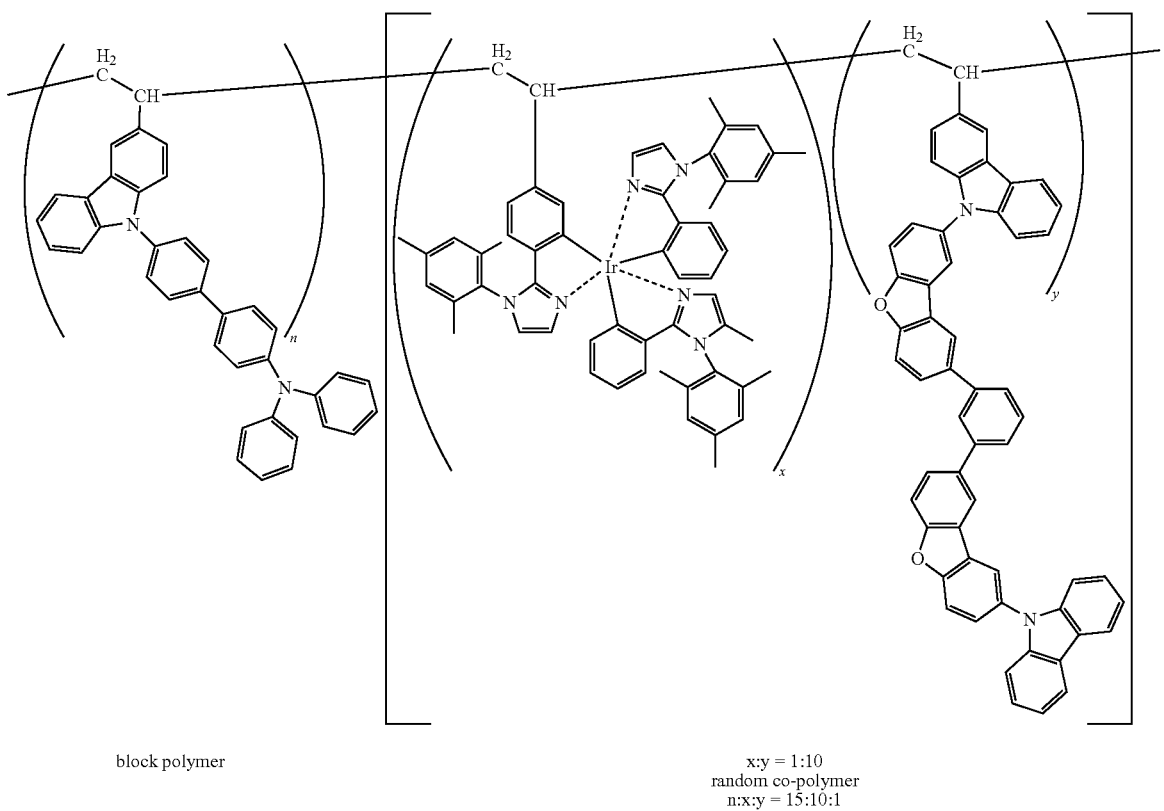

block polymer x:y = 1:10
random co-polymer
n:x:y = 15:10:1

1-77

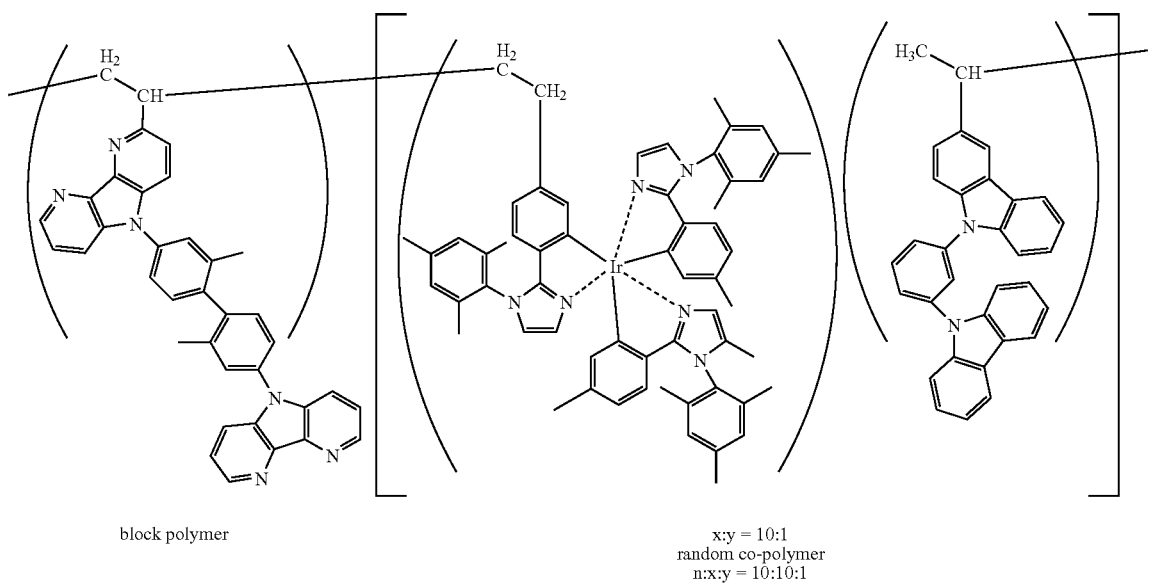

block polymer x:y = 10:1
random co-polymer
n:x:y = 10:10:1

1-78

Compound A according to the present invention and a polymer thereof can be synthesized by referring to the known documents disclosed in "New Polymer Experiments 2—Synthesis and Reactions" (Shin Kobunshi Jikken 2, by Kyoritsu Publisher)

<<Constituting Layer of Organic EL Element>>

The constituting layers of the organic EL element of the present invention are explained. In the present invention, preferred specific examples of the constituting layer of the organic EL element are described below, but the present invention is not limited to them.

(i) an anode/a light emitting layer/an electron transporting layer/a cathode (ii) an anode/a positive hole transporting layer/a light emitting layer/an electron transporting layer/a cathode (iii) an anode/a positive hole transporting layer/a light emitting layer/a positive hole inhibition layer/an electron transporting layer/a cathode (iv) an anode/a positive hole transporting layer/a light emitting layer/a positive hole inhibition layer/an electron transporting layer/a cathode buffer layer/a cathode (v) an anode/a anode buffer layer/a positive hole transporting layer/a light emitting layer/a positive hole inhibition layer/an electron transporting layer/a cathode buffer layer/a cathode In the organic EL element of the present invention, the emission maximum wavelength of the blue light emitting layer is preferably in the range of 430 to 480 nm, and each of the green light emitting layer and the red light emitting layer is preferably a light emitting layer of a single color exhibiting the emission maximum wavelength of in the range of 510 to 550 nm and in the range of 600 to 640 nm, respectively. The above described organic EL element is preferably employed in the display device. Further, a white light emitting layer may be made by laminating at least three layers of the above light emitting layers. Furthermore, a non-light emitting intermediate layer may be placed between the light emitting layers. The organic EL element of the present invention is preferably a white light emitting layer, and is preferably a lighting device employing thereof.

Each layer constituting the organic EL element of the present invention will be explained.

<<Light Emitting Layer>>

The light emitting layer of the present invention is a layer which emits light by recombination of electrons and positive holes which are injected from electrodes, an electron transporting layer or a positive hole transporting layer, and the light emitting part may be within the light emitting layer or at a boundary surface between the light emitting layer and the adjacent layer.

The total thickness of the light emitting layers is not particularly limited, but is preferably controlled within a range of 2 nm to 5 μm from a view point of uniformity of the layer, prevention of applying an unnecessary high voltage during a light emission, and improvement of the stability of a color of the emitted light against a driving current, more preferably controlled in the range of 2 nm to 200 nm, and particularly preferably in the range of 10 nm to 20 nm.

The light emitting layer may be produced by forming a film of a light emitting dopant or a host compound via commonly known thin film forming methods such as a vacuum deposition method, a spin coat method, a casting method, a LB method and an inkjet method.

It is preferable to incorporate a light-emitting host compound and at least one of light emitting dopants (such as a phosphorescent light emitting dopant (also referred to as a phosphorescent light emitting dopant) and a fluorescent dopant) into the light emitting layer of the organic EL element of the present invention.

<<Host Compound (or Also Referred to Emission Host Compound)>>

A host compound used in the present invention will be described.

The host compound of the present invention refers to a compound contained in an emission layer in an amount of 20 weight % or more and exhibiting a phosphorescence quantum yield of less than 0.1 during phosphorescence emission at room temperature (25° C.). More preferably, the phosphorescence quantum yield of the host compound is less than 0.01. Among the compounds contained in the emission layer, the content of the host compound is preferably 20 weight % or more.

An emission host compound of the present invention may be a known host compound or it may be used by combining with plural known host compounds. It is possible to control the transfer of charges by making use of a plurality of host compounds, which results in high efficiency of an organic EL element. In addition, it is possible to mix a different emission lights by making use of a plurality of phosphorescent compounds. Any required emission color can be obtained thereby.

Further, an emission host of this invention may be either a low molecular weight compound or a polymer compound having a repeating unit, in addition to a low molecular weight compound provided with a polymerizing group such as a vinyl group and an epoxy group (an evaporation polymerizing emission host).

An emission host is preferably a compound having a positive hole transporting ability and an electron transporting ability, as well as preventing elongation of an emission wavelength and having a high Tg (a glass transition temperature).

As specific examples of emission host compounds known in the fields are described in the following Documents.

For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

(Emission Dopant)

The emission dopant of the present invention will now be described.

As an emission dopant of the present invention, a phosphorescence-emitting dopant (or called as a phosphorescence-emitting material) or a fluorescence-emitting dopant (or called as a fluorescence-emitter, a fluorescence compound or a fluorescence-emitting compound) can be used. However, in order to obtain an organic EL element having a high emission efficiency, it is preferable to incorporate both a host compound described above and a fluorescence-emitting dopant as an emission dopant (or simply called as an emission material) in an emission layer or in an emission unit.

(Phosphorescence-Emitting Dopant)

A phosphorescence-emitting dopant used in the present invention will be described.

The phosphorescence-emitting dopant of the present invention is a compound, wherein emission from an excited triplet state thereof is observed, emitting phosphorescence at room temperature (25° C.) and exhibiting a phosphorescence quantum yield of at least 0.01 at 25° C. The phosphorescence quantum yield is preferably at least 0.1.

The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using appropriate solvents. However, it is only necessary for the phosphorescent compound of the present invention to exhibit the above phosphorescence quantum yield (at least 0.01) using any of the appropriate solvents.

Two kinds of principles regarding emission of a phosphorescence-emitting dopant are cited. One is an energy transfer-type, wherein carriers recombine on a host compound on which the carriers are transferred to produce an excited state of the host compound, and then via transfer of this energy to a phosphorescence-emitting dopant, emission from the phosphorescence-emitting dopant is realized. The other is a carrier trap-type, wherein a phosphorescence-emitting dopant serves as a carrier trap and then carriers recombine on the phosphorescence-emitting dopant to generate emission from the phosphorescence-emitting dopant.

In each case, the excited state energy of the phosphorescence-emitting dopant is required to be lower than that of the host compound.

As the phosphorescence-emitting dopant, there may be employed any appropriate compound selected from those known in the art used in an emission layer incorporating an organic EL element.

However, the phosphorescence-emitting dopant of the present invention is preferably a complex compound containing, as the central metal, a metal of the 8th-10th groups of the periodic table of the elements, but is more preferably an iridium compound (an Ir complex), an osmium compound, a platinum compound (a platinum complex compound), or a rare earth complex. Of these, an iridium compound (an Ir complex) is most preferable.

Examples of the phosphorescence-emitting dopant of the present invention are listed below, but the present invention is not limited to these. The listed compounds can be synthesized via a method described, for example, in Inorg. Chem., Vol. 40, pages 1704-1711.

[0-0 Transition Band]

It is preferable that a phosphorescence-emitting dopant according to the present invention has a 0-0 transition band in the region of 485 nm or less, and has an ionization potential of 5.5 eV or less.

(Measuring Method for 0-0 Transition Band)

A measuring method for 0-0 transition band of the phosphorescence-emitting dopant according to the present invention will be described. First, a method for measuring a phosphorescence spectrum will be described.

A compound to be measured is dissolved in a mixed solvent of well-deoxygenated ethanol/methanol (4/1 by volume) and placed in a cell for phosphorescence measurement, followed by irradiation of exciting light at a liquid nitrogen temperature of 77 K to measure an emission spectrum 100 ms after completion of the irradiation of exciting light. It is conceivable that since phosphorescence features a longer emission life than fluorescence, most of the light remaining after the 100 ms have elapsed is phosphorescence.

Incidentally, a compound exhibiting a phosphorescence life of shorter than 100 ms may be measured by shortening a delay time. However, in cases when shortening the delay time to the extent that the shortened delay time is not distinguished from the life of fluorescence, a problem occurs in that phosphorescence and fluorescence each are indistinguishable, and therefore it is necessary to select an appropriate delay time capable of distinguishing therebetween.

For a compound insoluble in the solvent system described above, any appropriate solvent, which can dissolve the compound, may be employed (it is not substantially problematic since a solvent effect on the phosphorescence wavelength in the above measurement method is negligible).

Subsequently, a method of determining the 0-0 transition band is described. In the present invention, the 0-0 transition band is defined as the maximum emission wavelength appearing in the shortest wavelength portion in the phosphorescence spectrum chart obtained via the above measurement method.

Since the intensity of a phosphorescence spectrum is generally weak, when the spectrum is magnified, it becomes difficult, in some cases, to distinguish between a noise band and a signal peak. In such a case, it is possible to determine a targeted signal peak in such a manner that a stationary light spectrum is magnified, which is then superimposed on another magnified light emission spectrum generated at 100 ms after irradiation of excitation light (for convenience, referred to as "phosphorescence spectrum"), to detect a peak wavelength from the stationary light spectrum originated in the phosphorescence spectrum.

It is also possible to detect a signal peak wavelength by separation of the noise band and the signal peak via a smoothing treatment. The smoothing method by Savitzky and Golay may be applied as the smoothing treatment.

An ionization potential (Ip) of a phosphorescence-emitting dopant according to the present invention is preferably not more than 5.5 eV, and more preferably from 4.5 to 5.5 eV. Here, an ionization potential of the present invention is determined as an energy required to emit an electron stayed at a HOMO (highest occupied molecular orbital) level of a compound to a vacuum level. More specifically, it is an energy to take out an electron of a compound in a film state (layer state). This can be directly measured with a photoelectron spectroscopy. In the present invention, the values obtained with ESCA 5600 UPS (ultraviolet photoemission spectroscopy) (made by ULVAC-PHI, Inc.) are used. In the present invention, a preferable phosphorescence-emitting dopant is a metal complex represented by the aforementioned Formula (1). Here, a metal complex represented by Formula (1) will be described.

In Formula (1), Z represents a hydrocarbon ring or a heterocycle (including a tautomer of each), in which at least one of the third atoms counted from the nitrogen atom bonded to Z has a substituent having a steric parameter value (Es value) of not more than −0.5. "Es value", as described herein, refers to a steric parameter derived from chemical reactivity. It is possible to describe that a decrease in this value indicates that the substituent becomes spatially more bulky. Es value will now be described. It is common knowledge that in a hydrolysis reaction of esters under acidic conditions, effects for the progress of the reaction may be considered to be only caused by the steric hindrance. Based on this, the value which numerically expresses the steric hindrance is Es value.

Es value of substituent X may be obtainable as follows. Reaction rate constant kX of the following chemical reaction in which α-position mono-substituted acetate, which is derived from α-position mono-substituted acetic acid prepared by substituting one hydrogen atom of the methyl group of acetic acid with substituent X, undergoes hydrolysis under acidic conditions, is obtained.

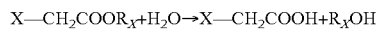

$X-CH_2COOR_X + H_2O \rightarrow X-CH_2COOH + R_XOH$

Reaction rate constant kH of the following reaction ($R_X$ is the same as $R_Y$) in which acetate corresponding to the above α-position mono-substituted acetate undergoes hydrolysis under acetic conditions, is also obtained.

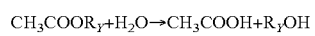

$CH_3COOR_Y + H_2O \rightarrow CH_3COOH + R_YOH$

Subsequently, Es is obtained via the following formula.

$Es = \log(kX/kH)$

The reaction rate decreases due to steric hindrance of substituent X. As a result, since kX<kH is held, Es value commonly becomes negative. In practice, when Es value is obtained, two reaction rate constants, namely kX and kH, are determined and it is calculated based on the above formula.

Specific examples of Es value are detailed in Unger, S. H., Hansch, C., Prog. Phys. Org. Chem. 12, 91 (1976). Further, specific numerical values are also described in "Yakubutsu no Kozo Kassei Sokan (Structural Activity Correlation)" (Kagaku no Ryoiki Zokan No. 122, Nanko Do), and "American Chemical Society Professional Reference Book, 'Exploring QSAR' p. 81, Table 3-3". Table 1 below shows some of them.

TABLE 1

| Substituent | Es Value |
|---|---|
| H | 0 |
| F | −0.46 |
| Cl | −0.97 |
| Br | −1.16 |
| I | −1.4 |
| $CH_3$ | −1.24 |
| $C_2H_5$ | −1.31 |
| $n\text{-}C_3H_7$ | −1.6 |
| $n\text{-}C_4H_9$ | −1.63 |
| $i\text{-}C_4H_9$ | −2.17 |
| $s\text{-}C_4H_9$ | −2.37 |
| $t\text{-}C_4H_9$ | −2.78 |
| $cyclo\text{-}C_4H_7$ | −1.3 |
| $n\text{-}C_5H_{11}$ | −1.64 |
| $i\text{-}C_5H_{11}$ | −1.59 |
| $CH(C_2H_5)_2$ | −3.22 |
| $cyclo\text{-}C_6H_{11}$ | −2.03 |
| $CH_2F$ | −1.48 |
| $CH_2Cl$ | −1.48 |
| $CH_2Br$ | −1.51 |
| $CH_2I$ | −1.61 |
| $CH_2OH$ | −1.21 |
| $CH_2OCH_3$ | −1.43 |
| $CH_2NO_2$ | −2.71 |
| $CH_2COCH_3$ | −1.99 |
| $CHF_2$ | −1.91 |
| $CHCl_2$ | −2.78 |
| $CHBr_2$ | −3.1 |
| $CHOHCH_3$ | −1.15 |
| $CF_3$ | −2.4 |
| $CCl_3$ | −3.3 |
| $CBr_3$ | −3.67 |
| $C(C_6H_5)_3$ | −5.92 |
| $CHCH_3$ | −2.84 |
| CN | −0.51 |
| OH | −0.55 |
| $OCH_3$ | −0.55 |
| SH | −1.07 |
| $SCH_3$ | −1.07 |
| $SF_5$ | −2.91 |
| $NH_2$ | −0.61 |

Further, it should be noted that the Es value, which is defined in the present invention, is not determined while a methyl group is 0, but is determined while a hydrogen atom to be 0, whereby the Es value of the present invention is a value which is obtained by subtracting 1.24 from the Es value determined while a methyl group is 0. In the present invention, a substituent having an Es value of −0.5 or less is preferable, more preferably it is between −7.0 and −0.6, and it is still more preferably between −7.0 and −1.0.

Further, in the present invention, in the case in which keto-enol tautomers are present in R or R', the Es value of the keto portion is determined via conversion as an enol isomer. In cases in which other tautomers are present, Es values are determined based on the same conversion method.

In the present invention, an electron donating substituent indicates a substituent exhibiting a negative Hammett σp value. Examples of such substitutes are shown below. These substituents have a property to give an electron to the binding atom compared to a hydrogen atom.

Examples of electron donating substituents are as follows: a hydroxyl group, an alkoxy group (such as a methoxy group), an acetyloxy group, an amino group, a dimethylamino group, an acetylamino group, an alkyl group (e.g., a methyl group, an ethyl group, a propyl group, and a t-butyl group), an aryl group (e.g., a phenyl group, a mesityl group). Hammett σp values can be found in the following documents.

A Hammett σp value according to the present invention designates a Hammett's substitution constant σp. The Hammett σp value is a substitution constant obtained from the electronic effect of the substituent which affects hydrolysis of ethyl benzoate. These values are described in "Yakubutsu no Kozo Kassei Sokan (Structural Activity Correlation)" (Nanko Do: 1979), and "Substitution Constants for Correlation Analysis in Chemistry and Biology", C. Hansch and A. Leo, John Wiley & Sons, New York, 1979.

The followings are preferred examples for Z in Formula (1). Z is not limited to the examples and Z may be further substituted than those shown below. (*) indicates the place of the bonding position.

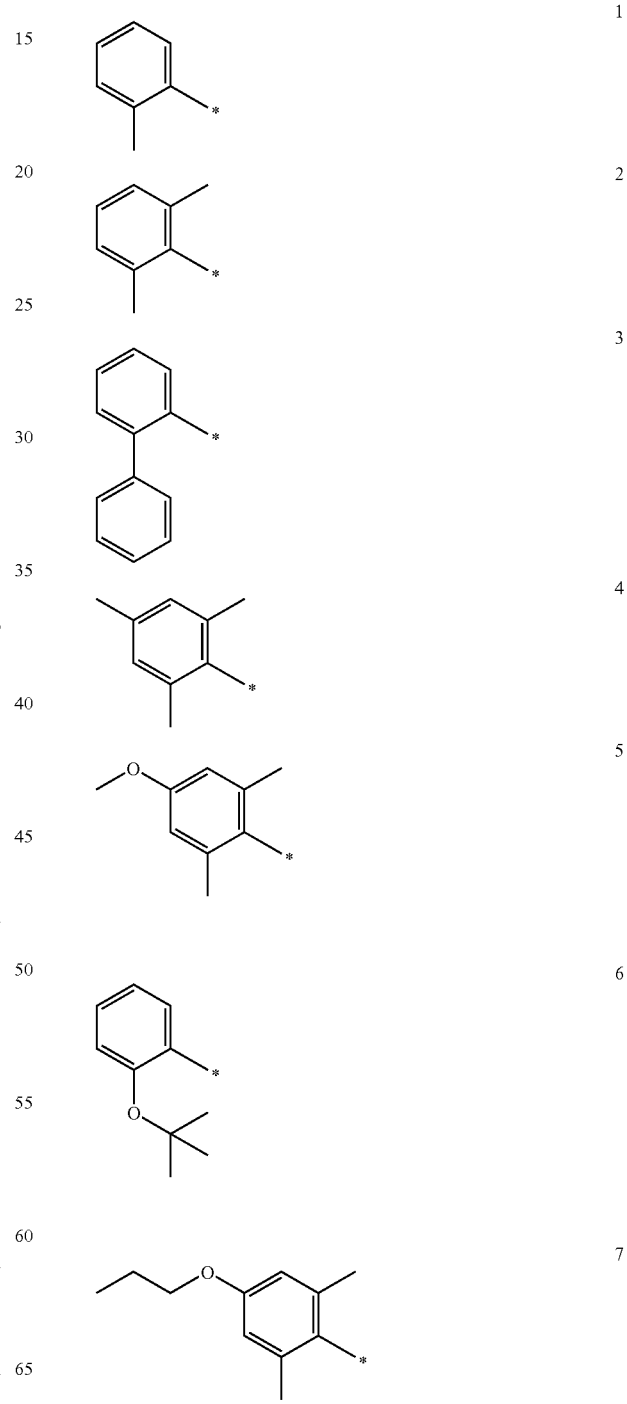

-continued
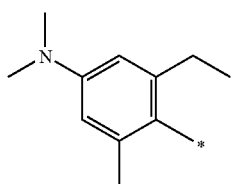
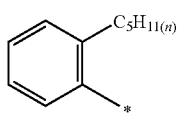
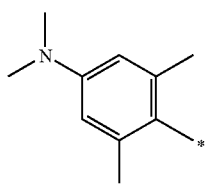
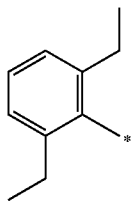
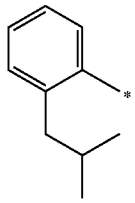
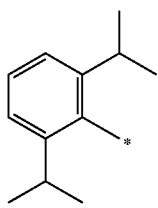
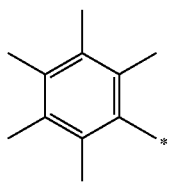
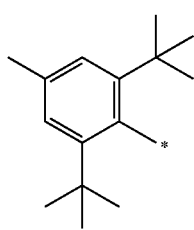
-continued
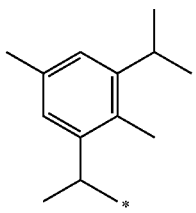
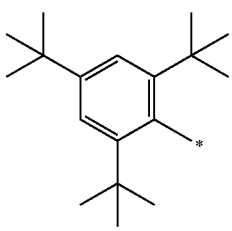
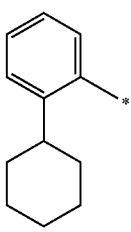
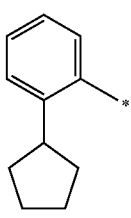
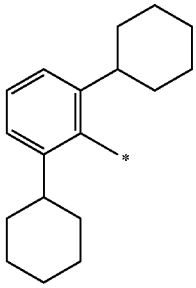
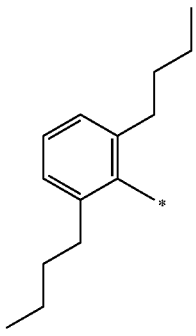

-continued
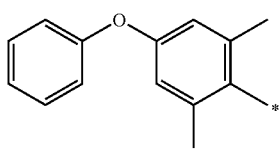
22
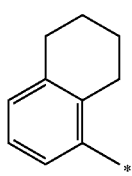
23
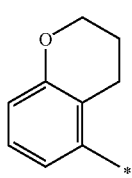
24
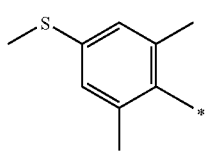
25
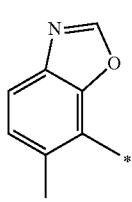
26
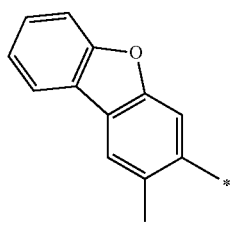
27
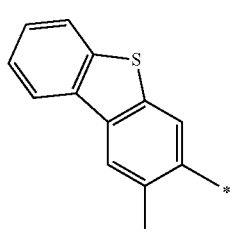
28
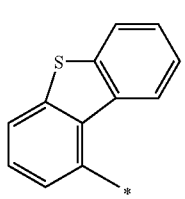
29
-continued
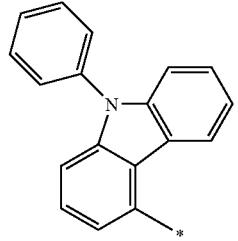
30
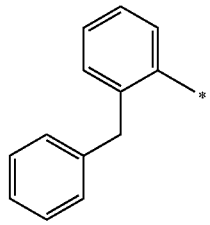
31
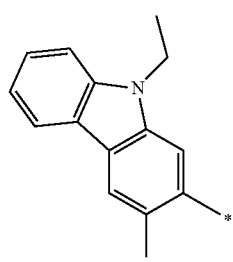
32
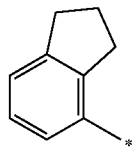
33
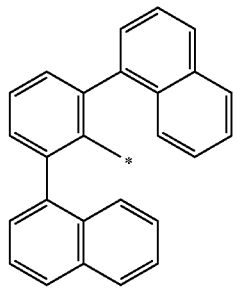
34
35

36
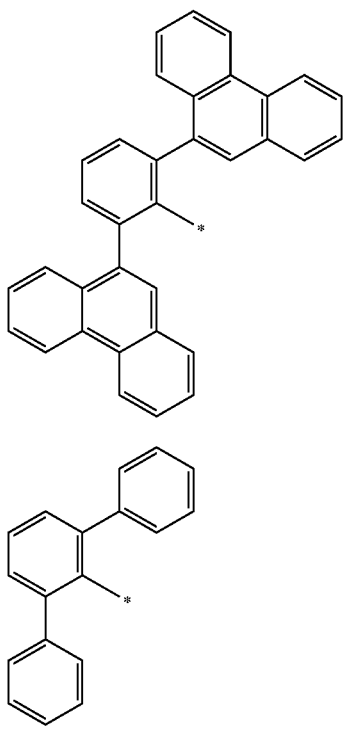
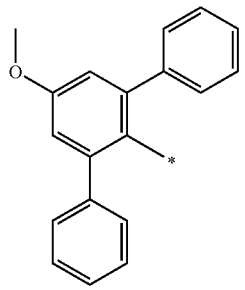
37
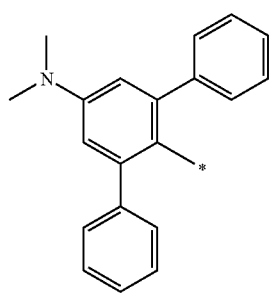
38
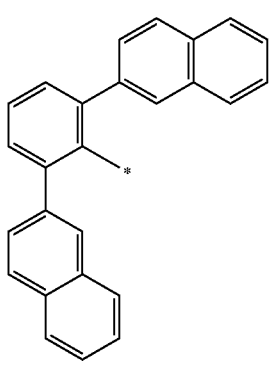
39
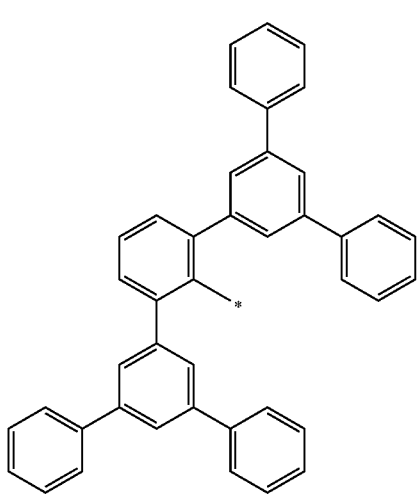
40
41
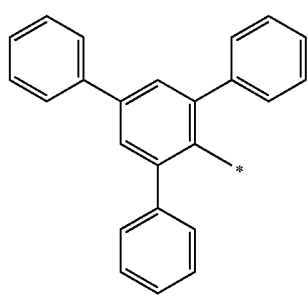
42
43
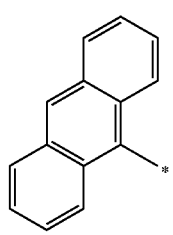
44
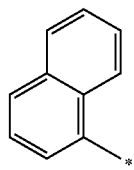

69
-continued
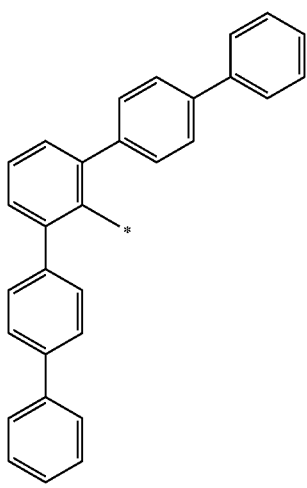
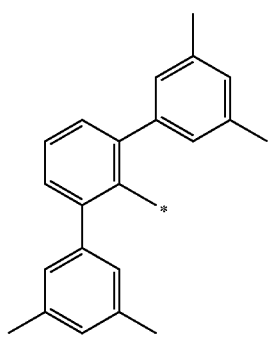
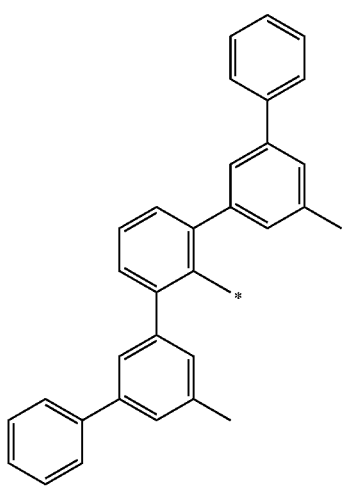
70
-continued
48
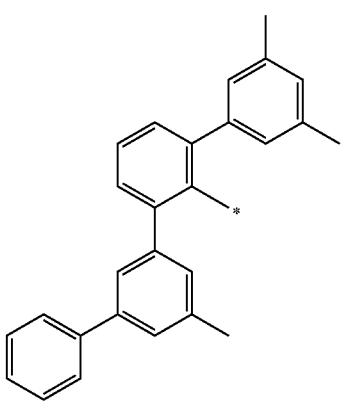
49
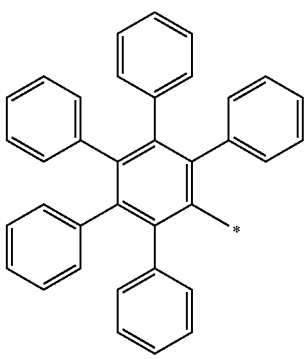
50
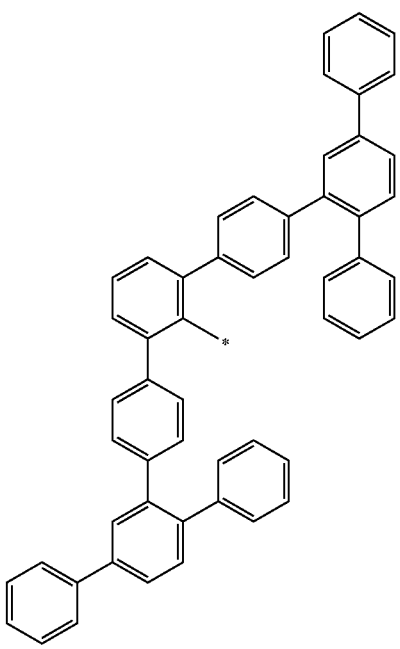

-continued
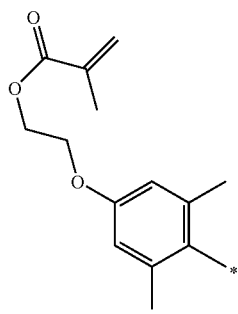
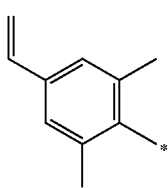
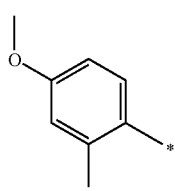
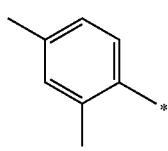
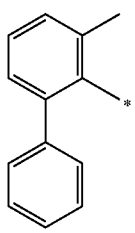
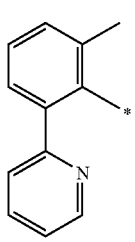
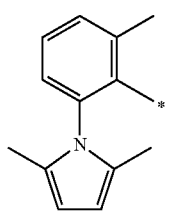
-continued
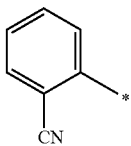
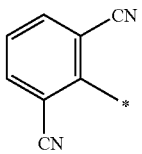
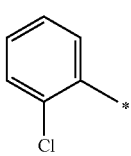
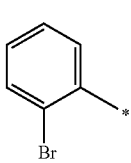
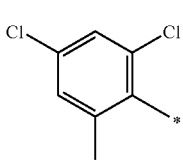
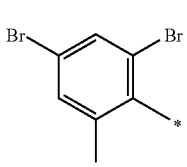
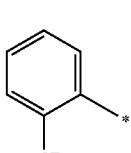
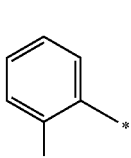
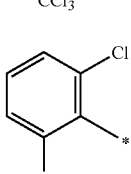
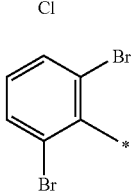

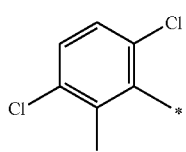
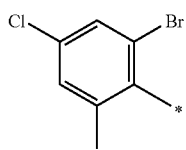
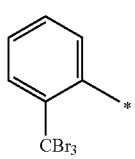
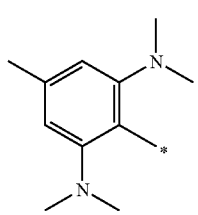
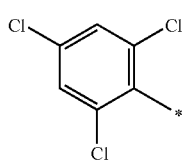
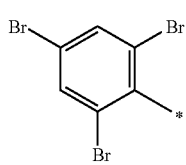
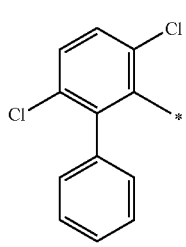
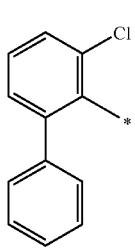
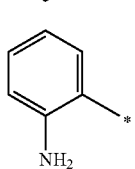
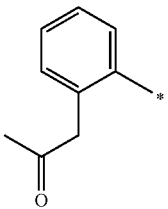
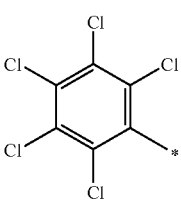
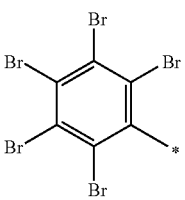
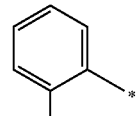
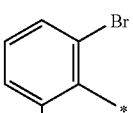
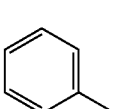
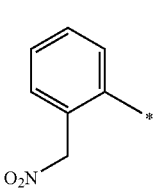
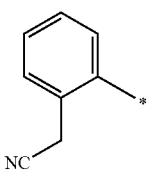

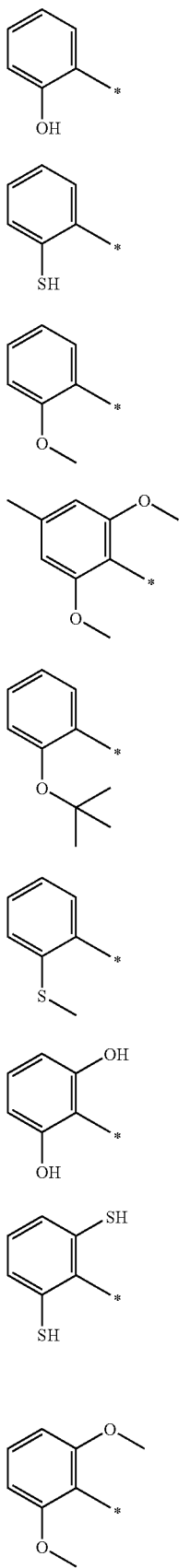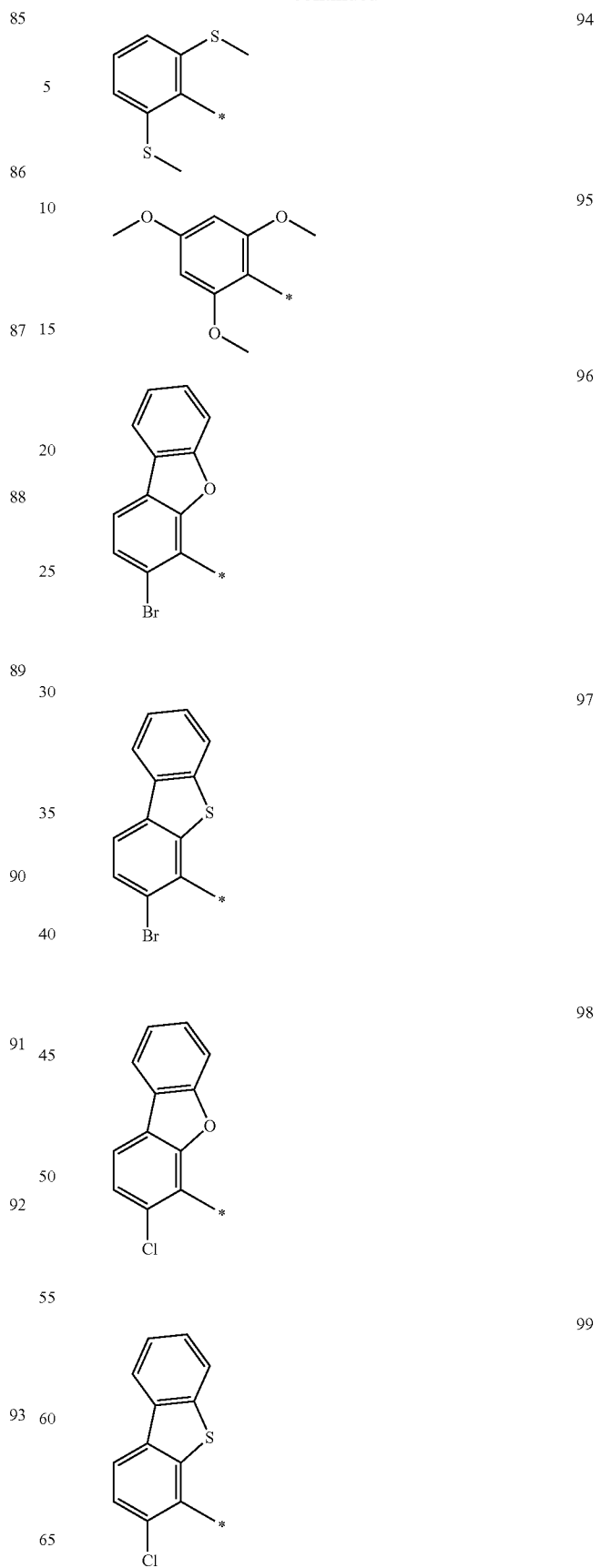

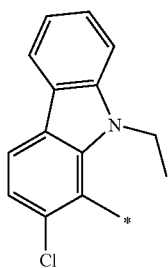
100
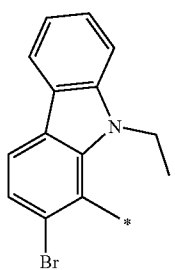
101
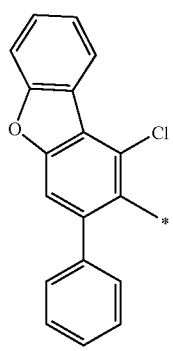
102
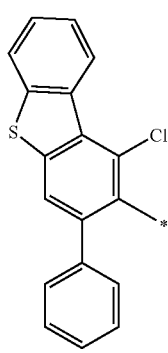
103
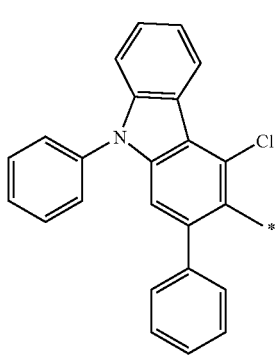
104
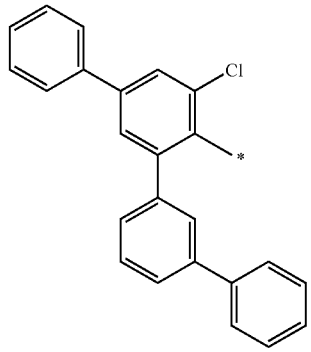
105
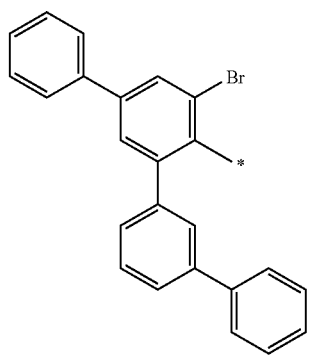
106
107
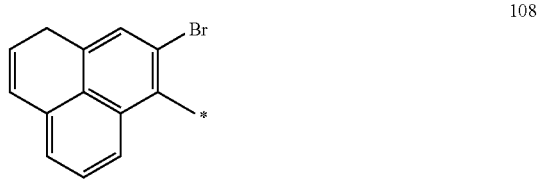
108
109
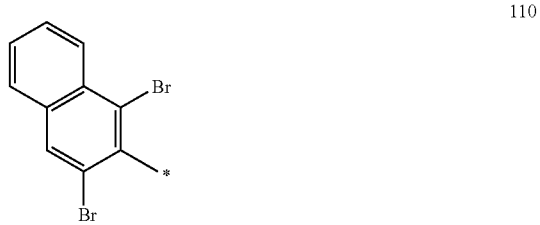
110

79
-continued
| | |
|---|---|
| 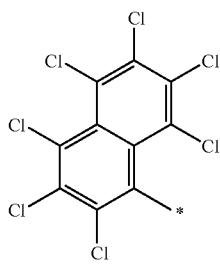 | |
| 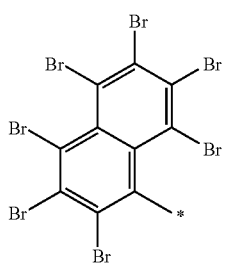 | |
| 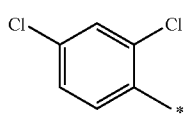 | |
| 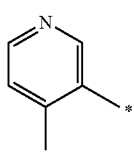 | |
| 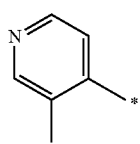 | |
| 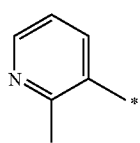 | |
| 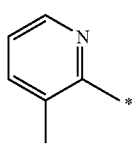 | |
| 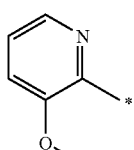 | |
| 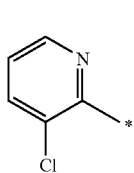 | |
80
-continued
| | |
|---|---|
| 111 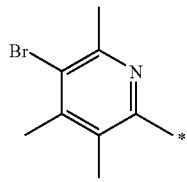 | 120 |
| 112 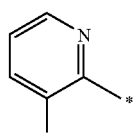 | 121 |
| 113 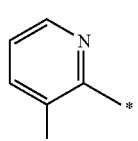 | 122 |
| 114 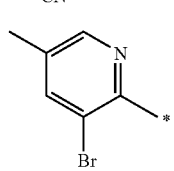 | 123 |
| 115 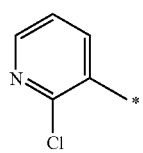 | 124 |
| 116 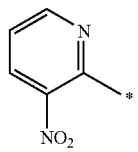 | 125 |
| 117 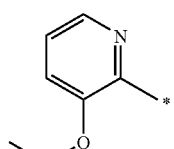 | 126 |
| 118 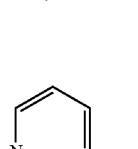 | 127 |
| 119 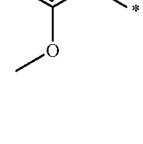 | 128 |
| | 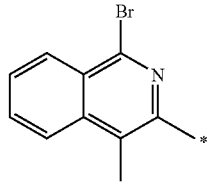 |

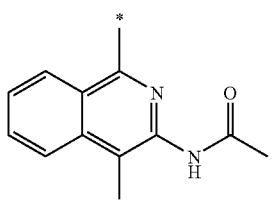
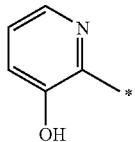
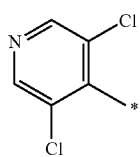
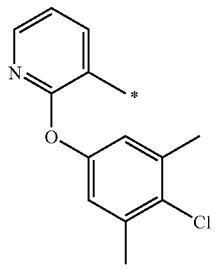
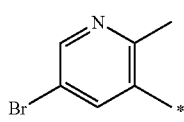
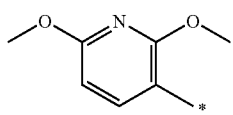
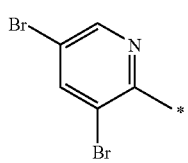
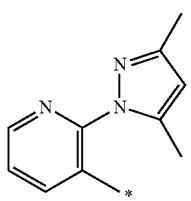
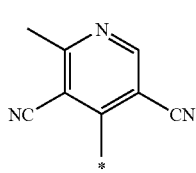
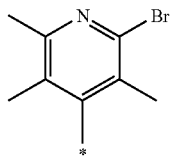
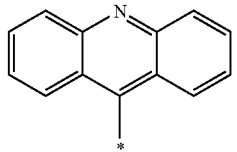
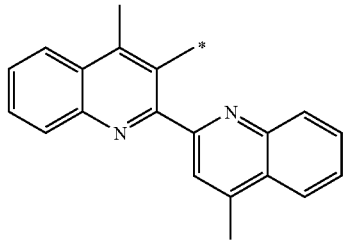
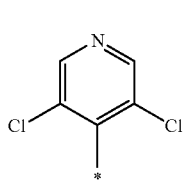
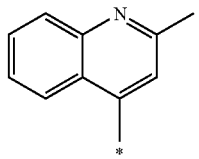
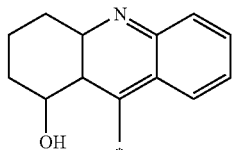
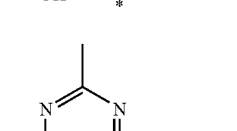
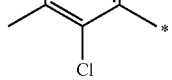
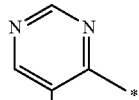
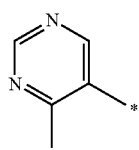

147 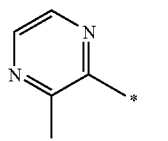
148 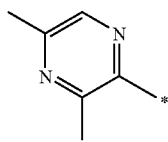
149 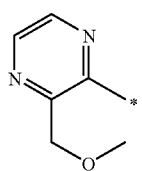
150 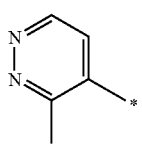
151 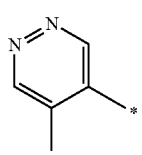
152 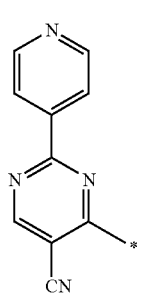
153 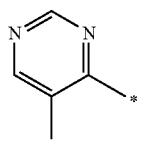
154 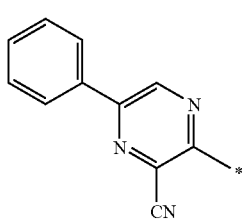
155 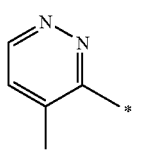
156 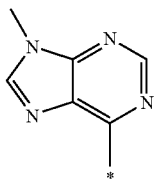
157 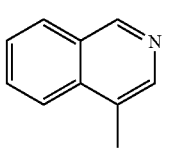
158 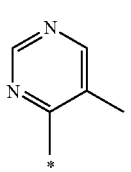
159 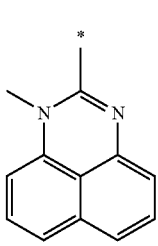
160 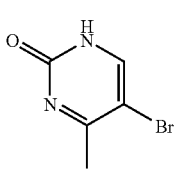
161 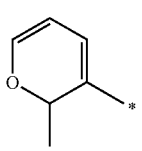
162 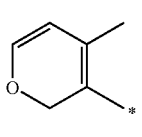
163 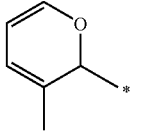
164 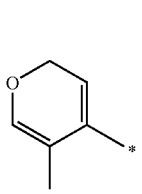

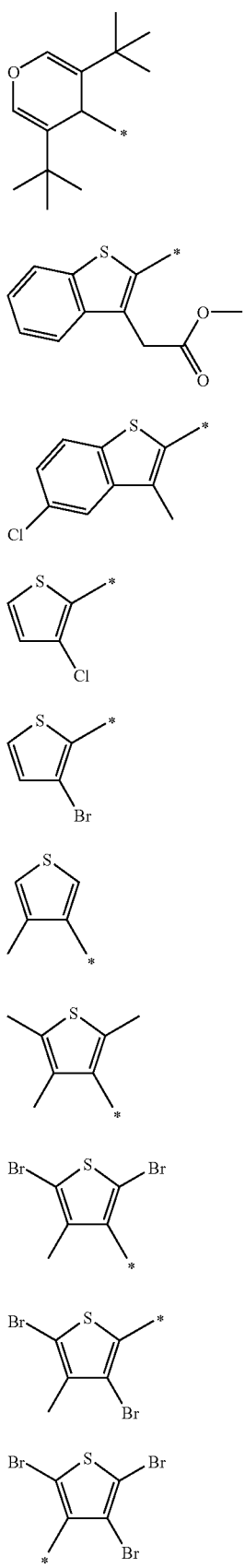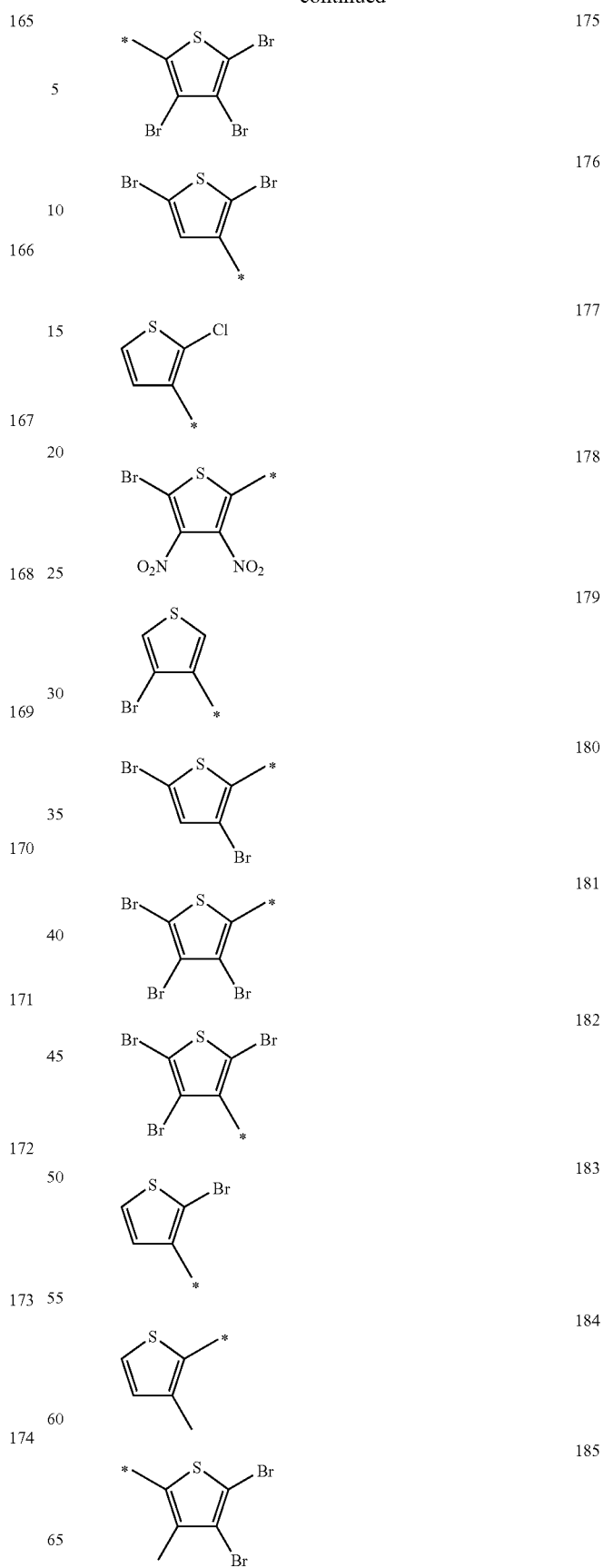

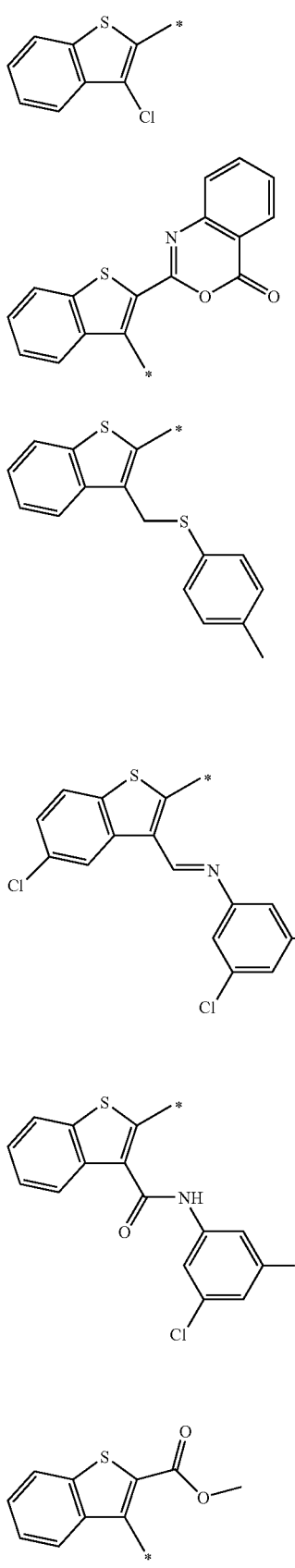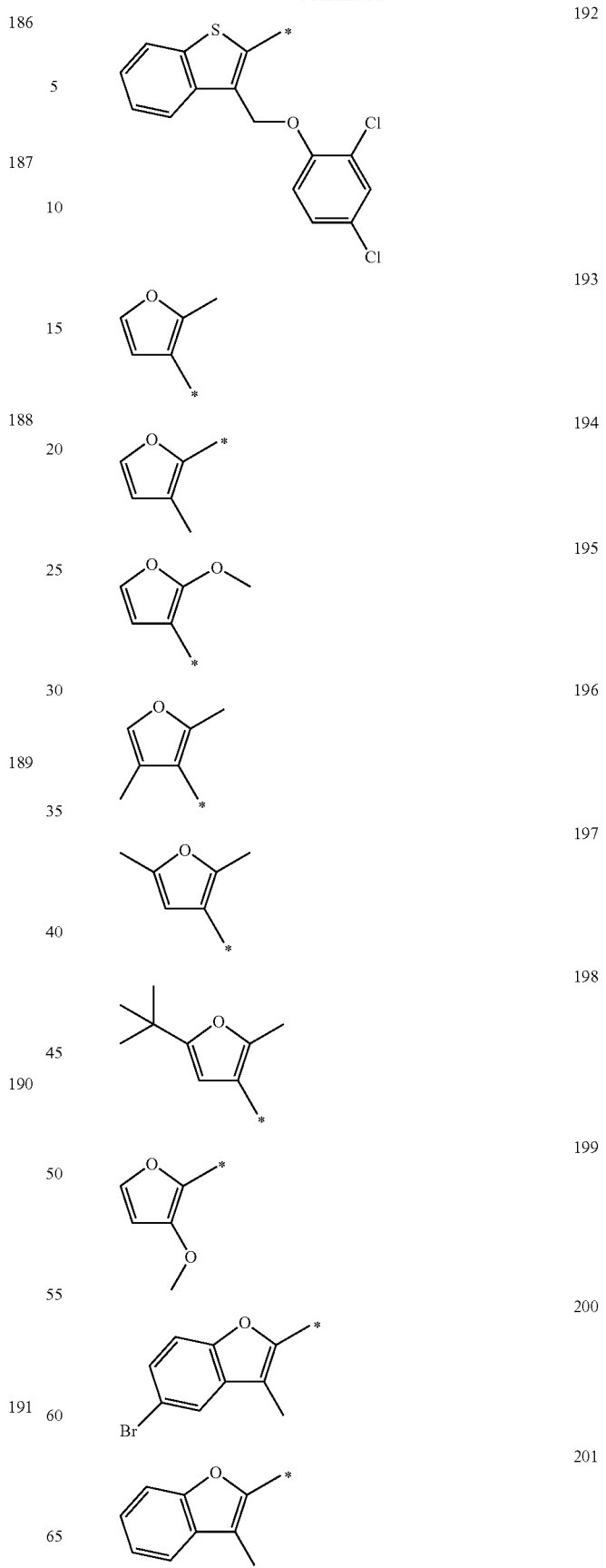

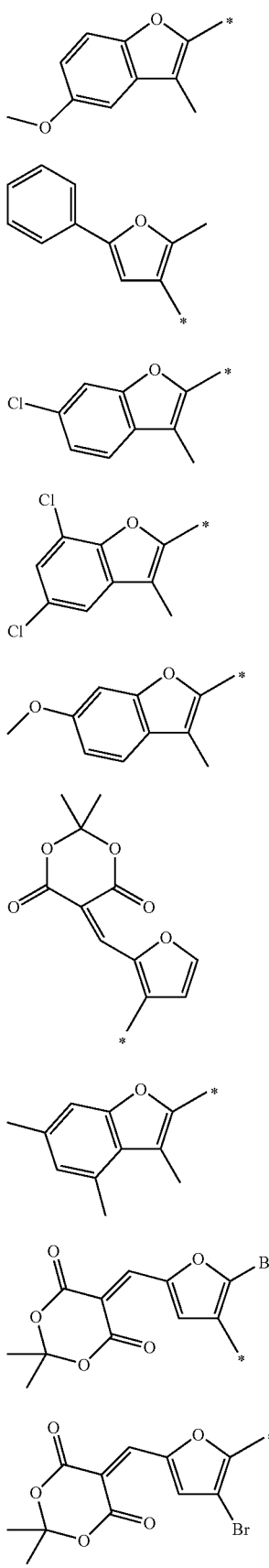

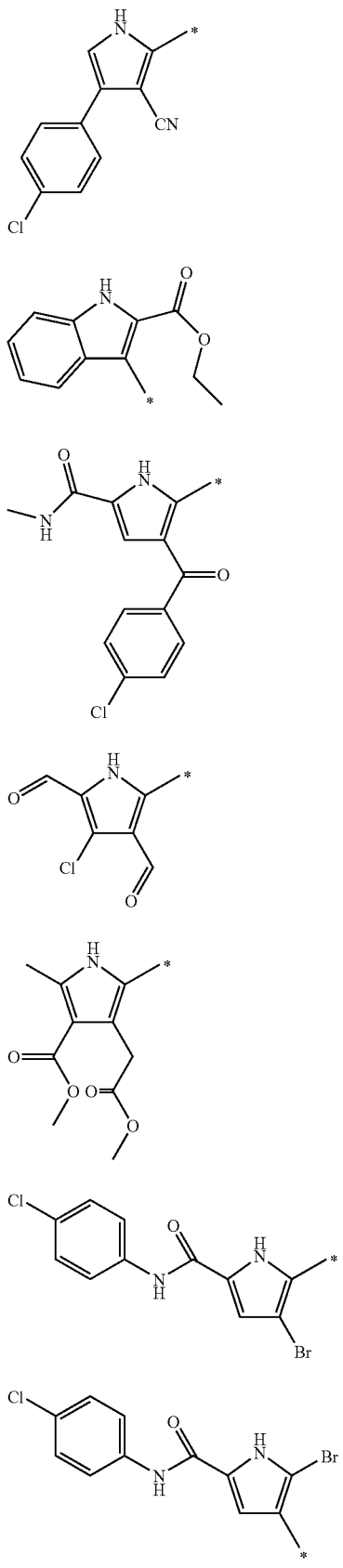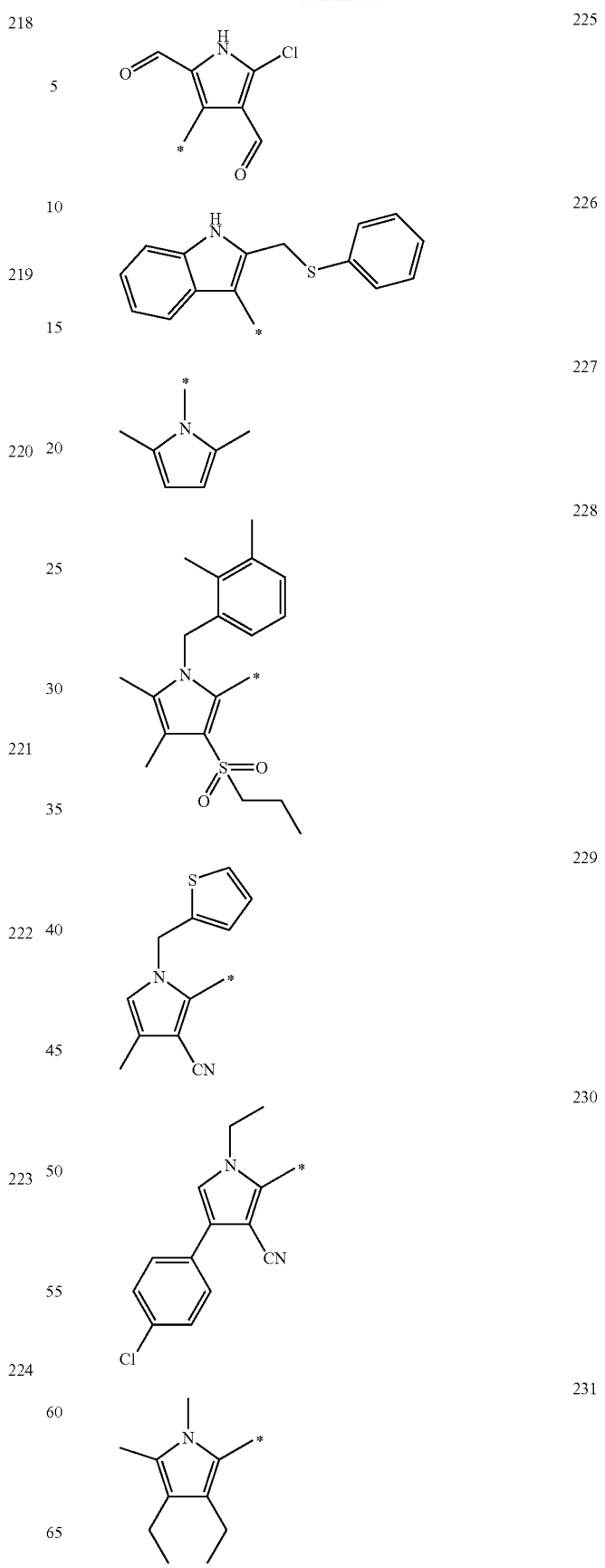

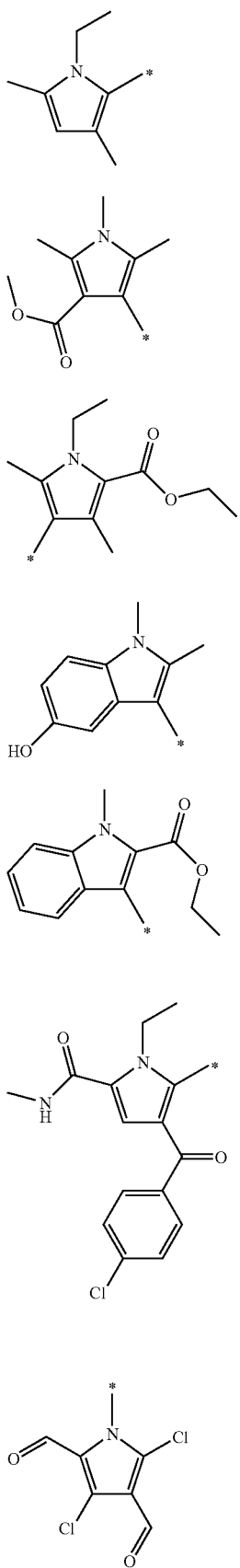
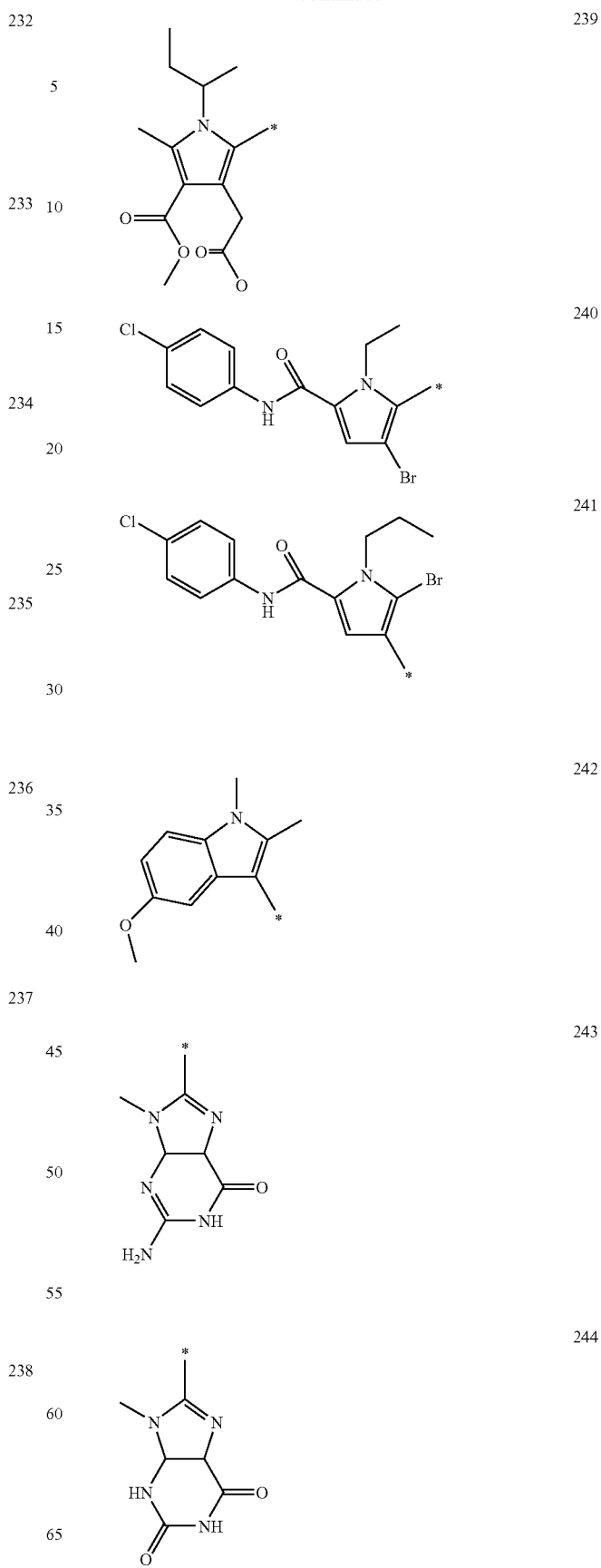

-continued
245 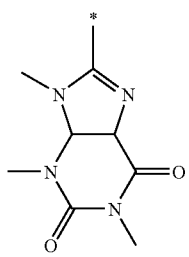
246 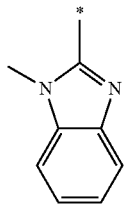
247 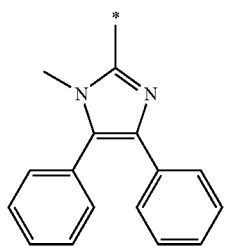
248 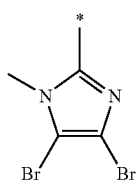
249 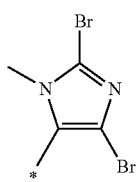
250 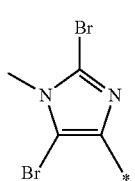
251 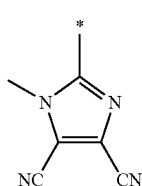
-continued
252 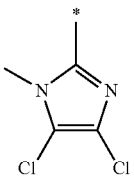
253 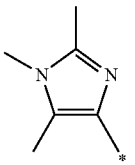
254 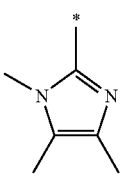
255 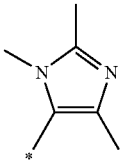
256 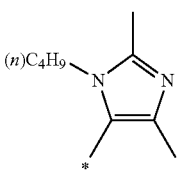
257 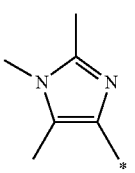
258 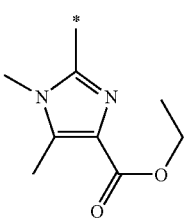
259 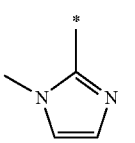
260 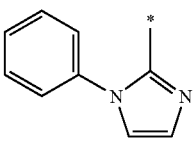

-continued
| | |
|---|---|
| 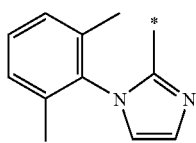 | 261 |
| 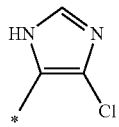 | 262 |
| 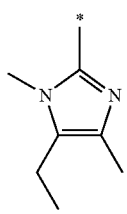 | 263 |
| 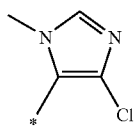 | 264 |
| 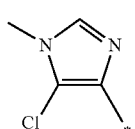 | 265 |
| 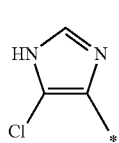 | 266 |
| 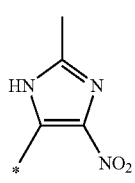 | 267 |
| 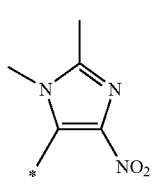 | 268 |
| 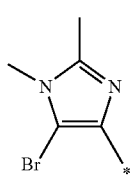 | 269 |
-continued
| | |
|---|---|
| 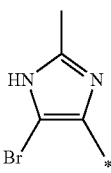 | 270 |
| 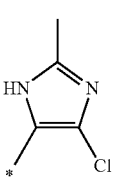 | 271 |
| 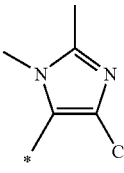 | 272 |
| 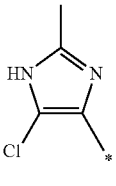 | 273 |
| 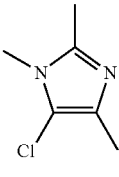 | 274 |
| 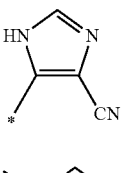 | 275 |
| 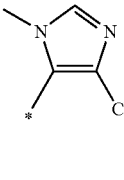 | 276 |
| 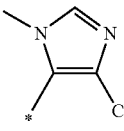 | 277 |
| 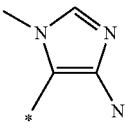 | 278 |

| | |
|---|---|
| 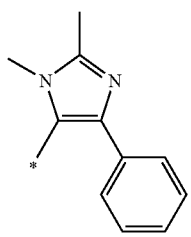 | 279 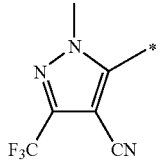 286 |
| | 280 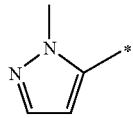 287 |
| 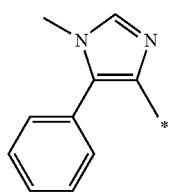 | 281 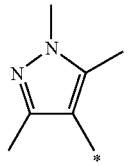 288 |
| 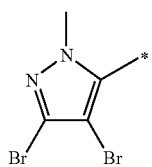 | 282 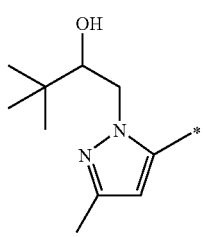 289 |
| 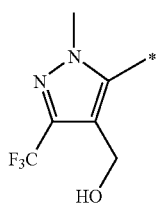 | 283 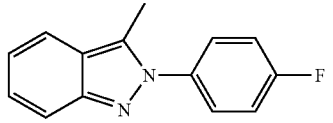 290 |
| 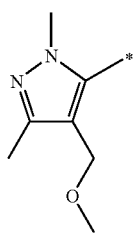 | 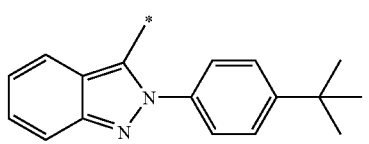 291 |
| 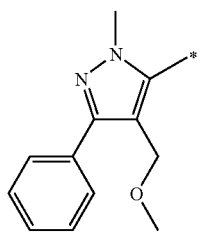 | 284 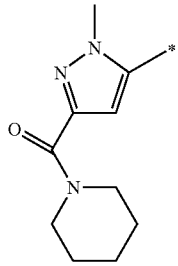 292 |
| | 285 |
| 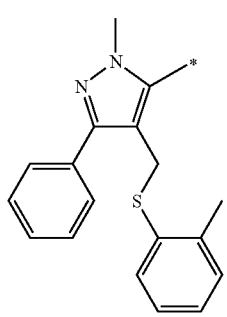 | 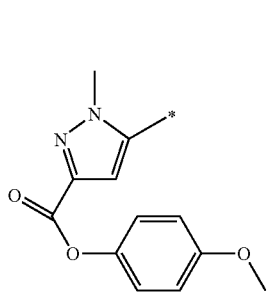 293 |

101
-continued
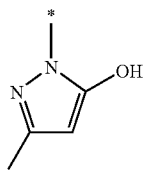
294
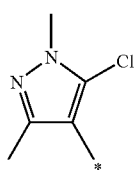
295
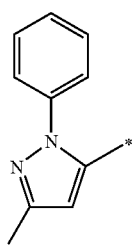
296
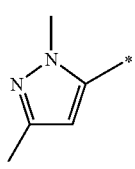
297
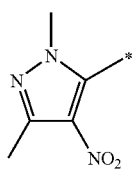
298
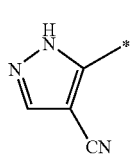
299
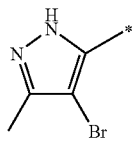
300
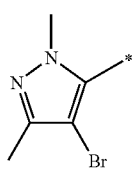
301
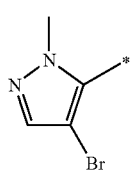
302
102
-continued
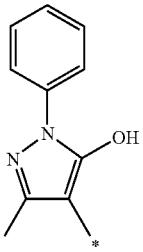
303
304
305
306
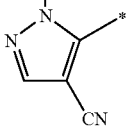
307
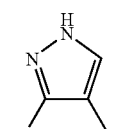
308
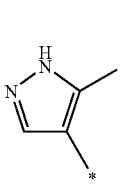
309

| | | |
|---|---|---|
| | 310 | 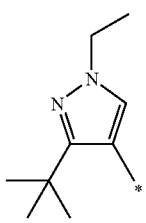 317 |
| 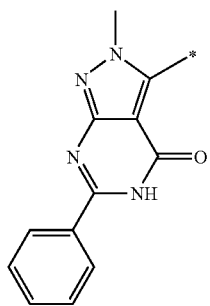 | 311 | 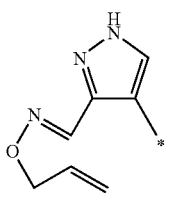 318 |
| 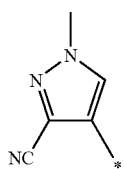 | 312 | 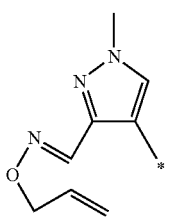 319 |
| 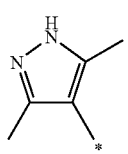 | 313 | 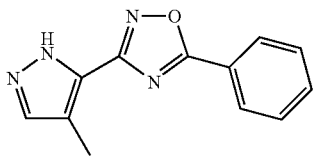 320 |
| 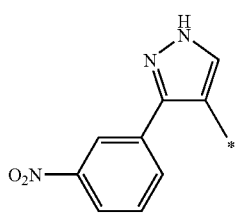 | 314 | 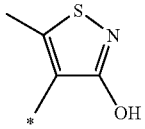 321 |
| 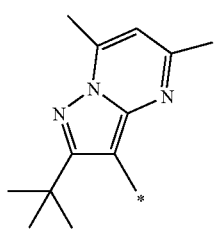 | 315 | 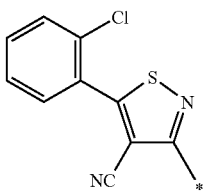 322 |
| | | 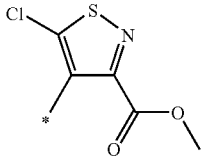 323 |
| 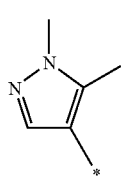 | 316 | 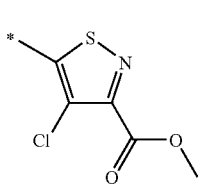 324 |

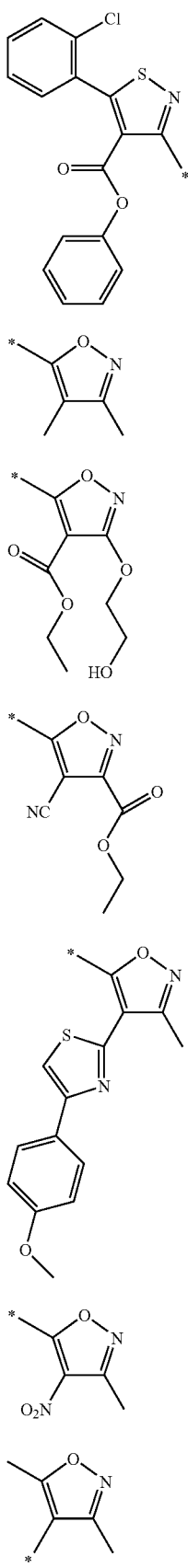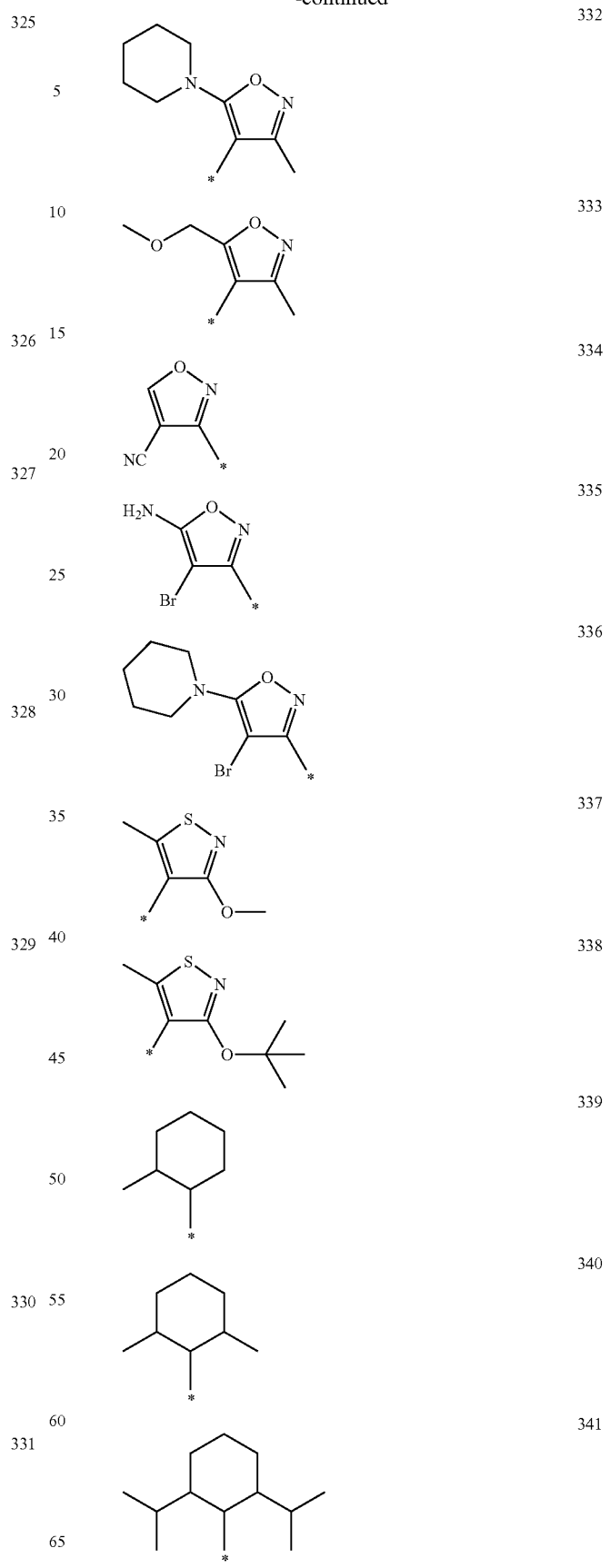

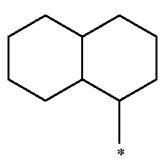
342
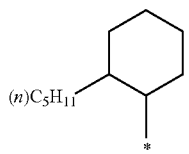
343
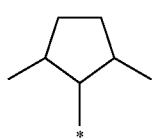
344
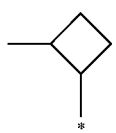
345
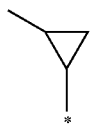
346
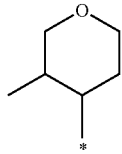
347
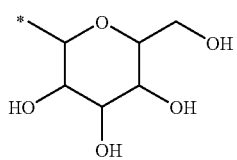
348
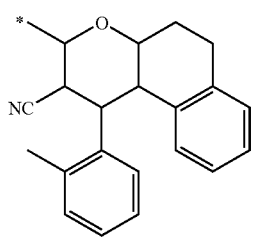
349
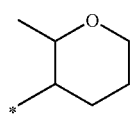
350
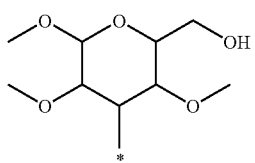
351
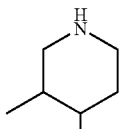
352
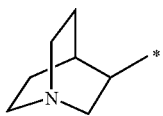
353
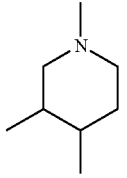
354
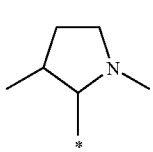
355
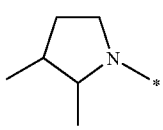
356
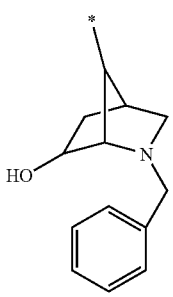
357
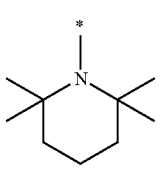
358
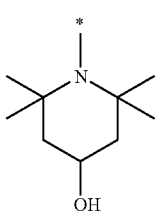
359

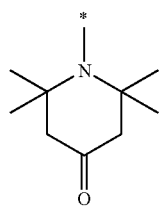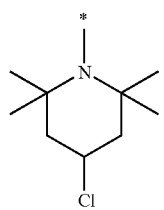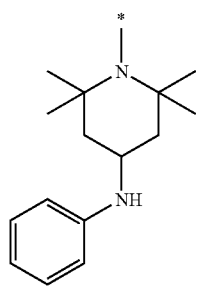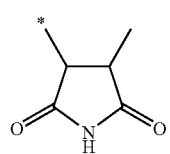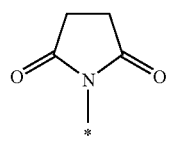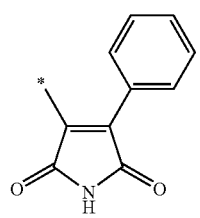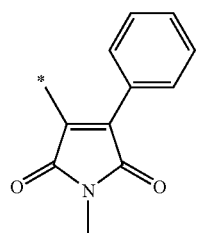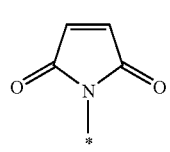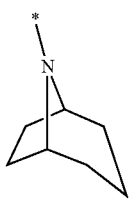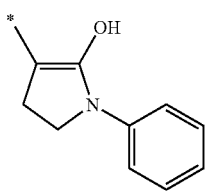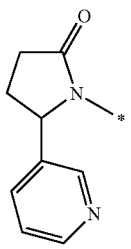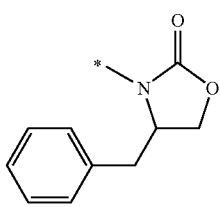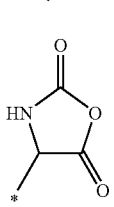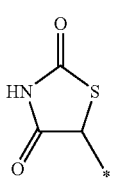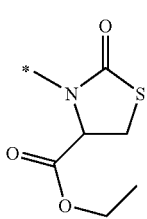

111
-continued
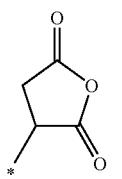
376
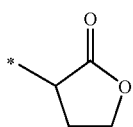
377
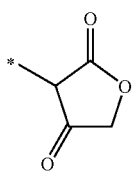
378
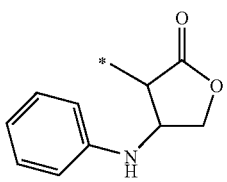
379
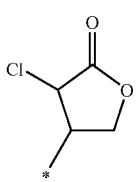
380
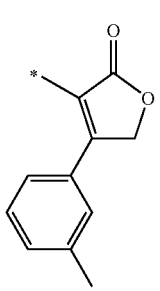
381
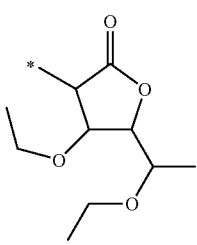
382
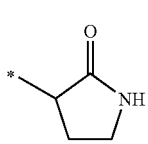
383
112
-continued
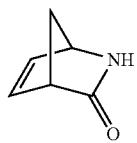
384
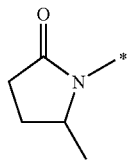
385
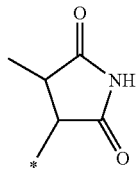
386
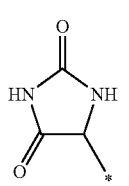
387
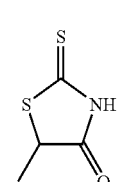
388
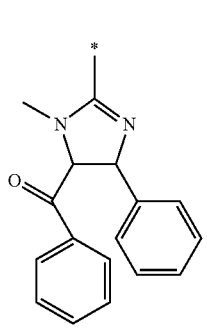
389
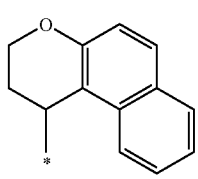
390
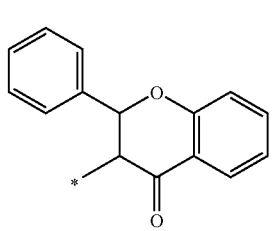
391

392

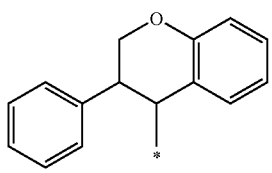

In Formula (1), Y represents a carbon atom or a nitrogen atom. Y is preferably a carbon atom. B represents —C($R_{01}$)=C($R_{02}$)—, —N=C($R_{02}$)—, —C($R_{01}$)=N— or —N=N—.

Preferable examples of nitrogen containing heterocycles containing Y are a 2-imidazolyl group, a 2-(1,3,4-triazolyl) group, a 2-(1,3,5-triazolyl) group, and a 2-tetrazolyl group. Among these, most preferred is a 2-imidazolyl group.

$R_{01}$ and $R_{02}$ each represents a hydrogen atom or a substituent. Examples of such a substituent include an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), a cycloalkyl group (for example, a cyclopentyl group and a cyclohexyl group), an alkenyl group (for example, a vinyl group and an allyl group), an alkynyl group (for example, an ethynyl group and a propargyl group), an aromatic hydrocarbon ring group (also called an aromatic carbon ring group or an aryl group such as a phenyl group, a p-chlorophenyl group, a mesityl group, a tolyl group, a xylyl group, a naphthyl group, an anthryl group, an azulenyl group, an acenaphthenyl group, fluorenyl group, a phenanthryl group, an indenyl group, a pyrenyl group, or a biphenyl group), an aromatic heterocyclic group (for example, a pyridyl group, a pyrimidinyl group, a furyl group, a pyrrolyl group, an imidazolyl group, a benzimidazolyl group, a pyrazolyl group, a piradinyl group, a triazolyl group (for example, a 1,2,4-triazole-1-yl group and a 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolynyl group, a diazacarbazoyl group (which shows that one of the carbon atoms which constitute a carboline ring of the above carbolinyl group is replaced with a nitrogen atom), a quinoxythalinyl group, a pyridazinyl group, a triazinyl group, a quinazolinyl group, a phthalazinyl group), a heterocyclic group (for example, a pyrrolidinyl group, an imidazolidyl group, a morpholyl group, and an oxazolidyl group), an alkoxy group (for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group), an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), an ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group), a sulfinyl group (for example, a methylsulfinyl group, an ethylsulfinyl group, a butylsulfinyl group, a cyclohexylsulfinyl group, a 2-ethylhexylsulfinyl group, a docecylsulfinyl group, a phenylsulfinyl group, a naphthylsulfinyl group, and a 2-pyridylsulfinyl group), an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group), an arylsulfonyl group or a heteroarylsulfonyl group (for example, a phenylsulfonyl group, a naphthylsulfonyl group, and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), a halogen atom (for example, a fluorine atom, a chlorine atom, and a bromine atom), a fluorinated hydrocarbon group (for example, a fluoromethyl group, a trifluoromethyl group, a pentafluoroethyl group, and a pentafluorophenyl group), a cyano group, a nitro group, a hydroxyl group, a mercapto group, and a silyl group (for example, a trimethylsilyl group, a triisopropylsilyl group, a triphenylsilyl group, and a phenyldiethylsilyl group). These substituents may be substituted with the above-described substituents. Further, these substituents may be bound together to form a ring.

A-C—X in Formula (1) represents a hydrocarbon ring group or a heterocycle group. X represents a carbon atom or a nitrogen atom and preferably a carbon tom.

When a hydrocarbon ring group represented by A-C—X is an aromatic hydrocarbon ring group, it is a group formed by eliminating any one hydrogen atom from an aromatic hydrocarbon compound having a (4n+2) π electron system. Examples of aromatic hydrocarbon ring groups are a phenyl group, a 1-naphthyl group, a 2-naphthyl group, a 9-anthryl group, a 1-anthryl group, a 9-phenanthryl group, a 2-triphenylenyl group, and a 3-perilenyl group. Further, the aforesaid hydrocarbon ring group may be substituted with substituents described for $R_{01}$. And, it may form a condensed ring (such as a 9-pyrenyl group derived from a 9-phenathryl group condensed with a hydrocarbon ring, a 8-quinolyl group derived from a phenyl group condensed with a heterocycle).

When a hydrocarbon ring group represented by A-C—X is an aromatic heterocyclic group, the aromatic heterocyclic group is required to have at least one carbon atom at a position which bonds to a nitrogen containing hetero aromatic ring, and to have a (4n+2) π electron system. More preferably, the aromatic heterocyclic group has two carbon atoms each which bonds to a nitrogen containing hetero aromatic ring. Examples of such groups are a 3-pyridyl group, a 5-pyrimydyl group, a 4-pyridazyl group, a 5-pyridazyl group, a 4-isooxazolyl group, a 4-isothiazolyl group, a 4-pyrazolyl group, a 3-pyrrolo group, a 3-furyl group, and a 3-thienyl group. Further, the aforesaid aromatic heterocyclic ring group may be substituted with substituents described for $R_{01}$. And, it may form a condensed ring.

In Formula (1), $X_1$-L1-$X_2$ represents a bidendate ligand. $X_1$ and $X_2$ are each independently a carbon atom, a nitrogen atom or an oxygen atom. L1 is a group of atoms which forms a bidendate ligand in combination with $X_1$ and $X_2$. Examples of bidendate ligands represented by $X_1$-L1-$X_2$ are phenyl pyridine, phenylpyrazole, phenylimidazole, phenyltriazole, phenyltetrazole, pyrazabole, acetylacetone, and picoline. They may be substituted with a substituent. m1 is an integer of 1, 2 or 3, m2 is an integer of 0, 1 or 2 and m1+m2 is 2 or 3. m2 is preferably 0.

In Formula (1), the center metal $M_1$ represents an atom of 8-10 groups in the periodical table. Preferably $M_1$ represents iridium or platinum.

The followings are examples of phosphorescent-emitting dopants of the present invention. However, the present invention is not limited by them.

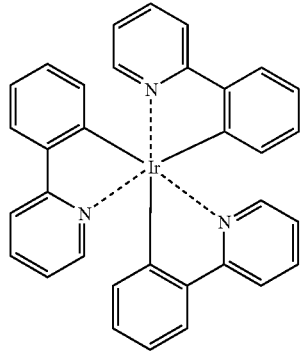

Ir-1

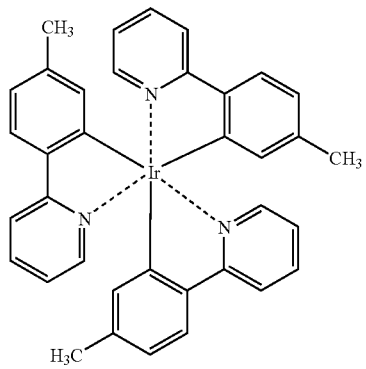

Ir-2

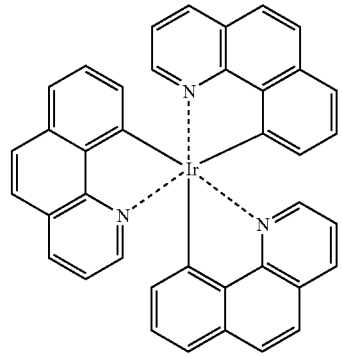

Ir-3

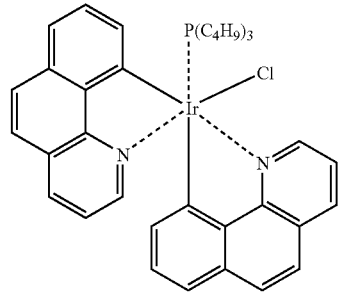

Ir-4

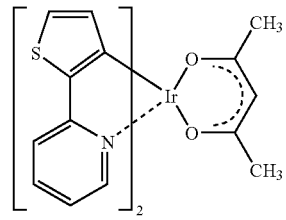

Ir-5

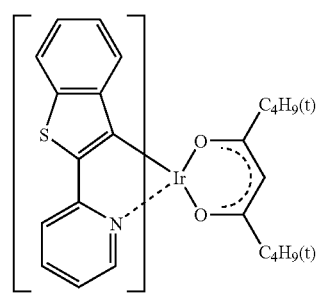

Ir-6

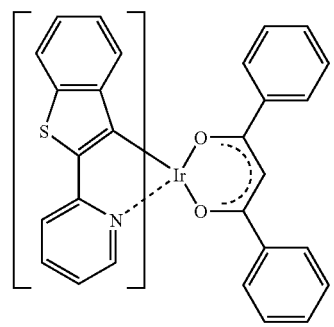

Ir-7

-continued

Pt-3
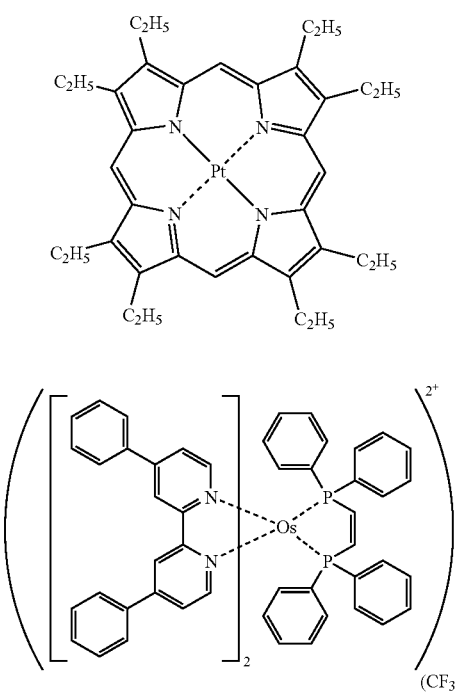
A-1
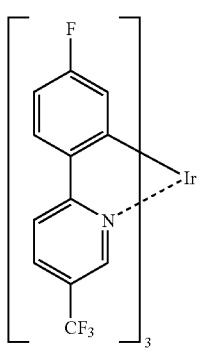
(CF₃CF₂CF₂COO⁻)₂
D-1
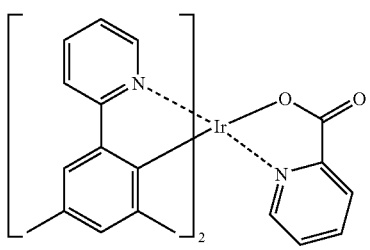
D-2
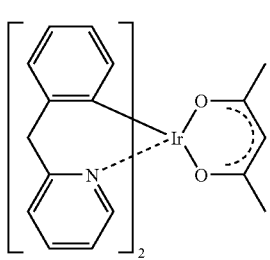
D-3
D-4
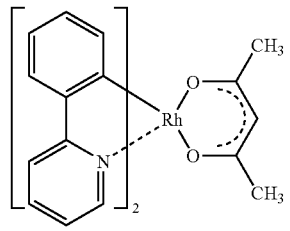
D-5
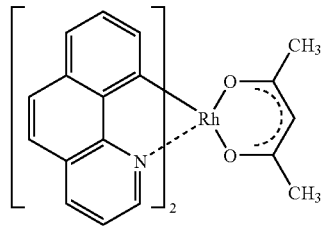
D-6
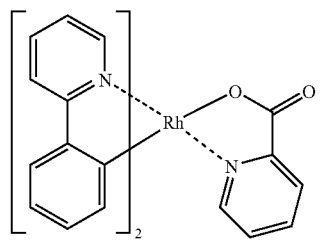
Pd-1
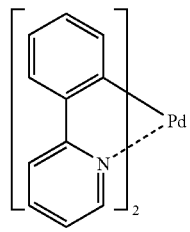
Pd-2
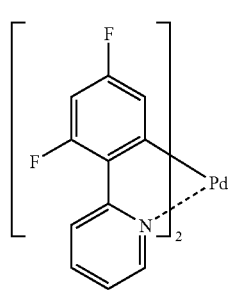
Pd-3
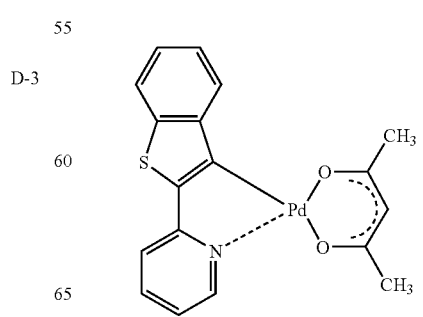

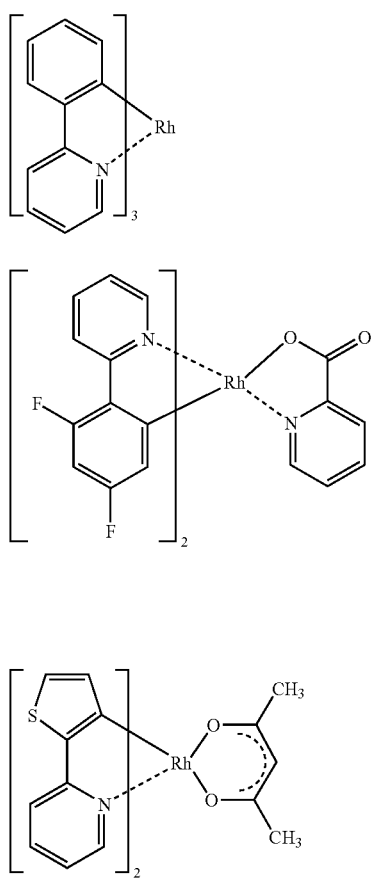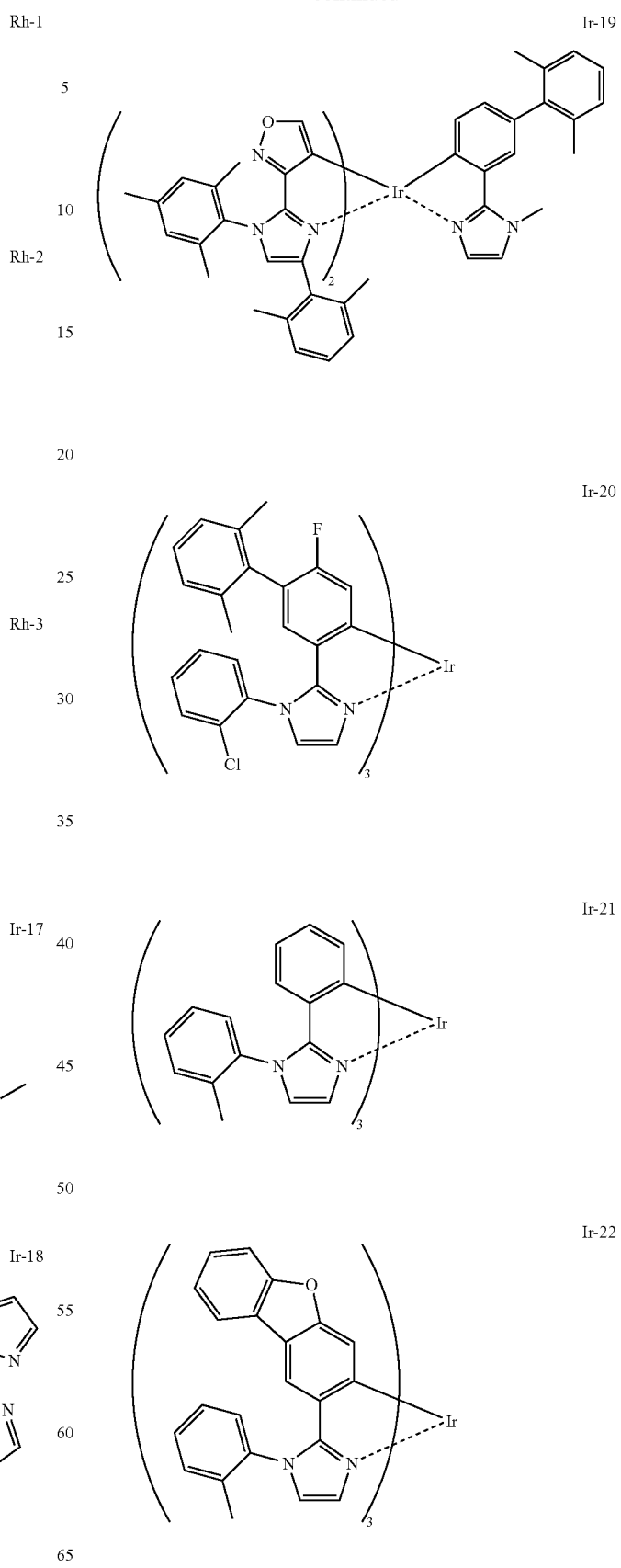

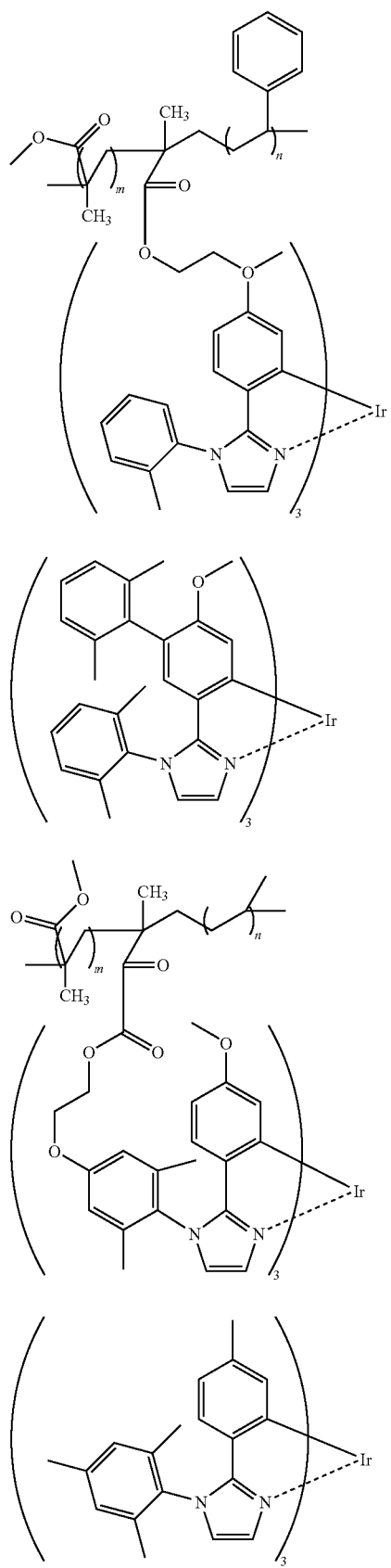
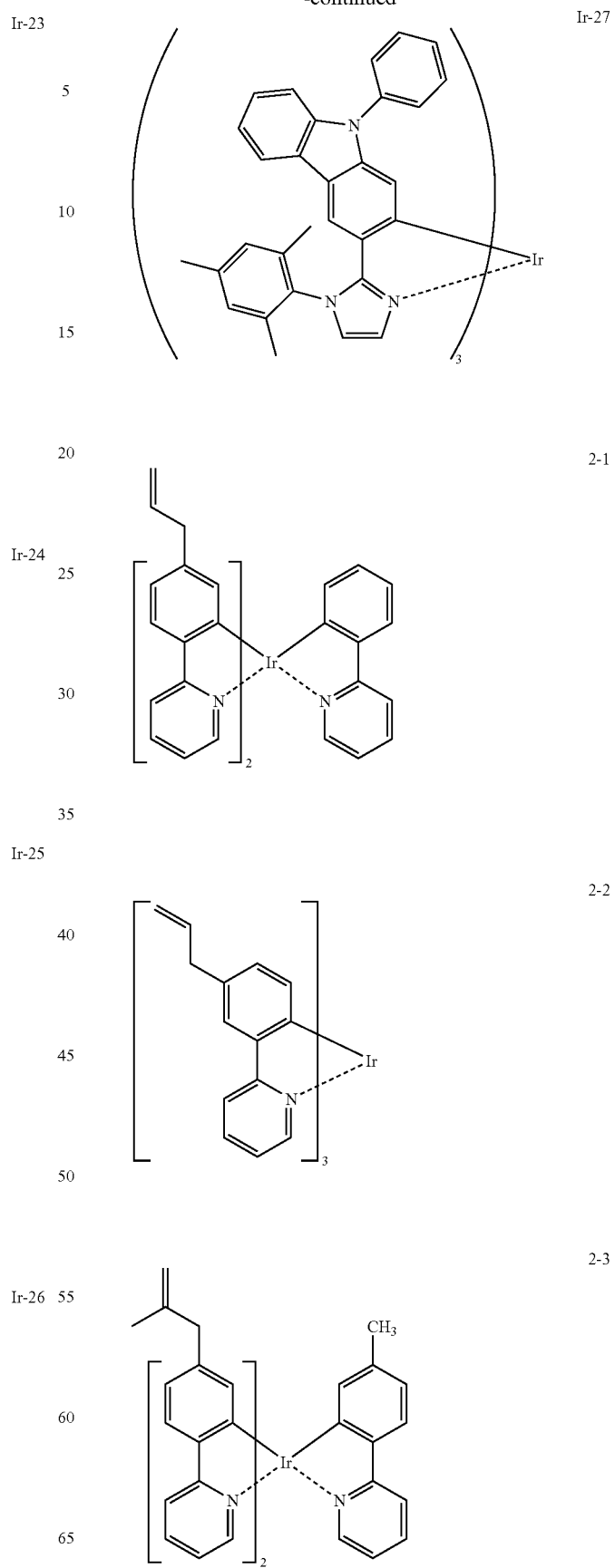

2-4
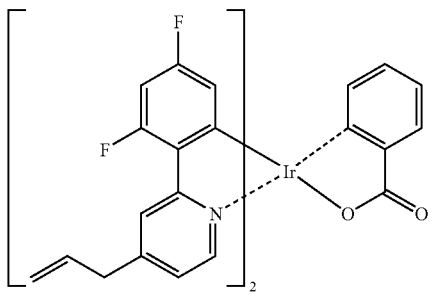
2-5
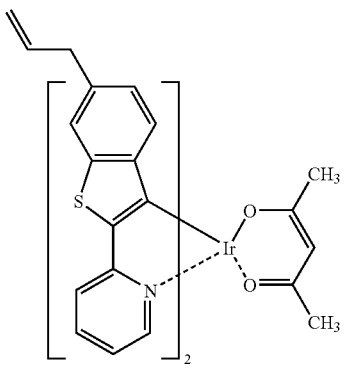
2-6
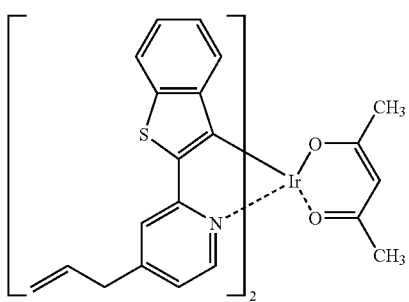
2-7
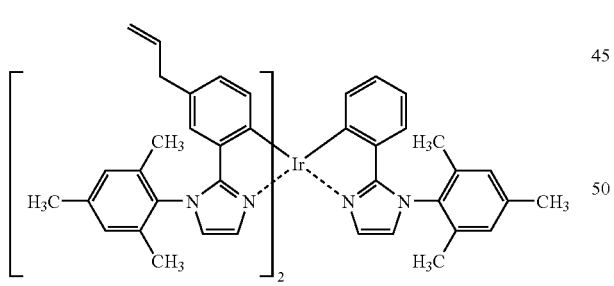
2-8
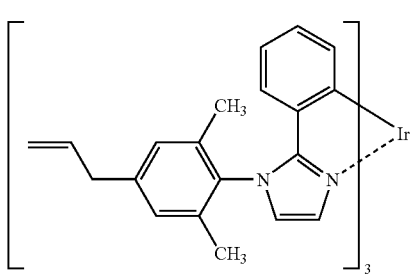
2-9
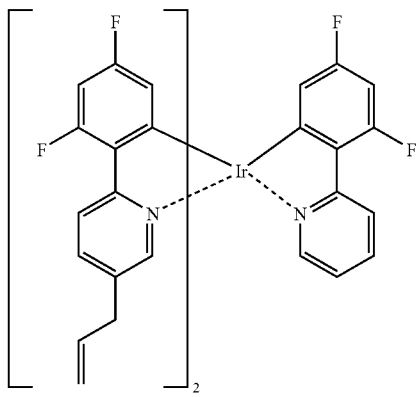
2-10
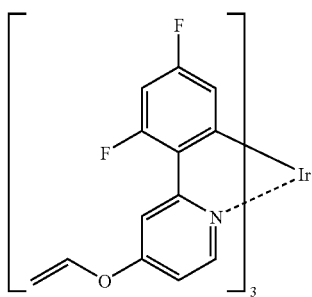
2-11
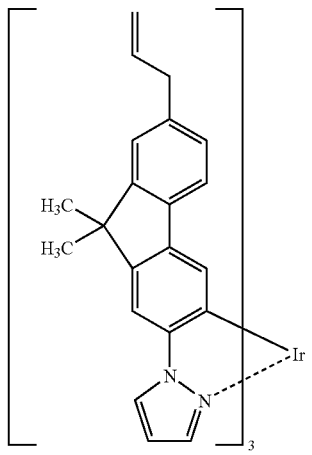
2-12
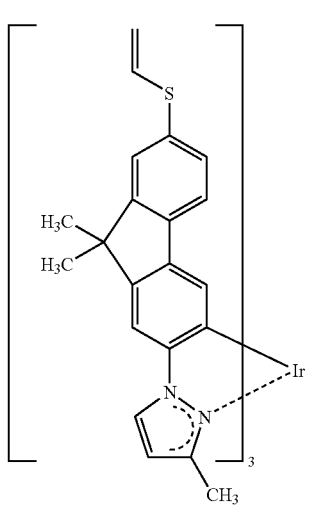

2-13

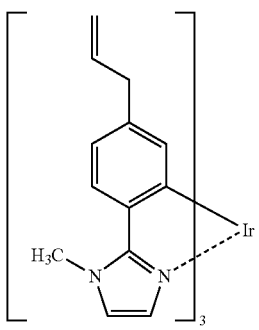

2-14

2-15

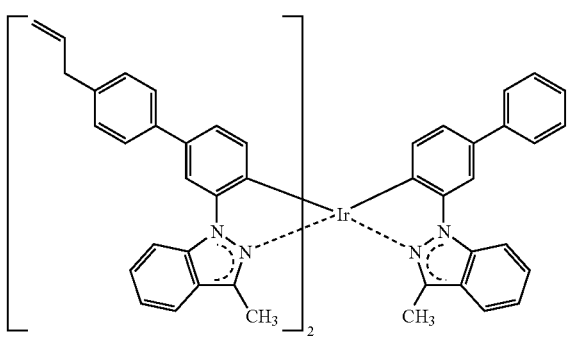

2-16

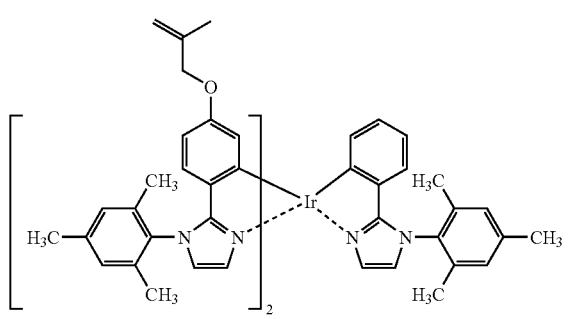

(Fluorescence-emitting Dopant (or Called as Fluorescence-emitting Compound))

Examples of a fluorescence-emitting dopant (fluorescence-emitting compound) include a coumarin dyer a pyran dye, a cyanine dye, a croconium dye, a squalium dye, an oxobenzanthracene dye, a fluorescein dye, a rhodamine dye, a pyrylium dye, a perylene dye, a stilbene dye, and a polythiophene dye, and a rare earth metal complex fluorescence compound.

Next, an injection layer, an inhibition layer and an electron transport layer used as constitution layers of an organic EL element of the present invention will be described.

[Injection Layer: Electron Injection Layer, Positive Hole Injection Layer]

An injection layer is appropriately provided and includes an electron injection layer and a positive hole injection layer, which may be arranged between an anode and an emission layer or a positive transfer layer, and between a cathode and an emission layer or an electron transfer layer, as described above.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a positive hole injection layer (an anode buffer layer) and an electron injection layer (a cathode buffer layer).

An anode buffer layer (a positive hole injection layer) is also detailed in such as JP-A 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polythiophene.

A cathode buffer layer (an electron injection layer) is also detailed in such as JP-A 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide. The above-described buffer layer (injection layer) is preferably a very thin layer, and the layer thickness is preferably in a range of 0.1 nm-5 μm although it depends on a raw material.

[Inhibition Layer: Positive Hole Inhibition Layer, Electron Inhibition Layer]

An inhibition layer is provided if needed in addition to the basic constitution layer structures in the organic thin layers of the present invention. Examples of such an inhibition layer are positive hole inhibition layers (hole block layers) described in JP-A Nos. 11-204258 and 11-204359 and p. 273 of "organic EL Elements and Industrialization Front Thereof (Nov. 30 (1998), published by N. T. S Corp.)".

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron. Further, a constitution of an electron transport layer described later can be appropriately utilized as a positive hole inhibition layer according to this invention.

The positive hole inhibition layer in the organic EL element of the present invention is preferably provided adjacent to the emission layer.

The positive hole inhibition layer preferably incorporates an azacarbazole derivative for a host compound as described above.

In the present invention, when the organic EL element has a plurality of emission layers each emitting a different emission color, it is preferable that an emission layer emitting a light of a shortest wavelength is provided at the nearest position to the anode among all of the emission layers. In such case, it is preferable that a positive hole inhibition layer is further provided between the aforementioned emission layer of the shortest wavelength and the emission layer secondary nearest to the anode. Further, it is preferable that not less than 50 weight % of a compound contained in the positive hole inhibition layer exhibits a ionization potential at least 0.3 eV larger than that of a host compound in aforementioned emission layer of the shortest wavelength.

An ionization potential is defined as a required energy to emit an electron stayed on a HOMO (highest occupied molecular orbital) of a compound to a vacuum level. The ionization potential can be obtained using the following methods, for example. (1) Gaussian 98 (Gaussian 98, Revision A. 11. 4, M. J. Frisch, et al, Gaussian, Inc., Pittsburgh Pa., 2002), which is software for a molecular orbital calculation, and produced by Gaussian Inc. The ionization potential value of the compound of the present invention can be calculated via structure optimization employing B3LYP/6-31G* as a key word and converted in eV unit after rounded off to one decimal place. The reason for the calculated value being considered to be valid is that the calculated value obtained by the above method is in good agreement with the experimental one.

(2) An ionization potential can be directly obtained by measuring with a photoelectron spectroscopy. Such measurement can be appropriately done using, for example, a low energy photoelectron spectroscopy "Model Ac-1" made by Riken Keiki Co., Ltd or a ultra-violet photoelectron spectroscopy.

Meanwhile, an electron inhibition layer has a function of a positive hole transport layer in a broad sense. An electron inhibition layer is composed a material having a property to transport a positive hole and, at the same time, having a very weak property to transport an electron. It is possible to improve the recombination rate of an electron and a positive hole by transporting a positive hole and inhibiting an electron from transporting. A structure of a positive hole transport layer can be used for an electron inhibition layer. The layer thickness of the positive hole inhibition layer and the electron transport layer according to the present invention is preferably from 3 nm to 100 nm, and is more preferably from 5 nm to 30 nm.

[Positive Hole Transport Layer]

A positive hole transport layer contains a material having a function of transporting a positive hole, and in a broad meaning, a positive hole injection layer and an electron inhibition layer are also included in a positive hole transport layer. A single layer of or plural layers of a positive hole transport layer may be provided.

A positive hole transport material is those having any one of a property to inject or transport a positive hole or a barrier property to an electron, and may be either an organic substance or an inorganic substance. For example, listed are a triazole derivative, an oxadiazole derivative, an imidazole derivative, a polyallylalkane derivative, a pyrazolone derivative, a phenylenediamine derivative, a allylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a positive hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quarterphenyl; N,N,N-tri (p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4',4"-tris[N-(3-methylphenyl)-N-phenylamino]triphenylamine (MDTDATA), in which three of triphenylamine units are bonded in a star burst form, described in JP-A 4-308688.

Polymer materials, in which these materials are introduced in a polymer chain or constitute the main chain of polymer, can be also utilized. Further, an inorganic compound such as a p type-Si and a p type-SiC can be utilized as a positive hole injection material and a positive hole transport material.

It can be used a so-called p type positive hole transport material described in JP-A 11-251067 and J. Huang et al., Applied Physics Letters 80 (2002), p. 139. It is preferable to use these compounds in the present invention because they enable to give an emission element with a high emitting efficiency.

This positive hole transport layer can be prepared by forming a thin layer made of the above-described positive hole transport material according to a method well known in the art such as a vacuum evaporation method, a spin coating method, a cast method, an inkjet method and a LB method. The layer thickness of a positive hole transport layer is not specifically limited, however, is generally 5 nm-5 µm, and preferably 5 nm-200 nm. This positive hole transport layer may have a single layer structure composed of one or not less than two types of the above described materials.

Further, an impurity-doped positive hole transport layer exhibiting high p-characteristics may be used. Examples thereof include those described in JP-A Nos. 4-297076, 2000-196140, and 2001-102175, as well as J. Appl. Phys., 95, 5773 (2004).

In the present invention, such a positive hole transport layer exhibiting high p-characteristics is preferably used to produce a low-power-consuming element.

[Electron Transport Layer]

An electron transfer layer is comprised of a material having a function to transfer an electron, and an electron injection layer and a positive hole inhibition layer are included in an electron transfer layer in a broad meaning. A single layer or plural layers of an electron transfer layer may be provided.

In the past, when a mono or plural electron transport layers are arranged in the position nearer to the cathode with respect to an emission layer, an electron transfer material (also used as a positive hole inhibition material) in an electron transport layer is required to have a function to transport an electron injected from a cathode to an emission layer. The compounds conventionally well known in the art can be utilized by arbitrarily selection as a material thereof.

Examples of a material utilized in this electron transfer layer (hereinafter, referred to as an electron transfer material) include such as a nitro-substituted fluorene derivative, a diphenylquinone derivative, a thiopyradineoxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative.

Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material.

Further, metal-free or metal phthalocyanine, or those the terminal of which is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a positive hole injection layer and a positive hole transfer layer, an inorganic semiconductor such as an n-type-Si and an n-type SiC can be also utilized as an electron transfer material.

The electron transport layer can be prepared by forming a thin layer made of the above-described electron transport material according to a method well known in the art such as a vacuum evaporation method, a spin coating method, a cast method, a printing method such as an inkjet method, and a LB method. The layer thickness of an electron transport layer is not specifically limited; however, is generally 5 nm-5 μm, and preferably 5 nm-200 nm. This electron transport layer may have a single layer structure comprised of one or not less than two types of the above described materials.

An electron transport layer containing a doped impurity and having a high n-property can be used. Examples are shown in JP-A 04-297076, 10-270172, 2000-196140, 2001-102175, and J. Appl. Phys., 95, 5773 (2004).

In the present invention, it is preferable to use an electron transport layer having a high n-property for achieving an element to be driven with low electric power consumption.

[Anode]

As an anode according to an organic EL element of this invention, those comprising metal, alloy, a conductive compound, which is provided with a large work function (not less than 4 eV), and a mixture thereof as an electrode substance are preferably utilized.

Specific examples of such an electrode substance include a conductive transparent material such as metal like Au, CuI, indium tin oxide (ITO), $SnO_2$ and ZnO.

Further, a material such as IDIXO ($In_2O_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance.

In case that a material (such as organic electric conductive compounds capable of being coated is used, a printing method or a wet type film-forming method such as a coating method can be applied. When emission is taken out of this anode, the transmittance is preferably set to not less than 10% and the sheet resistance as an anode is preferably not more than a few hundreds Ω/□. Further, although the layer thickness depends on a material, it is generally selected in a range of 10 nm-1,000 nm and preferably selected in a range of 10 nm-200 nm.

[Cathode]

On the other hand, as a cathode according to this invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal.

Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. As for a cathode, these electrode substances may be made into a thin layer by a method such as evaporation or spattering.

Further, the sheet resistance as a cathode is preferably not more than a few hundreds Ω/□ and the layer thickness is generally selected in a range of 10-1,000 nm and preferably of 10-200 nm. Herein, to transmit emission, either one of an anode or a cathode of an organic EL element is preferably transparent or translucent to improve the mission luminance.

Further, a transparent or a translucent cathode can be made by applying a transparent conductive material on a cathode after providing the above-described metal on the cathode in a thickness of 1 nm to 20 nm which. The transparent conductive materials are described in the section for anode. By applying these materials, it can be made an element having both an anode and a cathode provided with a property of transparent.

[Support Substrate]

Examples of a support substrate (or called as base, substrate, base material or support) are glass and plastics. The kinds of which are not specifically limited. They may be transparent or opaque. When an emission of light is taken from the side of support substrate, the support substrate is preferably transparent. Examples of preferably used for a support substrate are glass, quartz, and transparent resin films. Specifically preferable support substrates are resin films which enable to give flexibility to an organic EL element.

The following can be cited as examples of a resin film. Polyesters (e.g., polyethylene terephthalate (PET), polyethylenenaphthalate (PEN)), polyethylene, polypropylene, cellophane, cellulose esters or those derivatives (e.g., cellulose di acetate, cellulose triacetate, cellulose acetate butyrate, cellulose acetate propionate (CAP), cellulose acetate phthalate (TAC), cellulose nitrate) polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyetherimide, polyether ketoneimide, polyamide, fluororesin, nylon, polymethylmethacrylate, acrylic resins, or polyarylates, cycloolefin resins (e.g., ARTON (trade name made by JSR), or APEL (trade name made by Mitsui Chemicals, Inc).

On the surface of the resin film, a film of inorganic or organic compounds or a hybrid film of both of them may be formed. The above film is preferably a barrier film exhibiting a water vapor permeability of at most 0.01 g/(m²·24 h) (at 25±0.5° C. and 90±2% RH), which is determined based on the method of JIS K 7129 1992. Further, the above film is preferably a high barrier film exhibiting an oxygen permeability of at most $1\times10^{-3}$ cm³/(m²·24 h·MPa) determined based on the method of JIS K 7126 1987 and the water vapor permeability exhibiting at most $1\times10^{-5}$ g/(m²·24 h).

Any materials may be employed to form the barrier film as long as they exhibit the function to retard penetration of substances such as moisture or oxygen, which will lead to degradation of the element, and the materials such as silicon oxide, silicon dioxide, or silicon nitride may be employed. Further, in order to reduce brittleness, it is preferable to form a laminated layer structure composed of a layer comprising the above inorganic material, and a layer comprising an organic material. The lamination order of the inorganic and organic layers is not particularly limited, but it is preferable that both layers are alternated several times.

Formation methods of the barrier film are not particularly limited, and it is possible to employ, for example, a vacuum deposition method, a sputtering method, a reactive sputtering method, a molecular beam epitaxial method, a cluster ion beam method, an ion plating method, a plasma polymerization method, an atmospheric pressure plasma polymerization method, a plasma CVD method, a laser CVD method, a thermal CVD method, and a coating method. Of these, particularly preferred is the atmospheric pressure plasma polymerization method, as described in JP-A No. 2004-68143.

Examples of opaque substrates include metal plates or films such as aluminum or stainless steel, opaque resin substrates, and substrates composed of ceramic materials.

The quantum efficiency of light extraction to the outside of the light emission of the organic EL element of the present invention at room temperature is preferably at least 1%, and more preferably at least 5%.

Herein, quantum efficiency of light extraction to the outside(%)=(the number of photons emitted to the exterior of the organic EL element)/(the number of electrons supplied to the organic EL element)×100.

A hue improving filter such as a color filter, or a color conversion filter, which converts emitted light color from an organic EL element to multi-color by employing a fluorescent compound, may be used in combination. In the case where the color conversion filter is used, the λmax of the light emitted from the organic EL element is preferably not more than 480 nm.

<<Sealing>>

Sealing means employed in the present invention include, for example, a method which allows a sealing member to adhere to an electrode and a substrate employing adhesives.

Any sealing member may be employed as long as they are arranged to cover the display region of the organic EL element, and may be either in the form of an intaglio plate or a flat plate. Further, properties of transparency or electric insulation are not particularly required.

Specific examples include a glass plate, a polymer plate/film, and a metal plate/film. Glass plates may include specifically soda-lime glass, barium and strontium containing glass, lead glass, aluminosilicic acid glass, borosilicic acid glass, barium borosilicic acid glass, and quartz. Polymer plates may include polycarbonate, acryl, polyethylene terephthalate, polyether sulfide, and polysulfone. Metal plates may be composed of at least one metal selected from the group consisting of stainless steel, iron, copper, aluminum, magnesium, nickel, zinc, chromium, titanium, molybdenum, silicon, germanium and tantalum, or an alloy composed of at least two metals selected from the above group.

In the present invention, polymer or metal films may be preferably employed since they can make the element thinner. Furthermore, it is preferable that the polymer film exhibits an oxygen permeability of at most $1\times10^{-3}$ cm³/(m²·24 h·MPa), which is determined by the method based on JIS K 7126 1987, and a water vapor permeability of at most $1\times10^{-3}$ g/(m²·24 h) (at 25±0.5° C. and 90±2% RH), which is determined by the method based on JIS K 7129 1992.

In order to process a sealing member to form a concave shape, sand blasting or chemical etching may be employed.

Specific examples of an adhesive include photocurable and thermocurable type adhesives having a reactive vinyl group of acrylic acid oligomers and methacrylic acid oligomers, and moisture curable type adhesives such as 2-cyanoacrylic acid ester. Thermal and chemical curing type (two blended liquids) adhesives such as an epoxy adhesive are also included. Hot-melt type polyamide, polyester, and polyolefin are also included. Further, cationically curable type ultraviolet ray curable type epoxy resin adhesives are included.

Since organic EL elements are occasionally degraded due to a thermal treatment, adhesives which are adhesion-curable at from room temperature to 80° C. are preferred. Further, desiccants may be dispersed into the above adhesives. Application of the adhesives onto the sealing portion may be achieved by employing a commercial dispenser or may be printed in the same manner as screen printing.

Further, inorganic and organic material layers are appropriately formed as a sealing film in such a way that from exterior of an electrode facing the substrate, of the two electrodes sandwiching the organic layer, the aforesaid electrode and organic layer are covered and the sealing film contacts the substrate. In this case, any appropriate materials may be applied to the aforesaid film which exhibit a function to retard penetration of substances such as moisture and oxygen, which substances will lead to degradation of the element, and materials such as silicon oxide, silicon dioxide, or silicon nitride may be employed. Further, in order to reduce brittleness, it is preferable to form a laminated layer structure composed of an inorganic layer and a layer composed of organic materials. Preparation methods of the above films are not particularly limited, and it is possible to employ, for example, a vacuum deposition method, a sputtering method, a reactive sputtering method, a molecular beam epitaxial method, a cluster ion beam method, an ion plating method, a plasma polymerization method, an atmospheric pressure plasma polymerization method, a plasma CVD method, a laser CVD method, a thermal CVD method, and a coating method.

Into the space between the sealing member and the display area of the organic EL element, in a case where the space is to be a gas or liquid phase, inert gases such as nitrogen and argon or inert liquids such as fluorinated hydrocarbon and silicone oil are preferably injected. The space may also be a vacuum space. Further, hygroscopic compounds may be enclosed within the interior.

Examples of the hygroscopic compounds include metal oxides (for example, sodium oxide, potassium oxide, calcium oxide, barium oxide, magnesium oxide, or aluminum oxide), sulfates (for example, sodium sulfate, calcium sulfate, magnesium sulfate, or cobalt sulfate), metal halides (for example, calcium chloride, magnesium chloride, cesium fluoride, tantalum fluoride, cerium bromide, magnesium bromide, barium iodide, or magnesium iodide), and perchlorates (for example, barium perchlorate or magnesium perchlorate). In sulfates, metal halides and perchlorates, anhydrous salts are suitably employed.

<<Protective Film and Protective Plate>>

To enhance mechanical strength of the element, a protective film or a protective plate may be provided on the exterior of the above sealing film which was provided on the side facing a substrate, while sandwiching the organic layer. Specifically, in a case where the sealing is conducted via the above sealing film, the resulting strength is not always sufficient. Consequently, it is preferable to provide the above protective film or protective plate. As usable materials for the above, glass plates, polymer plate/film, and metal plate/film which are the same as those employed for the above sealing may be employed. In view of allowing the element to be lighter and thinner, it is preferable to employ a film.

<<Light Extraction>>

It is commonly stated that the organic EL element emits light in a layer exhibiting a higher refractive index (being about 1.6-about 2.1) than that of air, whereby only about 15 to 20% of light emitted in the light emitting layer can be taken out. The reasons for the above are as follows: the light incoming to the interface (the interface between the transparent substrate and air) at angle θ which is greater than the critical angle is totally reflected, whereby no light is taken out to the exterior of the element; and the light is totally reflected between the transparent electrode or the light emitting layer and the transparent substrate so that the light is waveguided through the transparent electrode or the light emitting layer, and as a result the light escapes to the side direction of the element.

Means to increase the light extraction efficiency include, for example, a method in which irregularity is formed on the surface of the transparent substrate so that total reflection at the interface between the transparent substrate and air is minimized (U.S. Pat. No. 4,774,435); a method in which efficiency is enhanced by allowing the substrate to exhibit light focusing properties (JP-A No. 63-314795); a method in which a reflective surface is formed on the side of the element (JP-A No. 1-220394); a method in which a flat layer exhibiting an intermediate refractive index is introduced between the substrate and the light emitting body, whereby an reflection inhibiting film is formed (JP-A No. 62-172691); a method in which a flat layer exhibiting a refractive index lower than that of the substrate is introduced between the above substrate and the light emitting body (JP-A No. 2001-202827); and a method in which a diffraction grating is arranged between any layers of the substrate, the transparent electrode layer and the light emitting layer (including between the substrate and the exterior) (JP-A No. 11-283751).

In the present invention, the above methods may be employed in combination with the organic EL element of the present invention. However, there may be suitably employed the method to introduce a flat layer exhibiting a lower refractive index than that of the substrate between the above substrate and the light emitting body, or the method to arrange a diffraction grating between any layers of the substrate, the transparent electrode layer and the light emitting layer (including between the substrate and the exterior).

By combining these methods, the present invention enables preparation of the element which exhibits higher luminance and more excellent durability.

In a case where a medium exhibiting a low refractive index is formed at a thickness greater than the wavelength of light between the transparent electrode and the transparent substrate, the lower the refractive index of the medium, the higher the efficiency of extraction of the light, emitted from the transparent electrode, to the outside.

Examples of the medium of the low refractive index layer include aerogel, porous silica, magnesium fluoride, and fluorine based polymers. Since the refractive index of the transparent substrate is commonly 1.5 to 1.7, the refractive index of the above low refractive index layer is preferably at most 1.5, and more preferably at most 1.35.

Further, the thickness of the low refractive index medium is preferably at least twice the wavelength in the medium. The reason is that when the thickness of the low refractive index medium is about light wavelength so that electromagnetic wave leaked out via evernescent enters into the substrate, effects of the low refractive index layer are reduced.

A method to introduce a diffraction grating at the interface which results in total reflection or into any of the media is characterized in that increased effects of the light extraction efficiency is high. In the above method, of light generated from the light emitting layer, the light, which is not capable of escaping to the exterior due to total reflection at the boundary between two layers, is diffracted via an introduction of the diffraction grating between any layers or within the medium (in the transparent substrate or the transparent electrode) by utilizing properties of the diffraction grating in which it is possible to change the direction of light to a specified direction differing from diffraction via so-called Bragg diffraction, such as primary diffraction or secondary diffraction, to result in the light being extracted to the outside.

It is preferable that the introduced diffraction grating exhibits a two-dimensional periodical refractive index. Since the light emitting layer randomly emits light in all directions, in a general one-dimensional diffraction grating, which exhibits a cyclic refractive index distribution only in a certain direction, only the light directed to a specified direction is diffracted whereby the light extraction efficiency is not so increased. However, by employing the refractive index of a two-dimensional distribution, the light directing to all directions is diffracted to increase the light extraction efficiency.

The location of the diffraction grating may be, as described above, between any layers or in a medium (in a transparent substrate or a transparent electrode), but a position near the organic light emitting layer where light is emitted is preferred.

In such a case, the period of the diffraction grating is preferably about half to about 3 times the wavelength of the light in the medium.

With regard to the arrangement of the diffraction grating, a two-dimensionally repeating arrangement such as a square lattice shape, a triangle lattice shape, or a honeycomb shape is preferred.

<<Light Focusing Sheet>>

In the organic EL element of the present invention, it is possible to enhance luminance in a specified direction by focusing light to the specified direction such as the front direction with regard to the light emitting surface of the element, which can be achieved by processing the element to, for example, provide a microlens array structure or by combining the element with a so-called light focusing sheet on the light extracting side of the substrate.

An example of the above microlens array is that quadrangular pyramids are two-dimensionally arranged on the light extracting side of the substrate in such a manner that one side is 30 μm and the vertex angle is 90 degrees. The side is preferably 10 to 100 μm. In a case where the side is shorter than the above length, undesirable diffraction effects occur to result in unwanted coloration, while in a case where the side is excessively long, the thickness undesirably inreases.

As the light focusing sheet, it is possible to employ, for example, those which are currently used in LED backlights of liquid crystal display devices. As an example of such a sheet, the luminance enhancing film (BEF), produced by Sumitomo 3M Co., Ltd, may be employed. As the shape of a prism sheet, examples may include a sheet in which a stripe of triangles is formed on the substrate, which stripe exhibits a vertex angle of 90 degrees and a pitch of 50 μm, or may be a sheet exhibiting shapes such as a rounded vertex, randomly varying pitches, and the like.

Further, to control the radiation angle of light from the light emitting element, a light diffusion plate/film may be combined with the focusing sheet. For example, the light diffusion film (LIGHT-UP), produced by Kimoto Co., Ltd. may be employed.

<<Preparation Method of Organic EL Element>>

As an example of the preparation method of the organic EL element of the present invention, a preparation method of an organic EL element composed of an anode/a positive hole injecting layer/a positive hole transporting layer/a light emitting layer/an electron transporting layer/an electron injecting layer/a cathode is described below.

First, a thin film composed of desired electrode materials, such as anode materials, is formed on a suitable substrate via a vapor deposition or sputtering method to at most 1 μm, preferably 10 to 200 nm in a film thickness to prepare an anode.

Subsequently, on the above anode, thin films of organic compounds composed of a positive hole injecting layer, a positive hole transporting layer, a light emitting layer, an electron transporting layer, an electron injecting layer, and a positive hole inhibition layer, all of which are materials for the organic EL element, are formed.

Forming methods of each of the above layers include, as described above, a vapor-deposition method and wet processes (such as a spin coating method, an ink-jet method, and a printing method). In the present invention, film formation by coating methods such as the spin coating method, the ink-jet method, and the printing method are preferred from viewpoints that a homogeneous film is readily formed and a pin hole is hard to be formed.

As examples of liquid media for dissolving or dispersing the organic EL materials of the present invention, usable are ketones such as methyl ethyl ketone, and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; and organic solvents such as DMF and DMSO. The above organic EL materials may be dispersed via an ultrasonic technique, a high shearing force dispersion method, or a media dispersion method.

After formation of these layers, a thin film comprising a cathode material is formed thereon to 1 μm or less, preferably in a range of 50 to 200 nm in film thickness by means of such as a vapor-deposition or spattering to provide a cathode, whereby a desired organic EL element can be prepared.

Further, the above preparation order may be reversed, and preparation may be conducted in the order of the cathode, the electron injecting layer, the electron transporting layer, the light emitting layer, the positive hole transporting layer, the positive hole injecting layer, and the anode. In a case where direct current voltage is applied to the multicolor display device prepared as above, light emission can be observed when a voltage of 2 to 40 V is applied while the anode is set to a positive polarity and the cathode is set to a negative polarity. Further, alternating current voltage may be applied, of which any waveforms of the applied alternating current may be employed.

<<Uses>>

The organic EL element of the present invention may be utilized as a display device, a display, or various light sources. Examples of the use of the light source include lighting device (a home lamp or a room lamp in a car), a backlight for a watch or a liquid crystal, a light source for boarding advertisement, a signal device, a light source for a photo memory medium, a light source for an electrophotographic copier, a light source for an optical communication instrument and a light source for an optical sensor, but are not limited to them. Of these, the element is particularly effectively utilized for a backlight for a liquid crystal display or a light source for lighting use.

The organic EL element of the present invention, if desired, may be subjected to patterning during film making, via a metal mask or an ink-jet printing method. In a case of the patterning, only the electrode may be subjected to the patterning, or both the electrode and the light emitting layer may be subjected to the patterning, or all element layers may be subjected to the patterning. Commonly known conventional methods can be employed for the preparation of the element.

Color of light emitted from the organic EL element of the present invention or the chemical compounds according to the present invention is measured via a spectroradiometer CS-1000 (manufactured by Konica Minolta Sensing Inc.) and the measured values are plotted onto the CIE chromaticity diagram described in FIG. 4.16 on page 108 of "Shinpen Shikisai Kagaku Handbook" (Coloring Science Handbook, New Edition), (edited by Nihon Shikisai Gakkai, published by Todai Shuppan Kai, 1985), whereby the color is determined.

In a case where the organic EL element of the present invention is a white element, the term "white" means that the chromaticity is within a region of $X=0.33\pm0.07$, $Y=0.33\pm0.1$ according to CIE 1931 color coordinate system at 1,000 $Cd/m^2$ when a front luminance at a viewing angle of 2 degrees is measured via the above method.

EXAMPLES

The present invention is described below with reference to examples, but the embodiments of the invention are not limited to them. Structures of compounds employed in the examples are shown below.

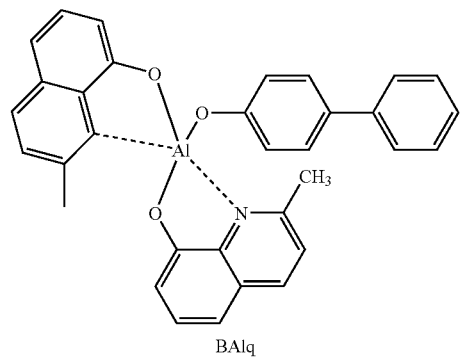

BAlq

-continued

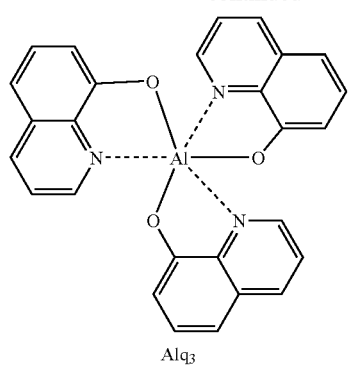
Alq3

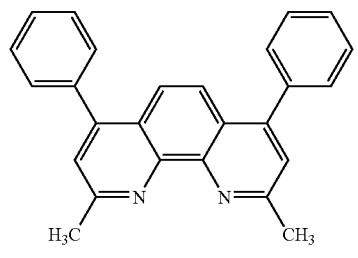
BCP

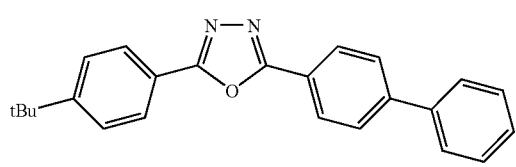
tBu-PBD

Compound A₀

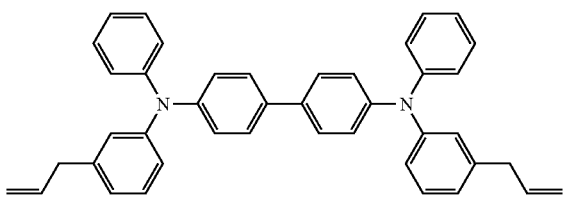

Comparative compound 1

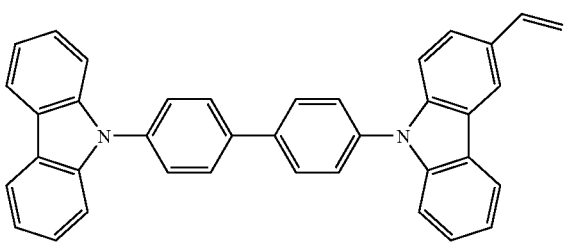

Comparative compound 2

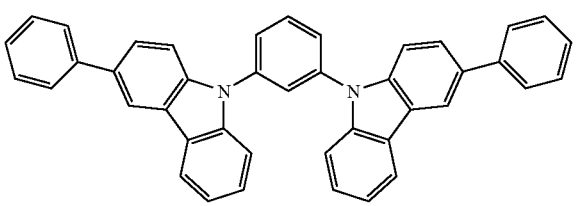

-continued

Compound B₀

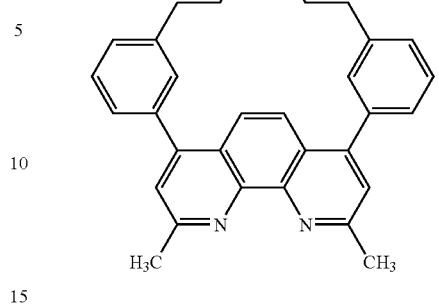

Example 1

Preparation of Organic EL Element 1-1

Comparative Example

A pattern was formed on a substrate composed of a glass plate of 100 mm×100 mm×1.1 mm and a 100 nm ITO (indium tin oxide) layer (NA45: manufactured by NH Technoglass Co., Ltd.) as an anode. Then the resulting transparent substrate having the above ITO transparent electrode was subjected to ultrasonic cleaning in iso-propylalcohol, dried with a dry nitrogen gas, and then subjected to UV-ozone cleaning for 5 minutes.

On the above transparent substrate, a solution of a poly(3,4-ethylenedioxythiophene)-polystyrenesulfonate (PEDOT/PSS, Baytron P Al 4083; produced by Bayer Co., Ltd) diluted with distilled water to a concentration of 70% was applied via a spin coat method at 3,000 rpm and for 30 seconds to form a film, and then the resulting film was dried for one hour at 200° C., to prepare the first positive hole transporting layer exhibiting 30 nm in thickness.

Thus prepared substrate was placed in nitrogen gas atmosphere, and on the first positive hole transporting layer, a solution of 50 mg of Compound A₀ dissolved into 10 ml of toluene was applied via a spin coat method under conditions of 1,000 rpm and for 30 seconds to form a film. The resulting film was subjected to light-polymerization/cross-linking by irradiation of the ultraviolet rays for 180 seconds, to form the second positive hole transporting layer exhibiting about 25 nm in thickness.

On the thus prepared second positive hole transporting layer was applied a solution of 100 mg of Comparative Compound 1 and 10 mg of Compound 2-2 dissolved into 10 ml of toluene via a spin coat method under conditions of 1,000 rpm and for 30 seconds to form a film. The resulting film was subjected to light-polymerization/cross-linking by irradiation of the ultraviolet rays for 15 seconds, and further heated at 150° C. for one hour in vacuum to form a light emitting layer exhibiting about 50 nm in thickness.

Subsequently, on the thus prepared light emitting layer, was applied a solution of 50 mg of tBu-PBD dissolved into 10 ml of toluene via a spin coat method under conditions of 1,000 rpm and for 30 seconds to form a film, and then the resulting film was vacuum dried at 60° C. for one hour, to form a electron transporting layer exhibiting about 25 nm in thickness.

The element thus prepared was set to a vacuum deposition apparatus, and then the vacuum chamber was decompressed to $4 \times 10^{-4}$ Pa. As a cathode buffer layer, lithium fluoride was deposited to 1.0 nm in thickness, and then, aluminum was deposited to 110 nm in thickness to form a cathode, to prepare Organic EL Element 1-1.

Preparation of Organic EL Elements 1-2 to 1-8

Each of Organic EL elements 1-2 to 1-8 was prepared in a similar manner to the preparation of Organic EL element 1-1 except that Comparative compound 1 and tBu-PBD were changed to the compounds described in Table 2.

<<evaluation of Organic EL Element>>

The quantum efficiency of light extraction to the outside and the light emission life of thus prepared Organic EL element 1-1 to 1-8 were evaluated in a manner described below.

<<Quantum Efficiency of Light Extraction to the Outside>>

The quantum efficiencies of light extraction to the outside (%) of the thus prepared organic El elements were determined at 23° C. under a dry nitrogen gas atmosphere by applying a constant current of 2.5 mA/cm². The determination was carried out by employing a spectroradiometer CS-1000 (manufactured by Konica Minolta Sensing Inc.).

The thus obtained results are listed in Table 1. Herein, the determined results of the quantum efficiency of light extraction to the outside are expressed as the relative values when the determined value of Organic EL element 1-1 is designated as 100.

<<Light Emission Life>>

A period in which luminance of an organic EL element, when driven at a constant current of 2.5 mA/cm², decreased to half of the luminance immediately after the initiation of emission (initial luminance) was determined, and the period was defined as the half-life period ($\tau^{1/2}$) and used as an index of the life of an organic EL element.

The determination was carried out by employing a spectroradiometer CS-1000 (manufactured by Konica Minolta Sensing Inc.). The obtained results are listed in Table 2. Herein, the determined results of the light emission life listed in Table 2 are expressed as the relative values when the determined values of Organic EL element 1-1 is designated as 100.

layer, since a constitutional component of a light emission layer flew out during coating of an electron transporting layer. As a result, the organic EL element was not prepared.

On the other hand, since in each of Organic EL elements 1-3 to 1-9 of the present invention, organic films exhibiting a cross-linking density achieving high dissolution resistance to coating solvent are formed, it is possible to laminate layers via a coating method. Further, as properties of the element, above Organic EL elements could provide an extended light emission life, as well as a high quantum efficiency of light extraction to the outside.

Example 2

Preparation of Organic EL Element 2-1

A pattern was formed on a substrate composed of a glass plate of 100 mm×100 mm×1.1 mm and a 100 nm ITO (indium tin oxide) layer (NA45: manufactured by NH Technoglass Co., Ltd.) as an anode. Then the resulting transparent substrate, having the above ITO transparent electrode, was subjected to ultrasonic cleaning in iso-propylalcohol, dried with a dry nitrogen gas, and then subjected to UV-ozone cleaning for 5 minutes.

On the above transparent substrate, a solution of a poly(3, 4-ethylenedioxythiophene)-polystyrenesulfonate (PEDOT/PSS, Baytron P Al 4083; produced by Bayer Co., Ltd) diluted with distilled water to a concentration of 70% was applied via a spin coat method at 3,000 rpm and for 30 seconds to form a film, and then the resulting film was dried for one hour at 200° C., to prepare the first positive hole transporting layer exhibiting 30 nm in thickness.

Thus prepared substrate was placed in nitrogen gas atmosphere, and on the first positive hole transporting layer, a solution of 50 mg of Compound $A_0$ dissolved into 10 ml of toluene was applied via a spin coat method under conditions of 1,000 rpm and for 30 seconds to form a film. The resulting film was subjected to light-polymerization/cross-linking by irradiation of the ultraviolet rays for 180 seconds, to form the second positive hole transporting layer exhibiting about 25 nm in thickness.

TABLE 2

| Organic EL element | Compound | | Quantum efficiency of light extraction to the outside | Life | Note |
| --- | --- | --- | --- | --- | --- |
| | Light emission layer | Electron transporting layer | | | |
| 1-1 | Comparative compound 1 | tBu-PBD | 100 | 100 | Comparative example |
| 1-2 | Comparative compound 2 | tBu-PBD | The electron transporting layer was not formed | | Comparative example |
| 1-3 | 1-9 | tBu-PBD | 440 | 700 | Example |
| 1-4 | 1-14 | tBu-PBD | 460 | 600 | Example |
| 1-5 | 1-18 | BAlq | 400 | 520 | Example |
| 1-6 | 1-5 | BCP | 340 | 470 | Example |
| 1-7 | 1-20 + 1-39 | Not used | 380 | 580 | Example |
| 1-8 | 1-13 | 1-39 | 410 | 590 | Example |

Table 2 shows that each of Organic EL elements 1-3 to 1-8 of the present invention exhibits significantly excellent properties in both of the quantum efficiency of light extraction to the outside and the light emission life, compared with those of Organic EL element 1-1 of Comparative example.

Organic EL element 1-2 of Comparative example, which was prepared by employing Comparative compound 2 having no reactive group, was unable to form an electron transporting On the thus prepared second positive hole transporting layer, a solution of 50 mg of polyvinylcarbazole and 5 mg of Ir-1 dissolved into 10 ml of dichloroethane was applied via a spin coat method under conditions of 1,000 rpm and for 30 seconds to form a light emitting layer.

Subsequently, the thus prepared substrate was set to a vacuum deposition apparatus, the vacuum chamber was decompressed to $4\times10^{-4}$ Pa, and then, lithium fluoride was deposited to 1.0 nm in thickness as a cathode Buffer layer, while aluminum was deposited to 110 nm in thickness to form a cathode, to prepare Organic EL element 2-1.

Preparation of Organic EL Element 2-2

Organic EL element 2-2 was prepared in the same manner as the preparation of Organic EL element 2-1 except that polyvinylcarbazole was changed to Compound 1-45 (a polymer of n=22,000 was employed).
<<Evaluation of Organic EL Element>>
Thus prepared Organic EL Elements 2-1 and 2-2 were evaluated in a manner described below, and the results were listed in the table below.
<<Quantum Efficiency of Light Extraction to the Outside>>
The quantum efficiencies of light extraction to the outside (%) of the thus prepared organic El elements were determined at 23° C. under a dry nitrogen gas atmosphere by applying a constant current of 2.5 mA/cm$^2$. The determination was carried out by employing a spectroradiometer CS-1000 (manufactured by Konica Minolta Sensing Inc.).
The determined results of the quantum efficiency of light extraction to the outside are expressed as the relative values when the determined value of Organic EL Element 2-1 is designated as 100.
<<Light Emission Life>>
A period in which luminance of an organic EL element, when driven at a constant current of 2.5 mA/cm$^2$, decreased to half of the luminance immediately after the initiation of emission (initial luminance) was determined, and the period was defined as the half-life period ($\tau^{1/2}$) and used as an index of the life of an organic EL element. The determination was carried out by employing a spectroradiometer CS-1000 (manufactured by Konica Minolta Sensing Inc.). The determined results of the light emission life are expressed as the relative values when the determined values of Organic EL Element 2-1 is designated as 100.
The results thus obtained were listed below.

| Organic EL element No. | Quantum efficiency of light extraction to the outside | Light emission life | Note |
|---|---|---|---|
| 2-1 | 100 | 100 | Comparative example |
| 2-2 | 132 | 1,350 | Present invention |

The above table shows that Organic EL element 2-2 of the present invention containing Compound 1-45 (having repeating units of a carbazole ring and a dibenzofuran ring as the partial structure), which is an embodiment of a polymer of Compound A of the present invention, is significantly improved in both the quantum efficiency of light extraction to the outside and the light emission life compared to those of Comparative organic EL element 2-1.

Example 3

Preparation of Organic EL Full Color Display Device

FIG. 1 shows a schematic configuration diagram of an organic EL full color display device. A pattern was formed at 100 μm intervals on a substrate on which ITO transparent electrode (102) was formed to 100 nm on glass plate 101 (NA45: manufactured by NH Technoglass Co., Ltd.) as an anode. On the glass substrate, between ITO transparent electrodes, dividing walls 103 (20 μm in width and 2.0 μm in thickness) comprising nonphotosensitive polyimide were formed via photolithography. The positive hole injection layer composition described below was discharged and injected in between polyimide dividing walls on the ITO electrodes by employing an inkjet head (MJ800C; manufactured by Seiko Epson Corp.), irradiated by the ultraviolet rays for 30 seconds, and then subjected to a drying treatment at 60° C. for 10 minutes, to prepare positive hole injecting layer 104 exhibiting 40 nm in thickness.
Each of the following blue light emitting layer composition, green light emitting layer composition, and red light emitting layer composition was similarly discharged and injected on the above positive hole injecting layer by employing an inkjet head, irradiated by the ultraviolet rays for 30 seconds, and then subjected to a drying treatment at 60° C. for 10 minutes, to form each of light emitting layers (105B, 105G, and 105R). Finally, Al (106) was vacuum deposited as a cathode so as to cover light emitting layer 105, to prepare the organic EL element.
It was found that the prepared organic EL element emits each of blue, green, and red lights by application of voltage onto each of the electrodes whereby the organic EL element can be utilized as a full color display device.

| (Positive Hole Injecting Layer Composition) | |
|---|---|
| Compound A$_0$ | 20 parts by mass |
| Cyclohexylbenzene | 50 parts by mass |
| Isopropylbiphenyl | 50 parts by mass |
| (Blue Light emitting layer Composition) | |
| Compound 1-9 | 0.7 parts by mass |
| Ir-15 | 0.04 parts by mass |
| Cyclohexylbenzene | 50 parts by mass |
| Isopropylbiphenyl | 50 parts by mass |

| (Green Light emitting layer Composition) | |
|---|---|
| Compound 1-9 | 0.7 parts by mass |
| Ir-1 | 0.04 parts by mass |
| Cyclohexylbenzene | 50 parts by mass |
| Isopropylbiphenyl | 50 parts by mass |
| (Red Light emitting layer Composition) | |
| Compound 1-9 | 0.7 parts by mass |
| Ir-14 | 0.04 parts by mass |
| Cyclohexylbenzene | 50 parts by mass |
| Isopropylbiphenyl | 50 parts by mass |

Further, it was found that organic EL elements, prepared employing Compounds 2-1 to 2-16 in place of Ir-15, Ir-1 or Ir-14, and Compounds 1-1 to 1-8 or Compounds 1-10 to 1-42 in place of Compound 1-9, can also be similarly utilized as a full color display device.

Example 4

Preparation of White Organic EL Element 4-1

A pattern was formed on a substrate composed of a glass plate of 100 mm×100 mm×1.1 mm and a 100 nm ITO (indium tin oxide) layer (NA45: manufactured by NH Technoglass Co., Ltd.) as an anode. Then the resulting transparent substrate, having the above ITO transparent electrode, was subjected to ultrasonic cleaning in iso-propylalcohol, dried with a dry nitrogen gas, and then subjected to UV-ozone cleaning for 5 minutes.

On the above transparent substrate, a solution of a poly(3,4-ethylenedioxythiophene)-polystyrenesulfonate (PEDOT/PSS, Baytron P Al 4083; produced by Bayer Co., Ltd) diluted with distilled water to a concentration of 70% was applied via a spin coat method at 3,000 rpm and for 30 seconds to form a film, and then the resulting film was dried for one hour at 200° C., to prepare the first positive hole transporting layer exhibiting 30 nm in thickness.

Thus prepared substrate was placed in nitrogen gas atmosphere, and on the first positive hole transporting layer, a solution of 50 mg of Compound $A_0$ dissolved into 10 ml of toluene was applied via a spin coat method under conditions of 1,000 rpm and for 30 seconds to form a film. The resulting film was subjected to light-polymerization/cross-linking by irradiation of the ultraviolet rays for 180 seconds, followed by vacuum drying at 60° C. for one hour to form the second positive hole transporting layer.

Next, by employing a solution of 60 mg of Compound 1-10, 3.0 mg of Compound 2-6, and 3.0 mg of Compound 2-7 dissolved into 6 ml of toluene, a film was formed via a spin coat method under conditions of 1,000 rpm and for 30 seconds. The resulting film was subjected to light-polymerization/cross-linking by irradiation of the ultraviolet rays for 15 seconds, and further heated at 150° C. for one hour in vacuum to form a light emitting layer.

Further, by employing a solution of 20 mg of Compound $B_0$ dissolved into 6 ml of toluene, a film was formed via a spin coat method under conditions of 1,000 rpm and for 30 seconds. The resulting film was subjected to light-polymerization/cross-linking by irradiation of the ultraviolet rays for 15 seconds, and further heated at 80° C. for one hour in vacuum to form a positive hole inhibition layer.

Subsequently, thus prepared substrate was fixed to a substrate holder of a vacuum deposition apparatus. Then 200 mg of $Alq_3$ was placed in a resistive heating molybdenum boat, and was fixed to the vacuum deposition apparatus. After the pressure in the vacuum tank was reduced to $4 \times 10^{-4}$ Pa, the above heating boat carrying $Alq_3$ was heated by applying an electric current to evaporate $Alq_3$ onto the above electron transporting layer at a deposition rate of 0.1 nm/sec. to further form an electron transporting layer of 40 nm in thickness.

Temperature of the substrate during deposition was room temperature.

Subsequently, a cathode was prepared by evaporating lithium fluoride and aluminum onto the above sample to 0.5 nm and 110 nm in thickness respectively, to prepare organic EL element 4-1.

The above element emitted a nearly white light by applying an electric current to prove that the aforesaid element is usable as a lighting device. It was found that elements, whose compounds were replaced by other exemplified compounds, similarly emitted a white light.

Example 5

Preparation of Organic EL Element 5-1

Present Invention

A pattern was formed on a substrate composed of a glass plate of 100 mm×100 mm×1.1 mm and a 100 nm ITO (indium tin oxide) layer (NA45: manufactured by NH Technoglass Co., Ltd.) as an anode. Then the resulting transparent substrate, having the above ITO transparent electrode, was subjected to ultrasonic cleaning in iso-propylalcohol, dried with a dry nitrogen gas, and then subjected to UV-ozone cleaning for 5 minutes. On the above transparent substrate, a solution of a poly(3,4-ethylenedioxythiophene)-polystyrenesulfonate (PEDOT/PSS, Baytron P Al 4083; produced by Bayer Co., Ltd) diluted with distilled water to a concentration of 70% by mass was applied via a spin coat method at 3,000 rpm and for 30 seconds to form a film, and then the resulting film was dried for one hour at 200° C., to provide a positive hole injecting/transporting layer exhibiting 30 nm in thickness.

On the above positive hole injecting/transporting layer, a solution of 30 mg of Compound 1-54 dissolved into 3 ml of toluene was applied to form a film via a spin coat method under conditions of 1,000 rpm and for 30 seconds, and the resulting film was vacuum dried at 60° C. for one hour to form a light emitting layer of 80 nm in thickness.

The element thus prepared was set to a vacuum deposition apparatus, the vacuum chamber was decompressed to $4 \times 10^{-4}$ Pa, and then, calcium was deposited to 10 nm in thickness as a cathode buffer layer, while aluminum was deposited to 110 nm in thickness to form a cathode, to prepare Organic EL element 5-1.

Preparation of Organic EL Element 5-2

Comparative Example

Organic EL element 5-2 was prepared in the same manner as the preparation of Organic EL element 5-1 except that Compound 1-54 in a 3 ml solution was replaced by Solution [A] described below.

(Preparation of Solution [A])

30 mg of polyvinylcarbazole (also referred to as PVCz), which was commonly known as a light emitting layer forming material, and 1.5 mg of Ir-13 (a blue emitting ortho-metalated complex) were dissolved into 3 ml of toluene, to prepare the Solution [A].

Evaluation of Organic EL Element 5-1 to 5-2

Figure 2:
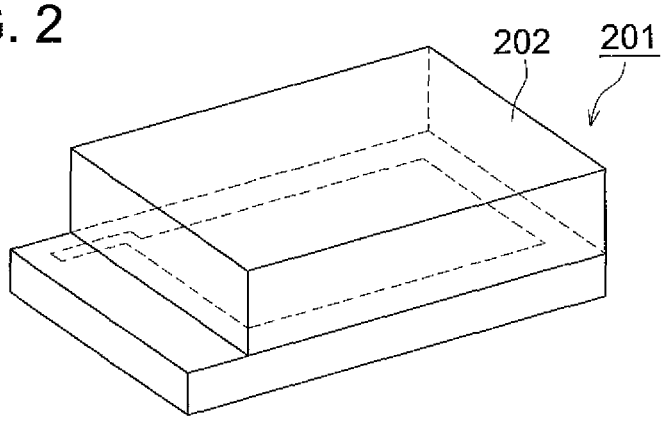
FIG. 2 is a schematic drawing of a lighting device.
Figure 3:
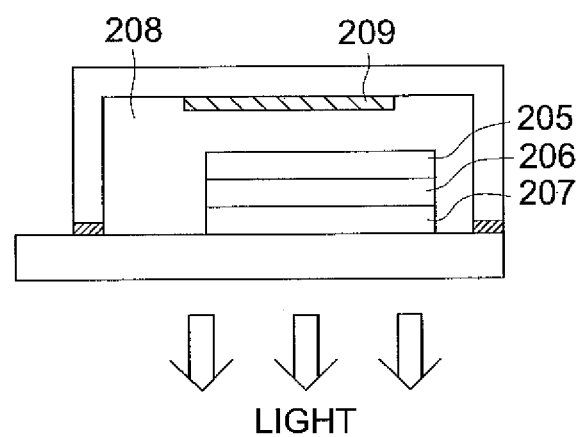
FIG. 3 is a schematic cross-sectional view of a lighting device.

For evaluation of prepared Organic EL elements 5-1 and 5-2, the lighting device as shown in FIG. 2 and FIG. 3 were formed in such a manner that; the non-light emitting side of each organic EL element prepared above was covered with a glass case, and a glass substrate of 300 μm in thickness used as a sealing substrate was put over the above-described cathode, and then close contacted with the above-mentioned transparent substrate by applying an epoxy type light curable adhesive (LUX TRACK LC0629B; produced by TOAGOSEI CO., LTD.) as a sealant to the surroundings of the glass substrate, followed by irradiation of the ultraviolet rays onto the light curable adhesive from the glass substrate side to cure the adhesive resulting in a sealing of the organic EL element. Then the resulting lighting devices were evaluated.

FIG. 2 shows a schematic view of the lighting device, and Organic EL element 201 is covered with glass cover 202. The sealing works employing the glass cover were carried out in a glove box which was under nitrogen gas atmosphere (under at least 99.999% high purity nitrogen gas atmosphere) to prevent Organic EL element 201 from being contacted with atmospheric gas.

FIG. 3 shows a schematic sectional view of one embodiment of the lighting device of the present invention. In FIG. 3, numerical designations 205, 206, and 207 indicate a cathode, an organic EL layer, and a glass substrate equipped with a transparent electrode, respectively. Inside of glass cover 202, nitrogen gas 208 is fully charged and moisture absorbing material 209 is provided.

Subsequently, the quantum efficiency of light extraction to the outside and the light emission life were determined in manners described below.

<<Quantum Efficiency of Light Extraction to the Outside>>

The quantum efficiencies of light extraction to the outside (%) of the thus prepared organic El elements were determined at 23° C. under a dry nitrogen gas atmosphere by applying a constant current of 2.5 mA/cm². The determination was carried out by employing a spectroradiometer CS-1000 (manufactured by Konica Minolta Sensing Inc.).

<<Light Emission Life>>

A period in which luminance of an organic EL element, when driven at a constant current of 2.5 mA/cm² at 23° C. under a dry nitrogen gas atmosphere, decreased to half of the luminance immediately after the initiation of emission (initial luminance) was determined, and the period was defined as the half-life period ($\tau^{1/2}$) and used as an index of the life of an organic EL element. The determination was similarly carried out by employing a spectroradiometer CS-1000 (manufactured by Konica Minolta Sensing Inc.).

The determined results of the quantum efficiency of light extraction to the outside and the light emission life of Organic EL elements 5-1 and 5-2 were expressed as the relative values when the determined values of Organic EL element 5-2 was designated as 100.

The results thus obtained were listed below.

| Organic EL element No. | Light emitting layer forming material | Quantum efficiency of light extraction to the outside (%) (Relative value) | Light emission life | Emitted light color | Note |
|---|---|---|---|---|---|
| 5-1 | 1-54 | 139 | 149 | Blue | Present invention |
| 5-2 | PVCz + Ir-13 | 100 | 100 | Blue | Comparative example |

The above evaluation results clearly show that, compared to the comparative example, Organic EL element 5-1 of the present invention significantly improves the quantum efficiency of light extraction to the outside, suppresses the electric power consumption, as well as improves the light emission life.

The invention claimed is:

1. An organic electroluminescent element comprising:
   a substrate having thereon an anode, a cathode, and at least one layer between the anode and the cathode, wherein
   the at least one layer comprises at least one emission layer, and
   the at least one layer comprises a compound A and a polymer prepared by polymerizing the compound A via a reactive group, provided that the compound A contains a partial structure represented by Formula (b) and the reactive group in the molecule:

Formula (b)

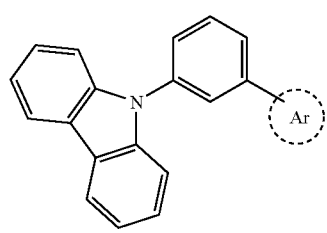

wherein, Ar1 represents a carboline ring or a dibenzofuran ring, and the reactive group is represented by any one of Formulas (3) to (5):

Formula (3)

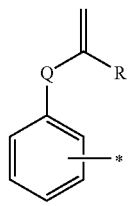

Formula (4)

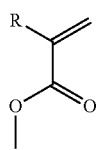

-continued

Formula (5)

wherein R represents a hydrogen atom or a methyl group; and Q represents a divalent linking group represented by any one of Formulas (c), (d), and (e) or any one of the plural combinations of Formulas (c), (d), and (e):

Formula (c)

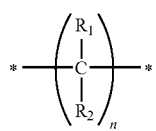

Formula (d)

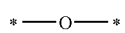

Formula (e)

wherein $R_1$ and $R_2$ each represent a hydrogen atom or a methyl group; and Cy represents a three membered or a four membered cyclic either group, provided that "n" is an interger of 0 to 2.

2. An organic electroluminescent element of claim 1, wherein the compound A or the polymer prepared from the compound A is contained in the at least one emission layer.

3. An organic electroluminescent element of claim 1, wherein the at least one emission layer contains the polymer and a phosphorescence-emitting dopant.

4. An organic electroluminescent element of claim 3, wherein the polymer is a copolymer of the compound A and the phosphorescence-emitting dopant.

5. An organic electroluminescent element of claim 3, wherein the phosphorescence-emitting dopant is an Ir complex.

6. An organic electroluminescent element of claim 3, wherein the phosphorescence-emitting dopant exhibits a 0-0 transition band of 485 nm or less in a phosphorescence spectrum.

7. An organic electroluminescent element of claim 6, wherein the phosphorescence-emitting dopant is a metal complex represented by Formula (1):

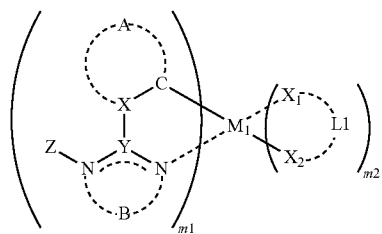

Formula (1)

wherein Z is a hydrocarbon ring or a heterocylic ring provided with a substituent having a steric parameter (Es value) of −0.5 or less at least at one of the third positions from the nitrogen atom to which Z is bonded; A is a group of atoms necessary to form a five or six membered hydrocarbon or heterocyclic ring together with X—C; B is —C($R_{01}$)=C($R_{02}$)—, —N=C($R_{02}$)—, —C($R_{01}$)=N— or —N=N—, provided that $R_{01}$ and $R_{02}$ each are a hydrogen atom or a substituent; $X_1$-L1-$X_2$ is a bidentate ligand, provided that $X_1$ and $X_2$ each are independently a carbon atom, a nitrogen atom or an oxygen atom and L1 is a group of atoms necessary to form the bidentate ligand together with $X_1$ and $X_2$; m1 is an integer of 1, 2 or 3; m2 is an integer of 0, 1 or 2, provided that m1+m2 is 2 or 3; and a central metal M1 is a metal of groups 8 to 10 in the periodic table.

8. An organic electroluminescent element of claim 1, wherein the compound A or the polymer prepared from the compound A exhibits a 0-0 transition band of 460 nm or less in a phosphorescence spectrum.

9. An organic electroluminescent element of claim 1, wherein the layer containing the compound A or the polymer prepared from the compound A is prepared by using a wet coating method.

10. An organic electroluminescent element of claim 1, wherein the compound A is polymerized after being coated.

11. An organic electroluminescent element of claim 1, wherein the at least one layer comprises a plurality of organic layers.

12. An organic electroluminescent element of claim 1, wherein
the at least one layer comprises at least one anode buffer layer, or at least one cathode buffer layer,
the at least one emission layer comprises a plurality of emission layers and one of the emission layers contains the compound A or the polymer of the compound A, and
the one of the emission layers is prepared by using a wet coating method.

13. An organic electroluminescent element of claim 1, emitting a white light.

14. A display device comprising an organic electroluminescent element of claim 1.

15. A lighting device comprising an organic electroluminescent element of claim 1.

* * * * *